(12) United States Patent
Poikonen et al.

(10) Patent No.: US 11,411,027 B2
(45) Date of Patent: Aug. 9, 2022

(54) SYSTEMS AND METHODS FOR MODULATED IMAGE CAPTURE

(71) Applicant: Kovilta Oy, Turku (FI)

(72) Inventors: Jonne Poikonen, Paimio (FI); Ari Paasio, Littoinen (FI); Mika Laiho, Vantaa (FI)

(73) Assignee: Kovilta Oy, Turku (FI)

( * ) Notice: Subject to any disclaimer, the term of this patent is extended or adjusted under 35 U.S.C. 154(b) by 179 days.

(21) Appl. No.: 16/491,593

(22) PCT Filed: Mar. 16, 2018

(86) PCT No.: PCT/FI2018/050195
§ 371 (c)(1),
(2) Date: Sep. 6, 2019

(87) PCT Pub. No.: WO2018/172610
PCT Pub. Date: Sep. 27, 2018

(65) Prior Publication Data
US 2021/0134854 A1 May 6, 2021

(30) Foreign Application Priority Data
Mar. 19, 2017 (FI) .................................... 20170044

(51) Int. Cl.
*H01L 27/146* (2006.01)
*G01S 7/4861* (2020.01)

(52) U.S. Cl.
CPC .... *H01L 27/1461* (2013.01); *H01L 27/14643* (2013.01); *G01S 7/4861* (2013.01)

(58) Field of Classification Search
CPC ........... H01L 27/1461; H01L 27/14643; G01S 7/4861
See application file for complete search history.

(56) References Cited

U.S. PATENT DOCUMENTS

| | | |
|---|---|---|
| 4,377,817 A | 3/1983 | Nishizawa et al. |
| 4,562,474 A | 12/1985 | Nishizawa |

(Continued)

FOREIGN PATENT DOCUMENTS

| | | |
|---|---|---|
| EP | 2960952 B1 | 1/2019 |
| JP | 2004512723 A | 4/2004 |

OTHER PUBLICATIONS

Finnish Patent and Registration Office, Search Report of Finnish patent application No. 20170044, dated Oct. 25, 2017, 2 pages.

(Continued)

*Primary Examiner* — Thanh Luu
(74) *Attorney, Agent, or Firm* — MacMillan, Sobanski & Todd, LLC

(57) ABSTRACT

Disclosed is a pixel element comprising a semiconductor substrate, a primary charge-collection node, a peripheral node, a modulating node, a circuitry and a backside conductive layer. The semiconductor substrate is configured to convert a flux of photons to first and second conductivity-type mobile charges. The peripheral node at least partially surrounds the primary charge-collection node, which at least partially surrounds the modulating node. The circuitry is used to connect and disconnect a reset voltage to/from the primary charge-collection node, provide a peripheral node voltage to the peripheral node, and measure an amount of the first conductivity-type mobile charges collected by the primary charge-collection node. The modulating node is electrically connected to a modulating voltage source, which is independent of the peripheral node voltage. The backside conductive layer is configured to collect and conduct the second conductivity-type mobile charges, and configured to be electrically connected to a bias voltage.

16 Claims, 46 Drawing Sheets

(56) References Cited

U.S. PATENT DOCUMENTS

| | | | |
|---|---|---|---|
| 4,651,015 A | * | 3/1987 | Nishizawa ........ H01L 27/14679 |
| | | | 250/208.1 |
| 4,677,453 A | | 6/1987 | Matsumoto et al. |
| 4,837,607 A | | 6/1989 | Kemmer et al. |
| 4,878,120 A | | 10/1989 | Matsumoto et al. |
| 6,326,230 B1 | | 12/2001 | Pain et al. |
| 6,380,572 B1 | | 4/2002 | Pain et al. |
| 6,580,496 B2 | | 6/2003 | Bamji et al. |
| 7,012,738 B1 | | 3/2006 | Schwarte |
| 7,361,877 B2 | | 4/2008 | McGrath et al. |
| 7,564,022 B1 | | 7/2009 | Dierickx |
| 9,716,121 B1 | | 7/2017 | Fotopoulou et al. |
| 10,056,416 B2 | | 8/2018 | Fotopoulou et al. |
| 11,221,401 B2 | | 1/2022 | Van Der Tempel et al. |
| 2002/0036300 A1 | | 3/2002 | Pain et al. |
| 2002/0121655 A1 | | 9/2002 | Zheng et al. |
| 2005/0139833 A1 | | 6/2005 | Janesick et al. |
| 2008/0106746 A1 | | 5/2008 | Shpunt et al. |
| 2009/0224351 A1 | | 9/2009 | Hsieh |
| 2010/0187442 A1 | | 7/2010 | Hochberg et al. |
| 2011/0158508 A1 | | 6/2011 | Shpunt et al. |
| 2012/0038904 A1 | | 2/2012 | Fossum et al. |
| 2016/0073093 A1 | | 3/2016 | Kautzsch |
| 2016/0148962 A1 | | 5/2016 | Dupont |

OTHER PUBLICATIONS

Stoppa, David et al., A Range Image Sensor Based on 10μm Lock-In Pixels in 0.18μm CMOS Imaging Technology, IEEE Journal of Solid-State Circuits, Jan. 2011, pp. 248-253, vol. 46, No. 1.

Büttgen, Bernhard et al., Robust Optical Time-of-Flight Range Imaging Based on Smart Pixel Structures, IFFF Transactions on Circuits and Systems-1, Jul. 2008, pp. 1512-1525, vol. 55, No. 6.

Spickermann, Andreas et al., Pulsed Time-of-Flight 3D-CMOS Imaging Using Photogate-Based Active Pixel Sensors, Proceedings of ESSCIRC 2009, Sep. 2009, 4 pages.

Bamji, Cyrus, et al., A 0.13 μm CMOS System-on-Chip for a 512 x 424 Time-of-Flight Image Sensor With MultiFrequency Photo-Demodulation up to 130 MHz and 2 GS/s ADC, IEEE Journal of Solid-State Circuits, Jan. 2015, pp. 303-319, vol. 50, No. 1.

Illade-Quinteiro, Julio et al., Distance Measurement Error in Time-of-Flight Sensors Due to Shot Noise, Sensors Feb. 25, 2015, pp. 4624-4642, vol. 15.

Aurola, A. et al., A radiation detector design mitigating problems related to sawed edges, International Conference on Position Sensitive Detectors, Sep. 2014, 11 pages.

Juntunen, Mikko A. et al., Near-unity quantum efficiency of broadband black silicon photodiodes with an induced junction, Nature Photonics, Nov. 2016, pp. 777-782, vol. 10.

Japanese Office Action, Application No. 2019571796, dated Jan. 4, 2022.

* cited by examiner

SYSTEMS AND METHODS FOR MODULATED IMAGE CAPTURE

TECHNICAL FIELD

The present disclosure relates generally to pixel elements and image sensors; and more specifically, to systems for capturing images. Moreover, the present disclosure also relates to methods for measuring an amount of first conductivity-type mobile charges associated with a flux of photons received by a pixel element.

BACKGROUND

An ability to quickly steer charge generated in an image sensor to multiple collection nodes is a key operation in, for example, Time-of-Flight (ToF) imaging. The switching between collection nodes can be done with conventional CMOS transistors, or by steering the charge within the sensor itself. For example, it is possible to use a pinned photodiode, and use CMOS switch transistors to select the capacitor where charge at a given time is stored. In a bridge circuit, the current from the photodiode is sampled to a capacitor so that the polarity of the capacitor alternates between each cycle. In modulated ToF circuits, charge is aggregated to the capacitor via multiple measurement cycles, where the duration of each cycle is very short. In a bridge circuit, the parasitic capacitances limit the accumulated voltage as well as modulation speed due to the short cycle time.

In order to avoid limitations caused by parasitic capacitance, there are approaches that avoid CMOS switches, and the charge is steered to different collection nodes within the sensor itself. An example of such a sensor is described in a published paper, titled *A Range Image Sensor Based on 10 um Lock-In Pixels in 0.18 um CMOS Imaging Technology*, by David Stoppa et al., IEEE JSSC, 2011. The sensor is a pinned photodiode with two floating diffusions. The charge is steered to either of the floating diffusions with gates G1 and G2. The structure is called a pinned demodulator. In order to make the sensor react faster, the gates G1 and G2 extend further above the pinned photodiode. This helps in rapidly transferring the photogenerated charge from the pinned photodiode to the floating diffusion. Such buried channel demodulator requires a transparent gate material.

It is also possible to steer the charges to different sensor nodes using a charge coupled device (CCD) as highlighted in a published paper, titled *Robust Optical Time-of-Flight Range Imaging Based on Smart Pixel Structures*, by Bernhard Buttgen et al., IEEE TCAS-I, 2008.

A photogate-based circuit described in a published paper, titled *Pulsed Time-of-Flight 3D-CMOS Imaging Using Photogate-Based Active Pixel Sensors*, by Andreas Spickermann et al., ESSCIRC 2009, uses a photogate sensor. The charge from the photogate can be transferred to four floating diffusions using four transfer gates. A pulse emitted by a laser is reflected back to the sensor, and the reflected pulse is measured with four measurements, each steered to a different floating diffusion.

A granted U.S. Pat. No. 6,580,496 B2, titled Systems for CMOS-Compatible Three-Dimensional Image Sensing Using Quantum Efficiency Modulation, 2003, describes a quantum efficiency modulation principle in a photodetector. The quantum efficiency modulation works so that the cathodes of two photodiodes adjacent to each other are pulsed high and low alternately using voltage sources. Between the voltage sources and the cathodes, there is a capacitor so that the collected charge remains in the cathode. When charge is collected to the right-side cathode, the left-side cathode (n+) voltage is set lower, and the right-side cathode voltage is set higher. Thus, the right-side depletion region has a larger volume, and, consequently, higher quantum efficiency. There is also a gate between the two cathodes that can be used to reduce leakage between the cathodes. The approach of U.S. Pat. No. 6,580,496 B2 has some disadvantages.

First, since the pulsed voltage sources connect to the cathodes via a capacitor, the capacitance of the capacitor needs to be large in comparison to the cathode capacitance. Also, because the cathode capacitance is relatively large, the modulation effect is not very strong since the change in the depletion region volume due to modulation is modest. The strength of the modulation effect can be defined by modulation contrast, which is the ratio between the maximum and minimum quantum efficiency resulting from the modulation.

Modulating the quantum efficiency by changing the depletion region volume via the capacitive connection to the collection node is not very efficient. In order to improve the modulation contrast, a published paper, titled *A 0.13 m CMOS System-on-Chip for a 512×424 Time-of-Flight Image Sensor With Multi-Frequency Photo-Demodulation up to 130 MHz and 2 GS/s ADC*, by Cyrus S. Bamji et al., IEEE JSSC 2015, describes use of polysilicon gates (PG) above two n-diffusions that are separated by a p-type potential barrier. This way, either an n-doped region under PG A or an n-doped region under PG B attracts charges. This leads to a good modulation contrast. A p-doped barrier between the n-doped regions prevents charge from flowing between A and B diffusions.

Implementations described in Bamji 15 can be used for modulated time-of-flight applications. The idea in Modulated Time-Of-Flight (MTOF) applications or Pulsed Time-Of-Flight (PTOF) applications is explained for example in a journal, Sensors 2015, Vol. 15, 4624-4642; doi:10.3390/s150304624. In both MTOF and PTOF, there is a need to collect photogenerated charge into different storage nodes depending on the time the charge was generated, and rapidly switch between storage nodes.

FIG. 23A represents prior art, and shows a side view of a semiconductor substrate 192 that is of a first conductivity-type semiconductor material. Also shown is a backside conductive layer 198 that is a second conductivity-type semiconductor material. Note that first and second conductivity-type semiconductor materials can be either acceptor doped (p-type semiconductor) or donor doped (n-type semiconductor). For example, if the first conductivity-type semiconductor material is an n-type semiconductor, then the second conductivity-type semiconductor material is a p-type semiconductor. In FIG. 23A, a node 194 is a second conductivity-type semiconductor material, and a deep well 195 is made of a first conductivity-type semiconductor material. The voltage of the backside conductive layer 198 can be set by connecting, for example, a wire to it. However, there are other ways to set the voltage of the backside conductive layer 198 that may be more preferred. For example, there need not be a physical wire connecting a voltage source to the backside conductive layer 198. Below, we describe such means to set the voltage of the backside conductive layer 198.

Assume an example where the first conductivity-type semiconductor material is an n-type semiconductor material. Thus, in FIG. 23A, the node 194 is a p-type semiconductor material, the deep well 195 is an n-type semiconductor material, the backside conductive layer 198 is a p-type semiconductor material, and the substrate 192 is an n-type semiconductor material. Also, the substrate 192 is a high resistivity semiconductor material (for example, having resistivity in an order of kilo Ohm-cm for silicon at room temperature).

When the node 194 is set to a large negative voltage, for example, such as −30V, punch-through happens through the substrate 192, so that a large negative voltage, for example, −15V (notably, the exact value depends on substrate doping level, geometries and dimensions) is conveyed to the backside conductive layer 198. Such punch-through biasing is explained in a granted U.S. Pat. No. 4,837,607, titled *Large-Area, Low Capacitance Semiconductor Arrangement*, by inventors J. Kemmer and G. Lutz, 1989, and a published paper, titled *A Radiation Detector Design Mitigating Problems Related to Sawed Edges*, by A. Aurola et al., Int. C. Position Sensitive Detectors, 2014, which are hereby provided as references. Note that CMOS transistors can be built into the deep well 195. Also, note that instead of using the deep well 195, a simple n-well 196 (namely, of a first conductivity type) and a p-well 197 (namely, of a second conductivity type) could be used for building transistors into. Furthermore, in order for the punch-through biasing to work, there needs to be a large enough distance between the wells (195 and 196) and the node 194. For example, a distance between the well 195 and the node 194, as well the n-well 196 and the node 194 need be large enough. In the above example, the wells 195 and 196 could be biased to 5V and the well 197 to 0V.

Another variant of the backside biasing is a generally known method illustrated in FIG. 23B. The node 194 is a second conductivity-type semiconductor material, a substrate 193 is a high resistivity second conductivity-type semiconductor material, the backside conductive layer 198 is a second conductivity-type semiconductor material, the deep well 195 is of a first conductivity-type semiconductor material, the well 196 is of a first conductivity-type semiconductor material, and the well 197 is of a second conductivity-type semiconductor material. In this case, the node 194, the substrate 193 and the backside conductive layer 198 are made of a second conductivity-type semiconductor material.

When, assuming in the example that the first conductivity-type semiconductor material is an n-type semiconductor material, the aim is to set the voltage of the backside conductive layer 198 to a large negative potential, for example, −15V. In this case, the node 194, the substrate 193 and the backside conductive layer 198 are a p-type semiconductor material. If the backside conductive layer 198 does not need to drive large currents (which is the case in the context of the present disclosure, the voltage at the backside conductive layer 198 is also approximately −15V). Also, in this example, the wells 195 and 196 could be biased to 5V and the well 197 to 0V.

A thing to note is that the well 197 must be narrow and surrounded by a well of a first conductivity type, for example, such as a well 196. With said surrounding and a high resistivity substrate, the surrounding well 196 blocks a resistive connection between the well 197 and the backside conductive layer 198, preventing the well 197 from biasing the backside conductive layer 198. Again, the distances separating the well 196 and the node 194, as well as the well 195 and the node 194 must be large enough for this backside-conductive-layer-biasing scheme to work. CMOS transistors could be placed into the well 195, and/or the wells 196 and 197. Typically, the structures of FIGS. 23A and 23B would be placed in the periphery of an image sensor chip. The right side of FIGS. 23A and 23B show an exemplary illustration where a pixel array could start.

Moreover, a problem with global shutter imaging with correlated double sampling is that signal acquisition and readout do not take place simultaneously. As a result, a part of the optical signal is lost, and thus, the acquired signal is lower. For example, in a granted U.S. Pat. No. 7,361,877 B2, titled *Pinned-Photodiode Pixel with Global Shutter*, by inventors R. Daniel McGrath and R. Michael Guidash, 2008, a sense node, a shielded sense node and a floating diffusion are used. First, there is a reset phase that resets the sense nodes and the floating diffusion, followed by integration. Then, an image is captured to the sense node, and after the integration period, is transferred to the shielded sense node. This is followed by read out of reset and signal values, and the signal that lands on the sensor node during this readout is lost.

There exists a class of applications in which the idea is to emit a light field (usually of a particular wavelength) and measure the reflected light field (that originates from the emitted light) with an image sensor. Light received by the image sensor that originates from background light (such as ambient light) is unwanted in the context of light field imaging. One way to improve a Signal-to-Background-Ratio (SBR) is to emit at a specific wavelength of light, and optically filter out other wavelengths before the image sensor. However, the background light on the pass-band of the optical filter remains. Such optical filter also prevents the use of the image sensor as a multi-mode sensor that could also capture a normal intensity image. Another way to improve the SBR is to emit more power to the light field. This increases the power consumption, and eye safety regulations limit the possibility to continuously emit light in such quantities as to significantly improve the SBR. Notably, the eye safety regulations set a maximum acceptable average power and individual pulse power for the emitted light field.

The light field can be uniform or patterned. An example application relying on a patterned light field is a range detector that makes inferences on distances based on a deformation of a reflection of a known pattern of light, as explained in a published US patent application US 2008/0106746, titled *Depth-Varying Light Fields for Three Dimensional Sensing*, by inventors Alexander Shpunt and Zeev Zalevsky, 2011.

SUMMARY

The present disclosure seeks to provide an improved pixel element.

The present disclosure also seeks to provide a method for measuring an amount of first conductivity-type mobile charges associated with a flux of photons received by a pixel element.

The present disclosure further seeks to provide a system for capturing images.

A further aim of the present disclosure is to provide a solution that overcomes at least partially the problems encountered in the prior art.

In a first aspect, an embodiment of the present disclosure provides a pixel element comprising:
  a semiconductor substrate of a first or second conductivity type, the semiconductor substrate having a front side and a backside, wherein the semiconductor substrate is configured to be exposed to a flux of photons, and to convert the flux of photons to first and second conductivity-type mobile charges;

a first primary charge-collection node of a first conductivity-type semiconductor material, arranged on the front side of the semiconductor substrate;

at least one peripheral node of a second conductivity-type semiconductor material, arranged on the front side of the semiconductor substrate, wherein the at least one peripheral node at least partially surrounds the first primary charge-collection node;

a circuitry directly connected to the first primary charge-collection node and to the at least one peripheral node, wherein the circuitry comprises:
- a first switch to connect and disconnect a first reset voltage to/from the first primary charge-collection node;
- means to provide a peripheral node voltage to the at least one peripheral node; and
- a first measurement means to measure an amount of the first conductivity-type mobile charges collected by the first primary charge-collection node;

a backside conductive layer arranged on the backside of the semiconductor substrate, configured to collect and conduct the second conductivity-type mobile charges, and configured to be electrically connected to a bias voltage; and a first modulating node of the second conductivity-type semiconductor material, wherein the first modulating node is:
- arranged on the front side of the semiconductor substrate;
- at least partially surrounded by the first primary charge-collection node, which first primary charge-collection node is arranged to provide electrical isolation between the first modulating node and the at least one peripheral node; and
- electrically connected to a first modulating voltage source, which first modulating voltage source is independent of the peripheral node voltage.

In a second aspect, an embodiment of the present disclosure provides a method for measuring an amount of first conductivity-type mobile charges associated with a flux of photons received by a pixel element, the pixel element comprising a semiconductor substrate, a first primary charge-collection node, a second primary charge-collection node, a first modulating node, a second modulating node and a circuitry comprising a first switch and a second switch, the method comprising:

(i) depleting a volume inside of the semiconductor substrate by setting a bias voltage (Vbs) to a value that depletes the volume of the semiconductor substrate by at least 50%;
(ii) providing a first reset voltage (Vr_a);
(iii) providing a second reset voltage (Vr_b);
(iv) resetting the first primary charge-collection node by:
connecting the first primary charge-collection node to the first reset voltage (Vr_a) by turning the first switch ON; and
disconnecting the first primary charge-collection node from the first reset voltage (Vr_a) by turning the first switch OFF;
(v) resetting a second primary charge-collection node by:
connecting the second primary charge-collection node to the second reset voltage (Vr_b) by turning a second switch ON; and
disconnecting the second primary charge-collection node from the second reset voltage (Vr_b) by turning the second switch OFF;

(vi) accumulating the first conductivity-type mobile charges to the first and second primary charge-collection nodes during a cycle of:
decreasing a first charge-collection volume by setting a first modulating voltage (Vm_a) to a value that increases a first reverse bias voltage between the first primary charge-collection node and the first modulating node, and increasing a second charge-collection volume by setting a second modulating voltage (Vm_b) to a value that decreases a second reverse bias voltage between the second primary charge-collection node and the second modulating node;
waiting for a first period of time;
after the first period of time, increasing the first charge-collection volume by setting the first modulating voltage (Vm_a) to a value that decreases the first reverse bias voltage between the first primary charge-collection node and the first modulating node, and decreasing the second charge-collection volume by setting the second modulating voltage (Vm_b) to a value that increases the second reverse bias voltage between the second primary charge-collection node and the second modulating node; and
waiting for a second period of time; and
(vii) measuring the amount of the first conductivity-type mobile charges accumulated during the cycle of the step (vi) by determining voltage levels (Vc_a, Vc_b) of the first primary charge-collection node and the second primary charge-collection node.

In a third aspect, an embodiment of the present disclosure provides a method for measuring an amount of first conductivity-type mobile charges associated with a flux of photons received by a pixel element, the pixel element comprising a semiconductor substrate, a first primary charge-collection node, a secondary charge-collection node, a first modulating node, a peripheral node and a circuitry comprising a first switch, the method comprising:

(a) depleting a volume inside of the semiconductor substrate by setting a bias voltage (Vbs) to a value that depletes the volume of the semiconductor substrate by at least 50%;
(b) providing a first reset voltage (Vr);
(c) providing a third voltage (Vx);
(d) resetting the first primary charge-collection node by:
connecting the first primary charge-collection node to the first reset voltage (Vr) by turning the first switch ON; and
disconnecting the first primary charge-collection node from the first reset voltage (Vr) by turning the first switch OFF;
(e) accumulating the first conductivity-type mobile charges to the first primary charge-collection node and the secondary charge-collection node during a cycle of:
decreasing a first charge-collection volume by setting a first modulating voltage (Vm) to a value that increases a first reverse bias voltage between the first primary charge-collection node and the first modulating node, and increasing a second charge-collection volume by setting the third voltage (Vx) to a value that increases a third reverse bias voltage between the secondary charge-collection node and the peripheral node;
waiting for a third period of time;
after the third period of time, increasing the first charge-collection volume by setting the first modulating voltage (Vm, Vm) to a value that decreases the first reverse bias voltage between the first primary charge-collection node and the first modulating node, and decreasing the second charge-collection volume by setting the third voltage (Vx) to a value that decreases the third reverse bias voltage between the secondary charge-collection node and the peripheral node; and waiting for a fourth period of time; and (f) measuring the amount of the first conductivity-type mobile charges accumulated during the cycle of the step (e) by determining a voltage level (Vc) of the first primary charge-collection node.

In a fourth aspect, an embodiment of the present disclosure provides a system for capturing images, the system comprising an image sensor, wherein the image sensor comprises a matrix of pixel elements according to the aforementioned first aspect and a controller, the pixel elements being connected to the controller.

Embodiments of the present disclosure substantially eliminate or at least partially address the aforementioned problems in the prior art, and enable modulation of a quantum efficiency of charge-collection nodes within pixel elements for use in various applications, for example, such as Time-of-Flight (ToF) imaging, light field imaging, High Dynamic Range (HDR) imaging, Signal-to-Background Ratio (SBR) improvement and pixel-parallel signal processing.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those in the art will understand that the drawings are not to scale. Wherever possible, like elements have been indicated by identical numbers.

Embodiments of the present disclosure will now be described, by way of example only, with reference to the following diagrams wherein:

FIGS. 1A-B show a pixel element, while

FIGS. 2A-B show a pixel element, while

FIG. 4B shows a pixel element, while

FIG. 5A-D show a pixel element, while

FIG. 16 is a schematic illustration of an exemplary Pulsed Time-Of-Flight (PTOF) implementation of a system for capturing images, while

Figure 1A:
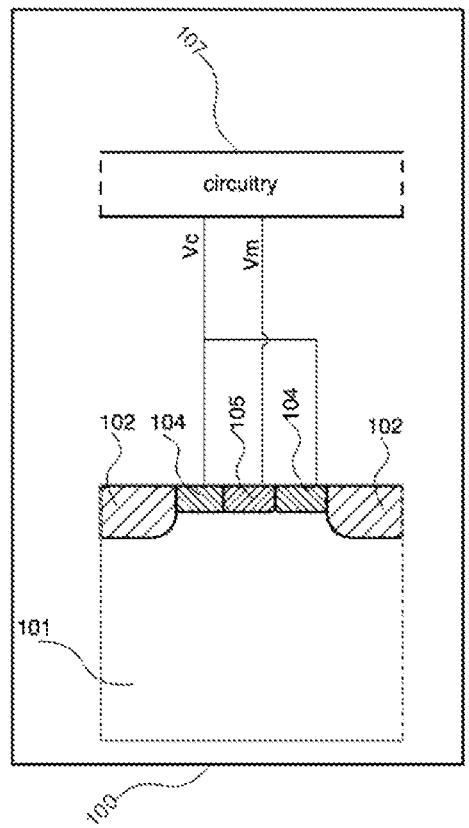

In the accompanying drawings, a number is employed to represent an item over which the number is positioned or an item to which the number is adjacent. A number relates to an item identified by a line linking the number to the item. Parts and nodes in the drawings are identified by numberings, wherein similar numbering applies for similar components throughout all the drawings. For example, a peripheral node is identified as 102 in all the drawings.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practising the present disclosure are also possible.

In a first aspect, an embodiment of the present disclosure provides a pixel element comprising:

a semiconductor substrate of a first or second conductivity type, the semiconductor substrate having a front side and a backside, wherein the semiconductor substrate is configured to be exposed to a flux of photons, and to convert the flux of photons to first and second conductivity-type mobile charges;

a first primary charge-collection node of a first conductivity-type semiconductor material, arranged on the front side of the semiconductor substrate;

at least one peripheral node of a second conductivity-type semiconductor material, arranged on the front side of the semiconductor substrate, wherein the at least one peripheral node at least partially surrounds the first primary charge-collection node;

a circuitry directly connected to the first primary charge-collection node and to the at least one peripheral node, wherein the circuitry comprises:
  a first switch to connect and disconnect a first reset voltage to/from the first primary charge-collection node;
  means to provide a peripheral node voltage to the at least one peripheral node; and
  a first measurement means to measure an amount of the first conductivity-type mobile charges collected by the first primary charge-collection node;

a backside conductive layer arranged on the backside of the semiconductor substrate, configured to collect and conduct the second conductivity-type mobile charges, and configured to be electrically connected to a bias voltage; and a first modulating node of the second conductivity-type semiconductor material, wherein the first modulating node is:
  arranged on the front side of the semiconductor substrate;
  at least partially surrounded by the first primary charge-collection node, which first primary charge-collection node is arranged to provide electrical isolation between the first modulating node and the at least one peripheral node; and
  electrically connected to a first modulating voltage source, which first modulating voltage source is independent of the peripheral node voltage.

An example of such a pixel element has been illustrated in conjunction with FIGS. 12A and 1B later.

Throughout the present disclosure, when the phrase directly connected is used, it means that components directly connected to each other (i.e. the connection can carry a direct (DC) current) in practice the direct current connections do not have capacitive connection in between.

It will be appreciated that the first and second conductivity-type semiconductor materials can be either acceptor doped (namely, a p-type semiconductor) or donor doped (namely, an n-type semiconductor). In other words, if the first conductivity-type semiconductor material is an n-type semiconductor, then the second conductivity-type semiconductor material is a p-type semiconductor; and vice versa. As an example, the at least one peripheral node and/or the first modulating node could be formed by way of a doping of the second conductivity-type semiconductor material. Optionally, the at least one peripheral node is implemented in a form of a well into which transistors can be built.

Throughout the present disclosure, the term semiconductor substrate refers to a volume that has an original doping of a semiconductor wafer, namely, a volume that is left unchanged during semiconductor processing. Notably, a volume that has been doped, for example, for fabricating charge-collection nodes, modulating nodes and peripheral nodes, is not considered the semiconductor substrate.

A first modulating voltage Vm on the first modulating node alters the electric field distribution in a vicinity of the first primary charge-collection node (namely, a substrate volume underneath the first primary charge-collection node, the first modulating node and the at least one peripheral node), thereby modulating a quantum efficiency of the first primary charge-collection node. Throughout the present disclosure, the phrase modulating the quantum efficiency refers to changing a size of a charge-collection volume associated with a given charge-collection node. In other words the charge collection volume associated with a given charge-collection node is a volume which has an electric field oriented in a way that it causes first conductivity type mobile charges to drift towards the associated charge collection node. An incident flux of photons land (arrives/hits) on the surface of the image sensor during use (the incident flux is typically quantified by a radiant flux received by a surface per unit area (irradiance)). As the volume of a charge collection node changes, it also affects area of the charge collection volume projected to the surface that is exposed to flux of photons. Therefore, with a constant irradiance, a smaller charge collection volume tends to collect less photogenerated first conductivity type mobile charge carriers, while a larger charge collection volume tends to collect more photogenerated first conductivity type mobile charge carriers. It should be noted that the area of charge collection volume projected to the surface that is exposed to flux of photons is a simplification: the area that is projected to the surface depends on the depth from which the charge collection volume is projected to the surface. Also, photons of small wavelengths tend to get absorbed closer to the surface than photons of large wavelengths. Indeed it is good to note that term areas of charge collection volumes refers to a simplification, the use of term charge collection areas is useful in describing the operation conceptually.

Throughout the present disclosure, the term charge-collection node refers to a node in a vicinity of which photogenerated charge is collected, while the term modulating node refers to a node that is used to facilitate the aforementioned modulation in the quantum efficiency of a corresponding charge-collection node.

Optionally, the first modulating voltage Vm can be provided via at least two voltages, wherein a first voltage $Vm=Vhq$ causes the first primary charge-collection node to be in a high quantum-efficiency state, and a second voltage $Vm=Vlq$ causes the first primary charge-collection node to be in a low quantum-efficiency state. Throughout the present disclosure, Vhq represents a modulating voltage to be used for achieving the high quantum-efficiency state, while Vlq represents a modulating voltage to be used for achieving the low quantum-efficiency state.

It will be appreciated that intermediate modulating voltage levels can also be used. Throughout the present disclosure, $Vint\_H$ represents a modulating voltage to be used for achieving an intermediate high quantum-efficiency state, while $Vint\_L$ represents a modulating voltage to be used for achieving an intermediate low quantum-efficiency state.

More optionally, the first modulating voltage Vm is set to a continuum of values for an accurate control of the quantum efficiency of the first primary charge-collection node.

It will be appreciated that widths, depths and doping concentrations/profiles of the charge collecting node, the modulating node and the peripheral node affect the efficiency of the quantum efficiency modulation.

In one embodiment, the pixel element further comprises a secondary charge-collection node of the first conductivity-type semiconductor material, arranged on the front side of the semiconductor substrate.

Throughout the present disclosure, the term primary charge-collection node refers to a charge-collection node that at least partially surrounds a modulating node, while the term secondary charge-collection node refers to a charge-collection node without a modulating node (i.e., it does not surround any modulating node). In the present disclosure, when a charge-collection node is referred to without specifying whether it is a primary charge-collection node or a secondary charge-collection node, it could be either a primary charge-collection node or a secondary charge-collection node.

In another embodiment, the pixel element further comprises a second primary charge-collection node of the first conductivity-type semiconductor material, arranged on the front side of the semiconductor substrate. Optionally, in such a case, the pixel element further comprises a second modulating node of the second conductivity-type semiconductor material, wherein the second modulating node is:
- arranged on the front side of the semiconductor substrate;
- at least partially surrounded by the second primary charge-collection node, which second primary charge-collection node is arranged to provide electrical isolation between the second modulating node and the at least one peripheral node; and
- electrically connected to a second modulating voltage source, which second modulating voltage source is independent of the peripheral node voltage, and
wherein the circuitry further comprises:
- a second switch to connect and disconnect a second reset voltage to/from the second primary charge-collection node; and
- a second measurement means to measure an amount of the first conductivity-type mobile charges collected by the second primary charge-collection node.

Optionally, a given primary charge-collection node is in a form of a continuous ring. Alternatively, optionally, a given primary charge-collection node has gaps in the ring. The continuous ring may be made into any suitable shape, for example, such as rectangular, rectangular with rounded corners, elliptical, circular and so on.

If there is a gap in the ring of the given primary charge-collection node, then a layer of mobile first conductivity-type charge carriers is optionally introduced in the gap inside the semiconductor material at the semiconductor-insulator interface. The layer of the mobile first conductivity-type charge carriers would be at a same voltage as the primary charge-collection node.

It will be appreciated that relative placement and shapes of modulating nodes and their corresponding charge-collection nodes can be chosen freely, as long as the quantum efficiency of a given primary charge-collection node can be modulated by the modulating voltage Vm at its corresponding modulating node. There is a high enough barrier between the peripheral node and the modulating node, essentially preventing current flow therebetween.

It will be appreciated that the pixel element can comprise a plurality of charge-collection nodes of the first conductivity-type semiconductor material, and is not limited to just two charge-collection nodes, whether both of the charge-collection nodes are primary or one of the charge-collection nodes is secondary. As an example, a given pixel element can comprise three primary charge-collection nodes, for example, as will be illustrated in conjunction with FIG. 4A later. As another example, a given pixel element can comprise four primary charge-collection nodes, for example, as will be illustrated in conjunction with FIG. 4B later.

In one implementation, the pixel element comprises a plurality of primary charge-collection nodes of the first conductivity-type semiconductor material, wherein each primary charge-collection node is arranged on the front side of the semiconductor substrate. Optionally, in such a case, the pixel element also comprises, for each primary charge-collection node, its corresponding modulating node of the second conductivity-type semiconductor material, wherein the modulating node is:
- arranged on the front side of the semiconductor substrate;
- at least partially surrounded by its corresponding primary charge-collection node, which primary charge-collection node is arranged to provide electrical isolation between the modulating node and the at least one peripheral node; and
- electrically connected to a corresponding modulating voltage source, which modulating voltage source is independent of the peripheral node voltage.

Moreover, in such a case, for each primary charge-collection node, the circuitry further comprises:
- a switch to connect and disconnect a corresponding reset voltage to/from that primary charge-collection node; and
- a measurement means to measure an amount of the first conductivity-type mobile charges collected by that primary charge-collection node.

Additionally, optionally, in such a case (when the pixel element comprises the plurality of charge-collection nodes), the charge-collection nodes and/or modulating nodes are connected to form different groups. Optionally, in this regard, primary charge-collection nodes of a same group are connected together. In such a case, modulating nodes of such connected primary charge-collection nodes could be controlled together. Similar groupings are optionally applied to all combinations of charge-collection nodes and/or modulating nodes.

Additionally, optionally, when an image sensor is implemented by way of a matrix of such pixel elements, charge-collection nodes and/or modulating nodes are connected (namely, grouped) between these pixel elements. Such connections can be referred to as inter-pixel connections.

It will be appreciated that the reset voltages Vr need not be the same for all primary and/or secondary charge-collection nodes. In an extreme case, the reset voltage Vr or the voltage Vx could be different for all primary and/or secondary charge-collection nodes in a given pixel element and/or in a matrix of such pixel elements. Also, the reset voltages can be altered to modulate the quantum efficiency of both primary and secondary charge-collection nodes. This is another way to modulate the quantum efficiency of the primary charge-collection nodes in addition to using corresponding modulating nodes to modulate the quantum efficiency of the primary charge-collection nodes.

Furthermore, optionally, the circuitry is augmented with a computing circuitry that is capable of controlling the modulating nodes, independently or together with global control signals. The ability to locally determine which primary charge-collection node is in the high quantum-efficiency state plays a role in novel image-capture schemes that utilize sensor-level processing.

Furthermore, optionally, the pixel element is arranged to receive a flux of photons from the backside of the semiconductor substrate.

It will be appreciated that even when the charge-collection nodes, the peripheral node, the modulating nodes and the circuitry are fabricated onto the front side of the semiconductor substrate, the pixel element can be illuminated from its backside. Such backside illumination is beneficial in terms of boosting the fill factor and the quantum efficiency. In practice, it is beneficial to thin the semiconductor substrate from the backside in order to obtain more effective backside illumination.

One way to further improve the quantum efficiency modulation pursuant to embodiments of the present disclosure is to increase the resistivity of the semiconductor substrate by reducing a doping concentration of the semiconductor substrate. A preferred resistivity level depends on, for example, device geometries and other requirements to be decided on a case-by-case basis. What is considered a high resistivity substrate depends on the materials and temperature. For silicon at room temperature, a resistivity approximately in a range from 100 Ohm-cm to intrinsic can be considered high resistivity. Preferably, even higher resistivities from 500 Ohm-cm to intrinsic can be used. The quantum efficiency modulation is more effective in a high resistivity substrate, because the effect of the modulating voltage Vm is less attenuated by distance in a high resistivity substrate as compared to a low resistivity substrate. In other words, the modulating voltage Vm affects a larger substrate volume in a high resistivity substrate. Thus, electric fields, generated due to depletion regions responsible for a drift of charge, extend to a larger volume with a given reverse bias. In general resistivity is a function of doping concentration. For example an acceptor (Boron) doped silicon with 5e13/cm^3 at 300K temperature gives a resistivity of about 270 Ohm-cm. Also, a Boron doped silicon with 1e14/cm^3 at 300K temperature gives a resistivity of about 130 Ohm-cm. (notation 1e14 is equivalent with 10 to 14 power i.e. $10^{14}$)

Optionally, in this regard, the semiconductor substrate is a high resistivity substrate having a doping concentration of at most 1e14 atoms/cm³. More optionally, the semiconductor substrate is a high resistivity substrate having a doping concentration of at most 5e13 atoms/cm³.

It will be appreciated that typical backside-illuminated pixel elements use a semiconductor substrate that is less than 10 micrometres thick. The pixel element pursuant to embodiments of the present disclosure works well with a larger substrate thicknesses of even hundreds of micrometres. Such a semiconductor substrate can be referred to as a thick-thinned substrate. Notably, a thicker substrate (for example, having a thickness in an order of 50 micrometres or more) has many benefits, for example, such as an improved quantum efficiency for near-infrared light and a possibility to do without a support die. With substrate thicknesses of about 50 micrometres or less, a support die (for example, a readout chip) is attached to a CMOS side of the pixel element; otherwise, other means to strengthen the chip physically are needed. This yields a more complex and expensive fabrication in conventional image sensors.

Even if a thinned substrate has a high resistivity, the quantum efficiency modulation allows for an improvement in terms of extending a depleted volume. When the semiconductor substrate is essentially fully depleted, charge is collected from essentially the entire substrate beneath a pixel element. This potentially improves the modulation contrast, because a charge-collection volume that collects the charge (namely, the substrate beneath the pixel) is large, and a charge-collection node that is in the low quantum-efficiency state collects charge only from an immediate vicinity of the charge-collection node.

As mentioned earlier, the backside conductive layer is configured to be electrically connected to the bias voltage (Vbs). This helps to fully deplete the semiconductor substrate within the pixel element, and facilitates attainment of a better quantum efficiency and modulation contrast. Essentially the whole semiconductor substrate beneath the pixel element can be depleted by arranging a large enough potential difference between the primary (and/or secondary) charge-collection node(s) and the backside of the pixel element.

As compared to implementations described in a published paper, titled *A 0.13 m CMOS System-on-Chip for a 512×424 Time-of-Flight Image Sensor With Multi-Frequency Photo-Demodulation up to 130 MHz and 2 GS/s ADC*, by Cyrus S. Bamji et al., IEEE JSSC 2015, embodiments of the present disclosure offer a better modulation contrast, especially where the pixel element is illuminated from the backside, and when the substrate is essentially fully depleted. Embodiments of the present disclosure also offer better quantum efficiency, especially when it comes to detecting near-infrared light. A circuit described in Bamji 15 is also slower, as compared to the circuit pursuant to embodiments of the present disclosure, in terms of moving the collected charge from a given charge-collection node to an integration node because there is a high-resistance region between the charge-collection node and the integration node. In embodiments of the present disclosure, the collection node attracts the photogenerated charge and is directly connected to the readout circuit, and no separate integration node is required. Furthermore, the pixel element pursuant to embodiments of the present disclosure is CMOS compatible in contrast to Bamji 15.

The backside of the semiconductor substrate may be treated in order to make it conductive (see examples below), resulting in the backside conductive layer. As an example, the backside conductive layer may be obtained, for example, by implanting or diffusing a layer of second conductivity-type dopant atoms into the backside of the semiconductor substrate. As another example, the backside conductive layer can be formed by depositing a layer of a second conductivity-type semiconductor material on the backside of the semiconductor substrate.

Optionally, before the formation of the backside conductive layer, the semiconductor substrate is thinned from the backside to a suitable thickness. Optionally, the backside conductive layer is treated, for example and if applicable, by annealing (beneficially, laser annealing).

Optionally, the pixel element is fully CMOS compatible. Additionally, optionally, thinning and steps to fabricate the backside conductive layer are carried out after the CMOS process flow.

Optionally, an anti-reflection treatment is also applied to the backside conductive layer. Very efficient anti-reflection can be obtained when silicon microstructures are coated by charged oxides, for example, as described in a published paper, titled *Near-Unity Quantum Efficiency of Broadband Black Silicon Photodiodes with an Induced Junction*, by Mikko A. Juntunen et al., DOI: 10.1038/NPHOTON.2016.226, which is hereby provided as a reference.

Such backside processing steps can be applied to various embodiments of the present disclosure.

It will be appreciated that there are alternative means to obtain the backside conductive layer. As an example, an essentially two-dimensional layer of second conductivity-type mobile charge carriers can be arranged to act as the backside conductive layer. Exemplary means to obtain such a layer of second conductivity-type mobile carriers is to deposit an insulator layer that is suitably charged on the backside of the semiconductor substrate. Such deposition on the backside can be done, for example, using atomic layer deposition. For example, implementations disclosed in the published paper by Juntunen et al., DOI: 10.1038/NPHOTON.2016.226, which is hereby provided as a reference, uses alumina-coated silicon nanostructures on an n-type high-resistivity substrate; alumina is negatively charged, which creates a hole inversion layer inside silicon at the silicon alumina interface.

It will be appreciated that when there is a backside conductive layer being used, the semiconductor substrate can be either first conductivity type or second conductivity type, preferably high-resistivity semiconductor material. If there is no backside conductive layer being used, the semiconductor substrate is preferably high-resistivity second conductivity-type material. This is applicable throughout the present disclosure.

In case the second conductivity type refers to the p-type, then the layer of the second conductivity-type mobile charge carriers can be a hole accumulation layer or a hole inversion layer (both of which can be referred to as a two-dimensional hole gas layer). In case the second conductivity type refers to the n-type, then the layer of the second conductivity-type mobile charge carriers can be an electron accumulation layer or an electron inversion layer (both of which can be referred to as a two-dimensional electron gas layers).

Moreover, some oxides, for example such as alumina and hafnium oxides, are negatively charged when deposited on a silicon substrate, and therefore, attract holes, as explained below:

on the n-type high-resistivity silicon substrate, alumina or hafnium oxide induces a hole inversion layer inside silicon at the oxide-substrate interface; the hole inversion layer may act as the backside conductive layer and can be biased from the front side of the semiconductor substrate;

on the p-type high-resistivity silicon substrate, alumina or hafnium oxide induces a hole accumulation layer inside silicon at the oxide-substrate interface; the hole accumulation layer may act as the backside conductive layer and can be biased from the front side of the semiconductor substrate.

The resulting essentially two-dimensional hole gas layer can be used as the backside conductive layer, when the second conductivity-type semiconductor material corresponds to the p-type semiconductor material.

Furthermore, some oxides, for example, such as silicon dioxide, are positively charged when grown or deposited on a silicon substrate, and therefore, attract electrons, as explained below:

on the n-type high-resistivity silicon substrate, silicon dioxide induces an electron accumulation layer inside silicon at the oxide-substrate interface; the electron accumulation layer may act as the backside conductive layer and can be biased from the front side of the semiconductor substrate;

on the p-type high-resistivity silicon substrate, silicon dioxide induces an electron inversion layer inside silicon at the oxide-substrate interface; the electron inversion layer may act as the backside conductive layer and can be biased from the front side of the semiconductor substrate.

The resulting essentially two-dimensional electron gas layer can be used as the backside conductive layer, when the second conductivity-type semiconductor material corresponds to the n-type semiconductor material.

For example, if a primary (and/or secondary) charge-collection node is made of an n-type semiconductor material, the backside conductive layer can be created by implanting or diffusing p-type dopant atoms on the backside of the semiconductor substrate, or by depositing a p-type semiconductor material on the backside of the semiconductor substrate, or by depositing or growing a negatively-charged insulator material on the backside of the semiconductor substrate in order to create an essentially two-dimensional hole gas layer. In such a case, the reverse bias between the charge-collection node and the backside conductive layer determines the size of the depleted volume inside the semiconductor substrate. Furthermore, a large enough reverse bias should be applied between the backside conductive layer and the charge-collection node in order to essentially fully deplete the semiconductor substrate.

As another example, if a primary (and/or secondary) charge-collection node is a p-type semiconductor material, the backside conductive layer can be created by implanting or diffusing n-type dopant atoms on the backside of the semiconductor substrate, or by depositing an n-type semiconductor material on the backside of the semiconductor substrate, or by depositing or growing a positively-charged insulator material on the backside of the semiconductor substrate in order to create an essentially two-dimensional electron gas layer. In such a case, the reverse bias between the charge-collection node and the backside conductive layer determines the size of the depleted volume inside the semiconductor substrate. Furthermore, a large enough reverse bias should be applied between the charge-collection node and the backside conductive layer in order to essentially fully deplete the semiconductor substrate.

If the reverse bias between the (primary and/or secondary) charge-collection node and the backside conductive layer is high enough, the semiconductor substrate becomes essentially fully depleted. By essentially fully depleted, it is meant that the substrate volume is at least 50% depleted, and more beneficially, is at least 60%, 70%, 80%, 90%, or 100% depleted in an order of preference, wherein 100% is the most preferable value.

Optionally, the backside conductive layer is biased indirectly from the front side through the semiconductor substrate, for example, as explained in the background section of the present disclosure.

Figure 23A:
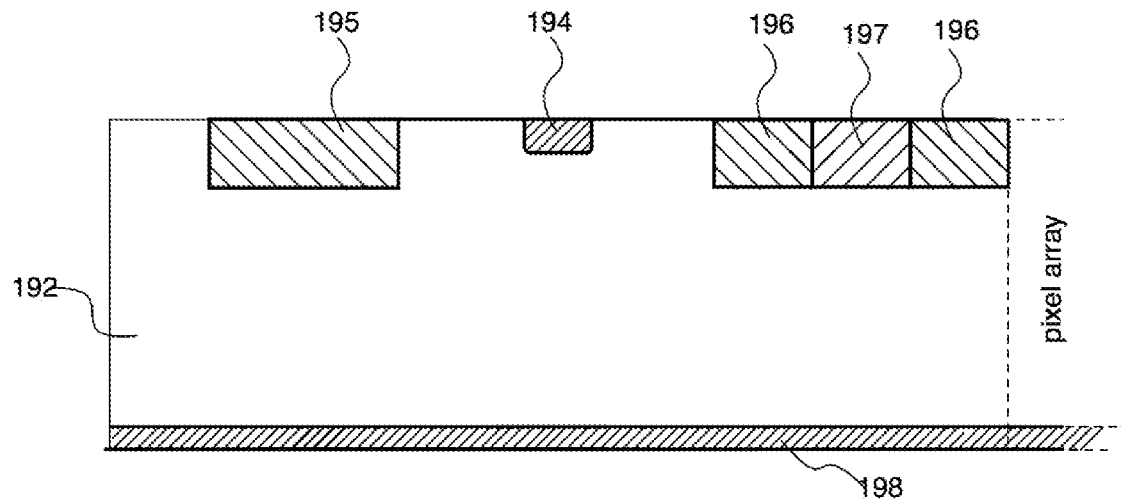
FIGS. 23A-23B (Prior Art) show examples of biasing a backside conductive layer.
Figure 23B:
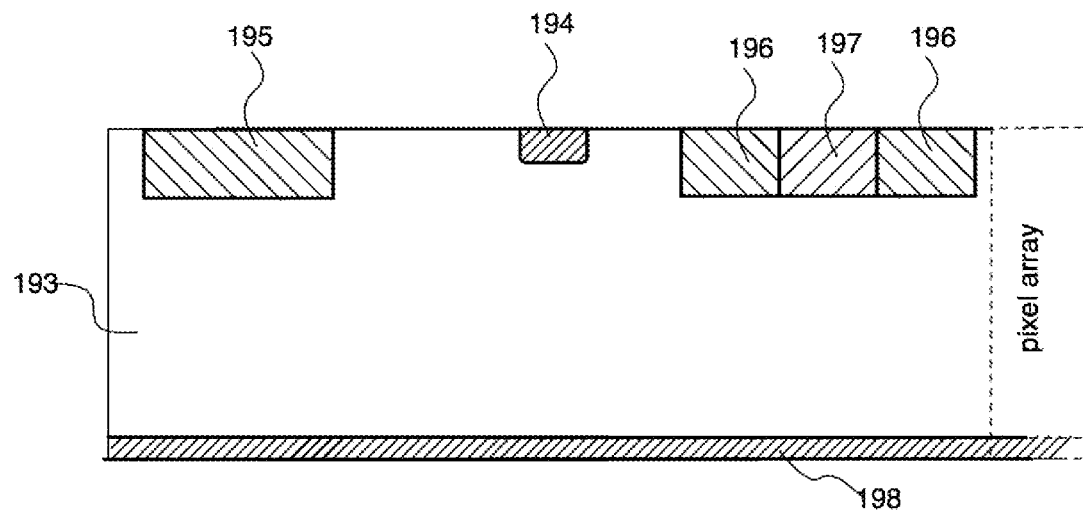

Means to arrange the required reverse bias between the charge collection node and the backside conductive layer could be implemented, for example, by way of a circuit located in a peripheral circuitry that controls the bias voltage Vbs through the voltage of a node that is similar to the node 194 of FIGS. 23A and 23B.

Proper control of the bias voltage on the backside conductive layer facilitates a thick (for example, more than ten micrometres), fully-depleted, backside-illuminated pixel element with many benefits, for example, such as a low sensor capacitance, a high quantum efficiency, especially to near-infrared light, a good modulation contrast, a fast charge collection speed, and a 100% fill factor.

An important aspect of embodiments of the present disclosure is to obtain a small primary charge-collection node size, while having a high modulation contrast and collection of charge from the whole pixel element. A higher reverse bias voltage between the charge-collection nodes and the peripheral node allows for smaller sizes of the charge-collection nodes and modulating nodes relative to the whole area of the pixel element. Said higher reverse bias voltage makes it possible to collect photogenerated charge from further away under the peripheral node. If the size of the charge-collection nodes and the modulating nodes is smaller, more charge-collection nodes can be put into a single pixel element and/or the total area of the pixel element can be made smaller. Also, if the size of the charge-collection nodes and the modulating nodes is smaller in relation to the whole area of the pixel element, more transistors can be put into the circuitry of the pixel element of a certain area. This has been elucidated in greater detail in conjunction with FIG. 15.

In a second aspect, an embodiment of the present disclosure provides a method for measuring an amount of first conductivity-type mobile charges associated with a flux of photons received by a pixel element, the pixel element comprising a semiconductor substrate, a first primary charge-collection node, a second primary charge-collection node, a first modulating node, a second modulating node and a circuitry comprising a first switch and a second switch, the method comprising:

(i) depleting a volume inside of the semiconductor substrate by setting a bias voltage (Vbs) to a value that depletes the volume of the semiconductor substrate by at least 50%;

(ii) providing a first reset voltage (Vr_a);

(iii) providing a second reset voltage (Vr_b);

(iv) resetting the first primary charge-collection node by:
connecting the first primary charge-collection node to the first reset voltage (Vr_a) by turning the first switch ON; and
disconnecting the first primary charge-collection node from the first reset voltage (Vr_a) by turning the first switch OFF;

(v) resetting a second primary charge-collection node by:
connecting the second primary charge-collection node to the second reset voltage (Vr_b) by turning a second switch ON; and
disconnecting the second primary charge-collection node from the second reset voltage (Vr_b) by turning the second switch OFF;

(vi) accumulating the first conductivity-type mobile charges to the first and second primary charge-collection nodes during a cycle of:
decreasing a first charge-collection volume by setting a first modulating voltage (Vm_a) to a value that increases a first reverse bias voltage between the first primary charge-collection node and the first modulating node, and increasing a second charge-collection volume by setting a second modulating voltage (Vm_b) to a value that decreases a second reverse bias voltage between the second primary charge-collection node and the second modulating node;
waiting for a first period of time;
after the first period of time, increasing the first charge-collection volume by setting the first modulating voltage (Vm_a) to a value that decreases the first reverse bias voltage between the first primary charge-collection node and the first modulating node, and decreasing the second charge-collection volume by setting the second modulating voltage (Vm_b) to a value that increases the second reverse bias voltage between the second primary charge-collection node and the second modulating node; and
waiting for a second period of time; and (vii) measuring the amount of the first conductivity-type mobile charges accumulated during the cycle of the step (vi) by determining voltage levels (Vc_a, Vc_b) of the first primary charge-collection node and the second primary charge-collection node.

Optionally, the pixel element further comprises a peripheral node, wherein the method further comprises arranging for the peripheral node to have a potential sufficient for providing at least a 0.6 volt potential barrier to the first conductivity-type charge carriers between the first and the second primary charge-collection nodes when the first and second primary charge-collection nodes are at the first and second reset voltages. In this regard, a peripheral node voltage is applied at the peripheral node. As an example for values of peripheral node voltages for achieving the potential barrier refer to FIG. 14A and FIG. 14B. In the examples it is assumed that the first conductivity type semiconductor is donor doped (n-type), the reset voltages are 5V, the signal range, i.e., the voltage ranges of the charge collection nodes are from 5V to 3V, peripheral node is at 0V, and backside conductive layer is at −15V.

It will be appreciated that the reset voltages Vr_a and Vr_b need not be the same for the first and second primary charge-collection nodes. In other words, the first reset voltage Vr_a can be different from the second reset voltage Vr_b.

Moreover, optionally, the first and second reset voltages are altered to modulate the quantum efficiency of both the first and second primary charge-collection nodes. Notably, this is another way of modulating the quantum efficiency of the first and second primary charge-collection nodes in addition to using the first and second modulating nodes to modulate the quantum efficiency.

In a third aspect, an embodiment of the present disclosure provides a method for measuring an amount of first conductivity-type mobile charges associated with a flux of photons received by a pixel element, the pixel element comprising a semiconductor substrate, a first primary charge-collection node, a secondary charge-collection node, a first modulating node, a peripheral node and a circuitry comprising a first switch, the method comprising:

(a) depleting a volume inside of the semiconductor substrate by setting a bias voltage (Vbs) to a value that depletes the volume of the semiconductor substrate by at least 50%;

(b) providing a first reset voltage (Vr);

(c) providing a third voltage (Vx);

(d) resetting the first primary charge-collection node by:
connecting the first primary charge-collection node to the first reset voltage (Vr) by turning the first switch ON; and
disconnecting the first primary charge-collection node from the first reset voltage (Vr) by turning the first switch OFF;

(e) accumulating the first conductivity-type mobile charges to the first primary charge-collection node and the secondary charge-collection node during a cycle of:
decreasing a first charge-collection volume by setting a first modulating voltage (Vm) to a value that increases a first reverse bias voltage between the first primary charge-collection node and the first modulating node, and increasing a second charge-collection volume by setting the third voltage (Vx) to a value that increases a third reverse bias voltage between the secondary charge-collection node and the peripheral node;

waiting for a third period of time;

after the third period of time, increasing the first charge-collection volume by setting the first modulating voltage (Vm, Vm) to a value that decreases the first reverse bias voltage between the first primary charge-collection node and the first modulating node, and decreasing the second charge-collection volume by setting the third voltage (Vx) to a value that decreases the third reverse bias voltage between the secondary charge-collection node and the peripheral node; and waiting for a fourth period of time; and (f) measuring the amount of the first conductivity-type mobile charges accumulated during the cycle of the step (e) by determining a voltage level (Vc) of the first primary charge-collection node.

Optionally, the method further comprises arranging for the peripheral node to have a potential sufficient for providing at least a 0.6 volt potential barrier to the first conductivity-type charge carriers between the first primary charge-collection node and the secondary charge-collection node when the first primary charge-collection node and the secondary charge-collection node are at the first reset voltage (Vr) and the third voltage (Vx).

In a fourth aspect, an embodiment of the present disclosure provides a system for capturing images, the system comprising an image sensor, wherein the image sensor comprises a matrix of pixel elements according to the aforementioned first aspect and a controller, the pixel elements being connected to the controller.

It will be appreciated that charge-collection nodes of individual pixel elements are isolated from each other, and there is a large enough potential barrier between the charge-collection nodes of adjacent pixel elements in the matrix.

Optionally, the matrix of pixel elements has local connections between the pixel elements for various purposes, for example, such as pixel-level computation that operates on selected pixel-element signals. As an example, individual pixel elements can have connections to nearest neighbouring pixel elements in cardinal directions. Such connections are not shown in figures of the present disclosure, for the sake of simplicity only.

Moreover, if all primary charge-collection nodes and all secondary charge-collection nodes in a neighbourhood of a pixel element (and the entire matrix of pixel elements, in an extreme case) are in the low quantum-efficiency state, there are unwanted leakage currents between peripheral nodes and the semiconductor substrate. Optionally, in order to minimize the leakages, a duration for which all (primary and secondary) charge-collection nodes are in the low quantum-efficiency state can be minimized. Optionally, slightly overlapping voltage pulses are used at the modulating nodes.

Optionally, the quantum efficiency modulation is arranged in a manner that there are enough primary or secondary charge-collection nodes in the high quantum-efficiency state in a pixel neighbourhood at a given time.

Optionally, the system further comprises a light emitter arranged to be directed to a target. Optionally, in this regard, the controller is configured to:

provide a control signal for the light emitter to emit a pulse of photons at a first moment of time;

start a measurement to detect a reflected pulse of photons from the target with a first pixel element of the matrix of pixel elements at a second moment of time;

stop the measurement with the first pixel element at a third moment of time;

start a measurement to detect the reflected pulse of photons from the target with a second pixel element of the matrix of pixel elements at a fourth moment of time;

stop the measurement with the second pixel element at a fifth moment of time; and calculate a time of flight of the pulse of photons, by comparing an amount of accumulated first conductivity-type mobile charges associated with the reflected pulse of photons in the first pixel element with an amount of accumulated first conductivity-type mobile charges associated with the reflected pulse of photons in the second pixel element.

Additionally or alternatively, optionally, the system further comprises a light emitter configured to emit light pulses at more than one wavelength. Optionally, in this regard, the controller is further configured to adjust modulating voltages (Vm) of modulating nodes of individual pixel elements of the matrix of pixel elements based upon a given wavelength emitted by the light emitter at a given moment of time.

Moreover, optionally, the controller is configured to control the modulating voltages (Vm) based upon pulse duration of the emitted light pulses to:

arrange a first charge-collection volume of a first size for a first pulse duration; and arrange a second charge-collection volume of a second size for a second pulse duration, wherein the first size is larger than the second size, and the first pulse duration is smaller than the second pulse duration.

It will be appreciated that by modulating the quantum efficiency, it is possible to change the charge-collection volume from which a given pixel element collects photogenerated charges. In effect, pixel boundaries in terms of collecting photogenerated charges (namely, the charge-collection volumes) are not fixed rather they are flexible, i.e., programmable by modulating the quantum efficiency. This will be elucidated in more detail in conjunction with FIGS. 8A-F, 9A-B, 10A-E and 11A-C.

It will be appreciated that flexible (namely, programmable) charge-collection volumes of the pixel elements within the matrix can be used to increase the resolution of the image sensor, for example, by capturing multiple images with different patterns of the modulating voltages Vm (or voltages Vx). It is to be noted here that the voltage Vx can be read out after photogenerated charge has been collected; thus, secondary charge-collection nodes can contribute to the resolution of the image sensor similar to the primary charge-collection nodes.

In one embodiment, the pixel elements of the image sensor have only secondary charge-collection nodes. Such an image sensor has limited capability to modulate the quantum efficiencies of the charge-collection nodes during the integration of the photogenerated charge, but between image frames the quantum efficiencies can be effectively modulated using the voltage Vx after reset. One such example pixel element has been illustrated in conjunction with FIG. 12C.

A key aspect of embodiments of the present disclosure is that modulating the voltages at p-type modulating nodes has a similar effect as that achieved by controlling charge-collection nodes capacitively as described in a granted U.S. Pat. No. 6,580,496 B2. It is to be noted here that in U.S. Pat. No. 6,580,496 B2, capacitive voltage division reduces the amount of quantum efficiency modulation as compared to embodiments of the present disclosure. In other words, embodiments of the present disclosure have a better modulation contrast, which is a measure of how well the collection of the photogenerated charge can be controlled between charge-collection nodes.

In embodiments of the present disclosure, the modulation is facilitated by modulating the voltages of the modulating nodes; the modulating nodes being low capacitance nodes that are easier to drive with switched voltage sources. In embodiments of the present disclosure, the strength of the quantum efficiency modulation effect can be tuned, for example, with relative widths of the charge-collection nodes and the modulating nodes. The quantum efficiency modulation effect needs to be simulated with physical simulations to verify the best possible operation for a given technology. Additionally, the reset voltages can be used to modulate the quantum efficiency.

Pursuant to embodiments of the present disclosure, the aforementioned system can be implemented in various ways. In one implementation, the aforementioned system is a camera. In another implementation, the aforementioned system is a lidar. The term lidar stands for a light detection and ranging system.

In yet another implementation, the system is a Time-of-Flight (ToF) system; in such a case, the system comprises the aforementioned light emitter in addition to the image sensor. The image sensor is operable to collect photogenerated charge into different primary charge-collection nodes depending on the time the charge was photogenerated, and rapidly switch between the primary charge-collection nodes, so as to change the primary charge-collection node that collects the photogenerated charge at a given time. Optionally, the image sensor is fully CMOS compatible.

Figure 15:
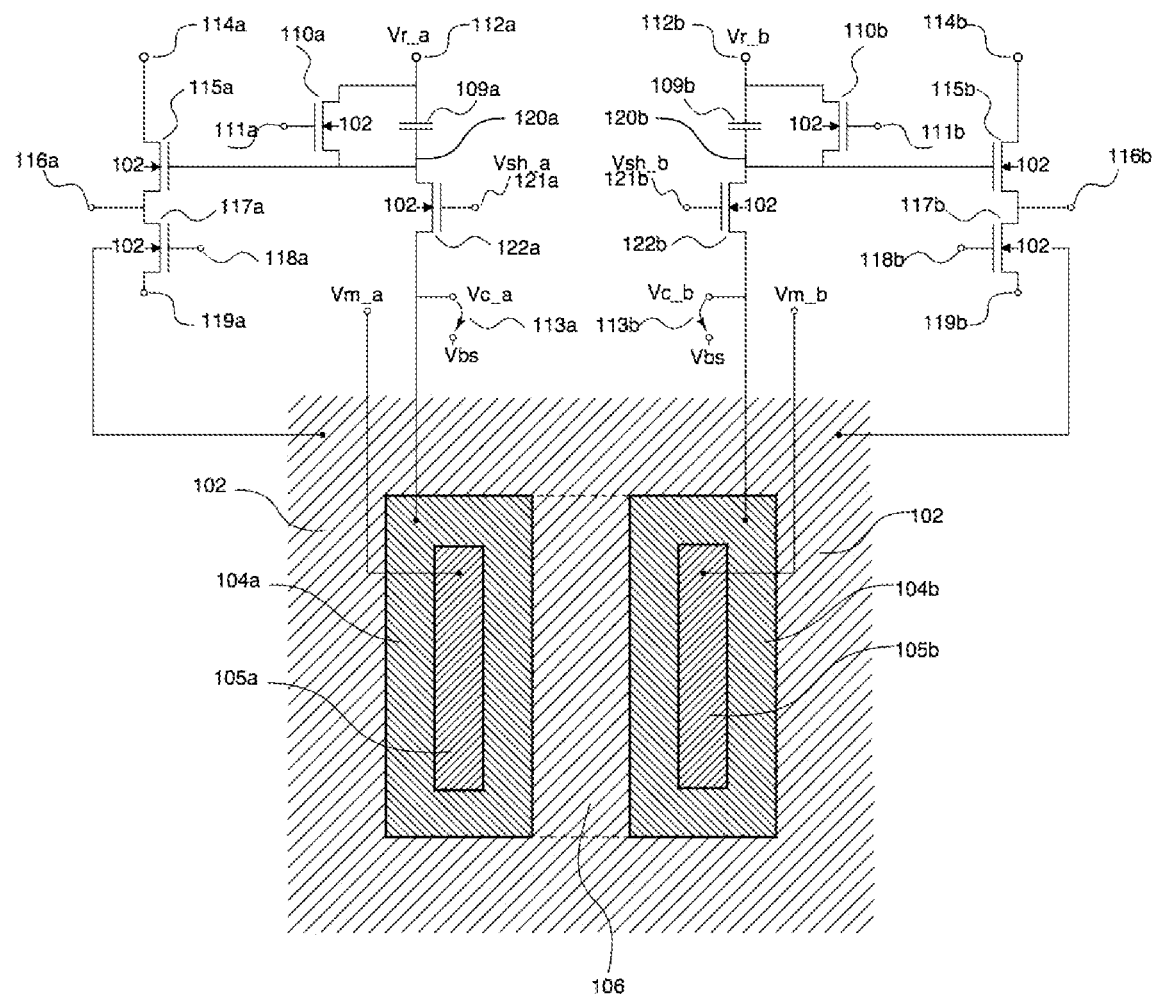
FIG. 15 is a schematic illustration of a circuitry of a pixel element, in accordance with an embodiment of the present disclosure.

The modulated image sensor (for example, as shown in FIG. 1A) can be used for ToF applications, by using a required amount of primary charge-collection nodes and the circuitry (for example, as shown in FIG. 15). The system pursuant to embodiments of the present disclosure can be used for Modulated Time-Of-Flight (MTOF) and Pulsed Time-Of-Flight (PTOF) applications.

It is to be noted that a main difference in the capabilities between primary and secondary charge-collection nodes is the speed of modulation. During one period of signal integration (namely, one frame), the quantum efficiency of a primary charge-collection node can be rapidly and repeatedly switched between different quantum-efficiency states with the aid of the modulating node. This is useful, for example, in ToF applications, where each frame is a result of altering multiple times between the high quantum-efficiency state and the low quantum-efficiency state.

The quantum efficiency of a primary charge-collection node can also be altered with the reset voltage; if the reverse bias voltage after reset is lower after the reset, the quantum efficiency is also lower. The reset is carried out only once per frame so that it is not suitable for modulating the quantum efficiency repeatedly during a single frame. After reset, the reset voltage still connects to the primary charge-collection node through a corresponding capacitor (for example, as will be shown in FIG. 12A-D). This would allow repeated modulation of the quantum efficiency during a single frame. However, such capacitive modulation effect tends to require a high voltage magnitude at the reset node, making such modulation less practical.

The quantum efficiency of a secondary charge-collection node can be altered by a reset voltage; it is thus not well suited for repeated modulations of the quantum efficiency during a single frame. Some proposed implementations of the pixel element (described later) are fine with such modulation in which quantum efficiency remains constant during one frame. For example, a resolution improvement method would work with an image sensor with only secondary charge-collection nodes.

An advantage of this would be a more compact size of the secondary charge-collection node in comparison to a primary charge-collection node.

DETAILED DESCRIPTION OF THE DRAWINGS

Referring to FIGS. 1A-B, 2A-B, 4A, 4B, 5A-D, 7A-B, 7C, 7D, 7E, 7F, 7G-J, 7K-M, 7N-P and 7Q-R, illustrated are exemplary implementations of a pixel element 100, in accordance with various embodiments of the present disclosure. FIGS. 1C, 3, 4C and 6 are schematic illustrations of an image sensor 200 that employs a plurality of pixel elements 100, in accordance with various embodiments of the present disclosure. It should be understood by a person skilled in the art that these figures include simplified arrangements of the exemplary implementations of the pixel element 100 and the image sensor 200 for the sake of clarity only, which should not unduly limit the scope of the claims herein. Notably, the pixel element 100 is not limited to shapes and arrangements of charge-collection nodes, modulating nodes and surrounding wells shown in these figures. The person skilled in the art will recognize many variations, alternatives, and modifications of embodiments of the present disclosure.

Figure 1B:
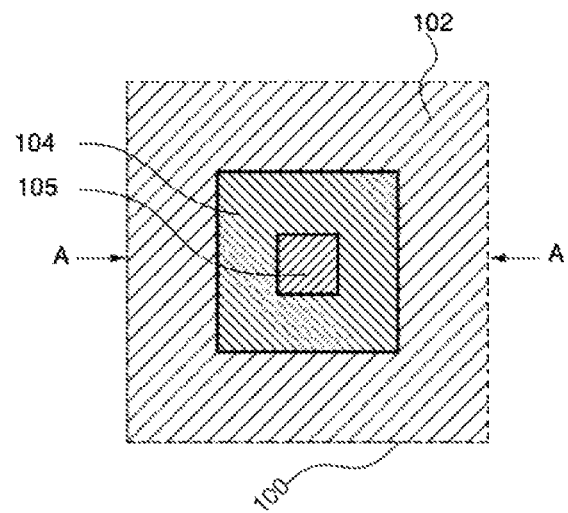

FIG. 1A shows a section view of the pixel element 100, while FIG. 1B shows a top view of the pixel element 100, according to a first embodiment of the present disclosure. The cutting plane (A-A) has been shown with arrows labelled with A sin FIG. 1B.

With reference to FIGS. 1A and 1B, the pixel element 100 comprises a semiconductor substrate 101 of a first or second conductivity type, a first primary charge-collection node 104, a peripheral node 102, a circuitry 107 and a first modulating node 105. In FIG. 1B, the circuitry 107 is not shown, for the sake of simplicity only.

The semiconductor substrate 101 has a front side and a backside. The semiconductor substrate 101 is configured to be exposed to a flux of photons, and to convert the flux of photons to first and second conductivity-type mobile charges.

The first primary charge-collection node 104 is composed of a first conductivity-type semiconductor material, while the peripheral node 102 and the first modulating node 105 are composed of a second conductivity-type semiconductor material.

The first primary charge-collection node 104, the peripheral node 102 and the first modulating node 105 are arranged on the front side of the semiconductor substrate 101. In other words, the first primary charge-collection node 104, the first modulating node 105 and the peripheral node 102 are fabricated on the semiconductor substrate 101.

The peripheral node 102 at least partially surrounds the first primary charge-collection node 104. The first modulating node 105 is at least partially surrounded by the first primary charge-collection node 104. Optionally, the first primary charge-collection node 104 is ring-shaped, for example as shown in FIG. 1B.

The first primary charge-collection node 104 is arranged to provide electrical isolation between the first modulating node 105 and the peripheral node 102.

The circuitry 107 is directly connected to the first primary charge-collection node 104, to the modulating node 105 and to the peripheral node 102. The circuitry 107 comprises means (not shown) to provide a peripheral node voltage to the peripheral node 102. The modulating node 105 is electrically connected to a first modulating voltage (Vm) source, which first modulating voltage source is independent of the peripheral node voltage.

In FIG. 1A, Vc represents a voltage at the first primary charge-collection node 104, while Vm represents a modulating voltage at the first modulating node 105. The modulating voltage Vm on the first modulating node 105 alters the electric field distribution in a vicinity of the first primary charge-collection node (namely, a substrate volume underneath the first primary charge-collection node 104, the first modulating node 105 and the peripheral node 102), thereby modulating the quantum efficiency of the first primary charge-collection node 104.

The circuitry 107 further comprises a first switch (not shown) to connect and disconnect a first reset voltage (Vr) to/from the first primary charge-collection node 104, and a first measurement means (not shown) to measure an amount of the first conductivity-type mobile charges collected by the first primary charge-collection node 104.

Figure 1C:
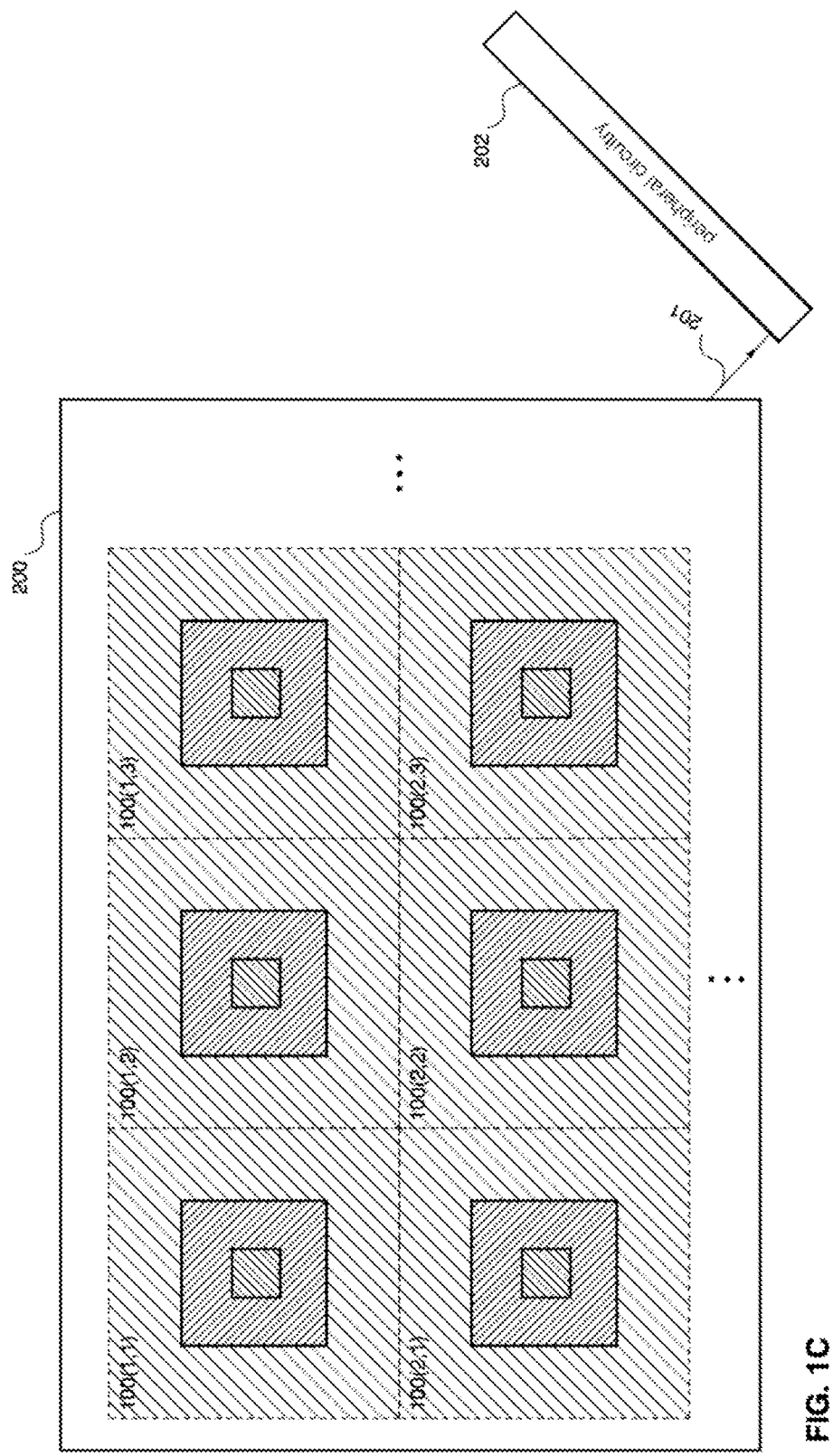
FIG. 1C shows an image sensor made from such pixel elements, according to a first embodiment of the present disclosure.

With reference to FIG. 1C, the image sensor 200 comprises a matrix of pixel elements 100 and a controller 202 (also referred to as a peripheral circuitry, throughout the present disclosure). Individual pixel elements of the matrix are connected to the controller 202, via electrical connections 201, for purposes of input/output operations and biasing.

In FIG. 1C, individual pixel elements within the matrix are denoted by indexes representing their location in the matrix. As an example, a pixel element in a first row and a first column is denoted by an index 100(1,1); a pixel element in the first row and a second column is denoted by an index 100(1,2); and so on. Similar naming convention has also been used in later figures.

As shown in FIG. 1C, ring-shaped first primary charge-collection nodes electrically isolate corresponding modulating nodes from peripheral nodes. The first primary charge-collection nodes are also isolated from each other. There is a large enough potential barrier between the first primary charge-collection nodes of adjacent pixel elements in the matrix.

The aforementioned first modulating voltage (Vm) source could be provided by way of the circuitry 107 and/or the controller 202. As mentioned earlier, changing the modulating voltage Vm of a given modulating node 105 afters the quantum efficiency of its surrounding first primary charge-collection node 104.

Figure 2A:
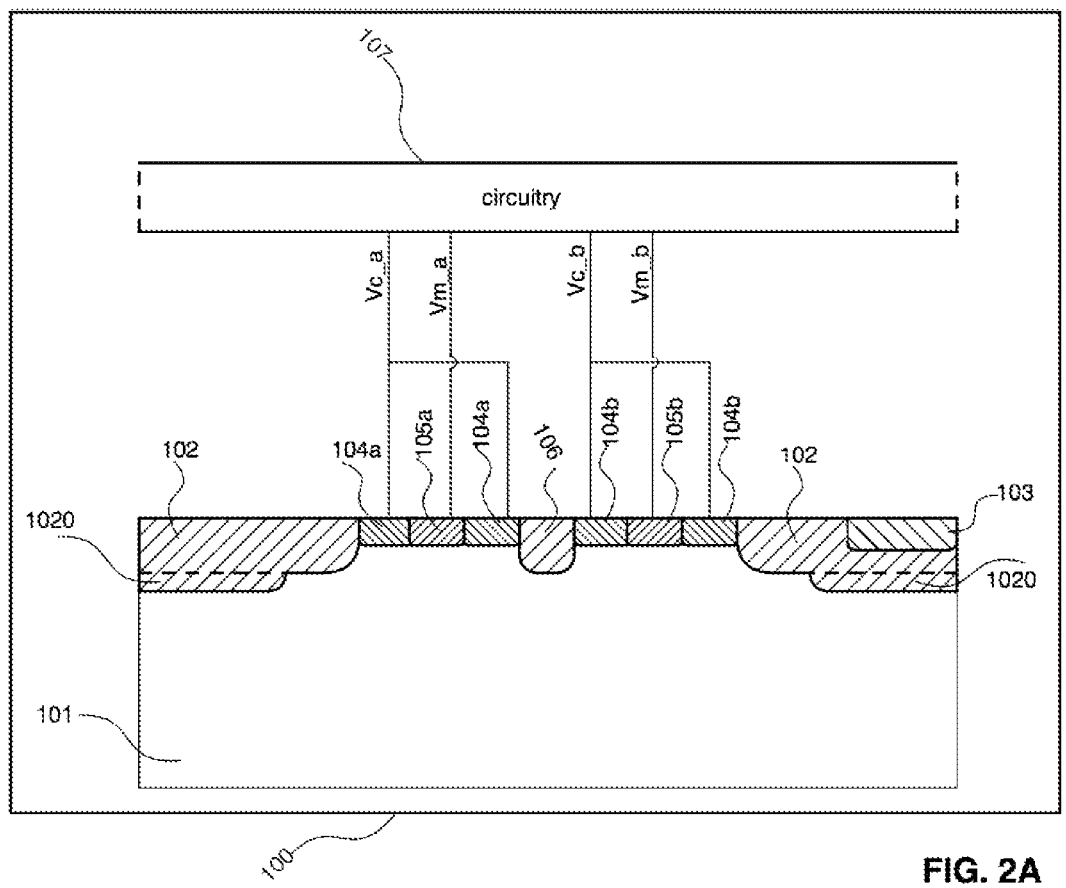

It is to be noted here that in the figures, wherever there are multiple primary charge-collection nodes in a given pixel element, reference numerals have been appended with alphabets to distinguish between different nodes. For example, in FIG. 1A, the first primary charge-collection node has been denoted by 104, while its voltage has been noted by Vc. In FIG. 2A, first and second primary charge-collection nodes have been denoted by 104a and 104b, whose voltages have been denoted by Vc_a and Vc_b, respectively. Similar naming convention has been applied to other components. For example, in FIG. 1A, the modulating node has been denoted by 105, whose modulating voltage has been denoted by Vm. In FIG. 2A, first and second modulating nodes have been denoted by 105a and 105b, whose modulating voltages have been denoted by Vm_a and Vm_b, respectively.

Figure 2B:
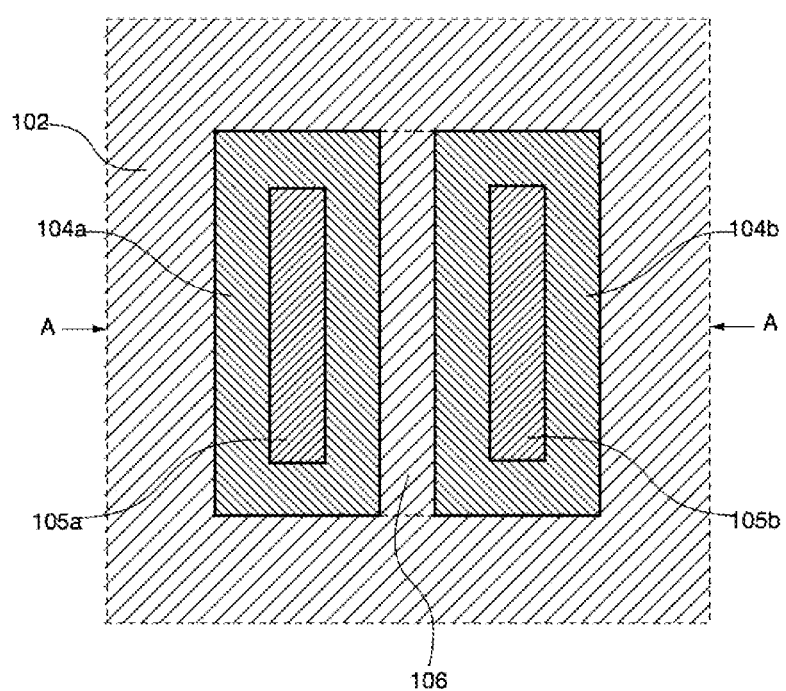

FIG. 2A shows a section view of the pixel element 100, while FIG. 2B shows a top view of the pixel element 100, according to a second embodiment of the present disclosure. The cutting plane (A-A) has been shown with arrows labelled with A s in FIG. 2B.

With reference to FIGS. 2A and 2B, the pixel element 100 comprises a semiconductor substrate 101 of the first or second conductivity type, a first primary charge-collection node 104a, a second primary charge-collection node 104b, a peripheral node, a circuitry 107, a first modulating node 105a and a second modulating node 105b.

With reference to FIG. 2B, the first and second primary charge-collection nodes 104a and 104b are ring-shaped. The first and second primary charge-collection nodes 104a and 104b at least partially surround the first and second modulating nodes 105a and 105b, respectively.

The peripheral node is optionally made in a form of a well 102 of a second conductivity-type semiconductor material, as shown in FIG. 2A. Between the first and second primary charge-collection nodes 104a and 104b, there is a region 106 of another second conductivity-type semiconductor material, which may be same as or different from the second conductivity-type semiconductor material of the well 102 in terms of, for example, doping concentration, thickness, and so forth. The well 102 and the region 106 are connected together to form the peripheral node (hereinafter referred to as the peripheral node 102, for the sake of convenience).

The first and second primary charge-collection nodes 104a and 104b electrically isolate the first and second modulating nodes 105a and 105b from the peripheral node 102, respectively. The first and second primary charge-collection nodes 104a and 104b are also electrically isolated from each other. Such isolation is achieved when there is a large enough potential barrier between the first and second primary charge-collection nodes 104a and 104b essentially preventing current flow therebetween. This can be accomplished, for example, with the second conductivity-type semiconductor material of the region 106.

Optionally, the circuitry 107 is placed in the well 102. As an example, at least one first conductivity-type Metal-Oxide-Semiconductor Field-Effect Transistor (MOSFET) can be built on the well 102 of the second conductivity-type semiconductor material.

Alternatively, optionally, a deep well is formed, for example, by a combination of the second conductivity-type semiconductor material of the well 102 with yet another second conductivity-type semiconductor material of a region 1020. Optionally, in such a case, a well 103 of a first conductivity-type semiconductor material is built on the deep well, and at least one second conductivity-type MOSFET is built into the well 103.

Likewise, other circuit components (for example, such as capacitors, resistors and the like) that have been employed in the circuitry 107 (based upon a semiconductor fabrication technology used for fabrication) can be built into the well 102, the deep well 102/1020 and/or the well 103.

Figure 3:
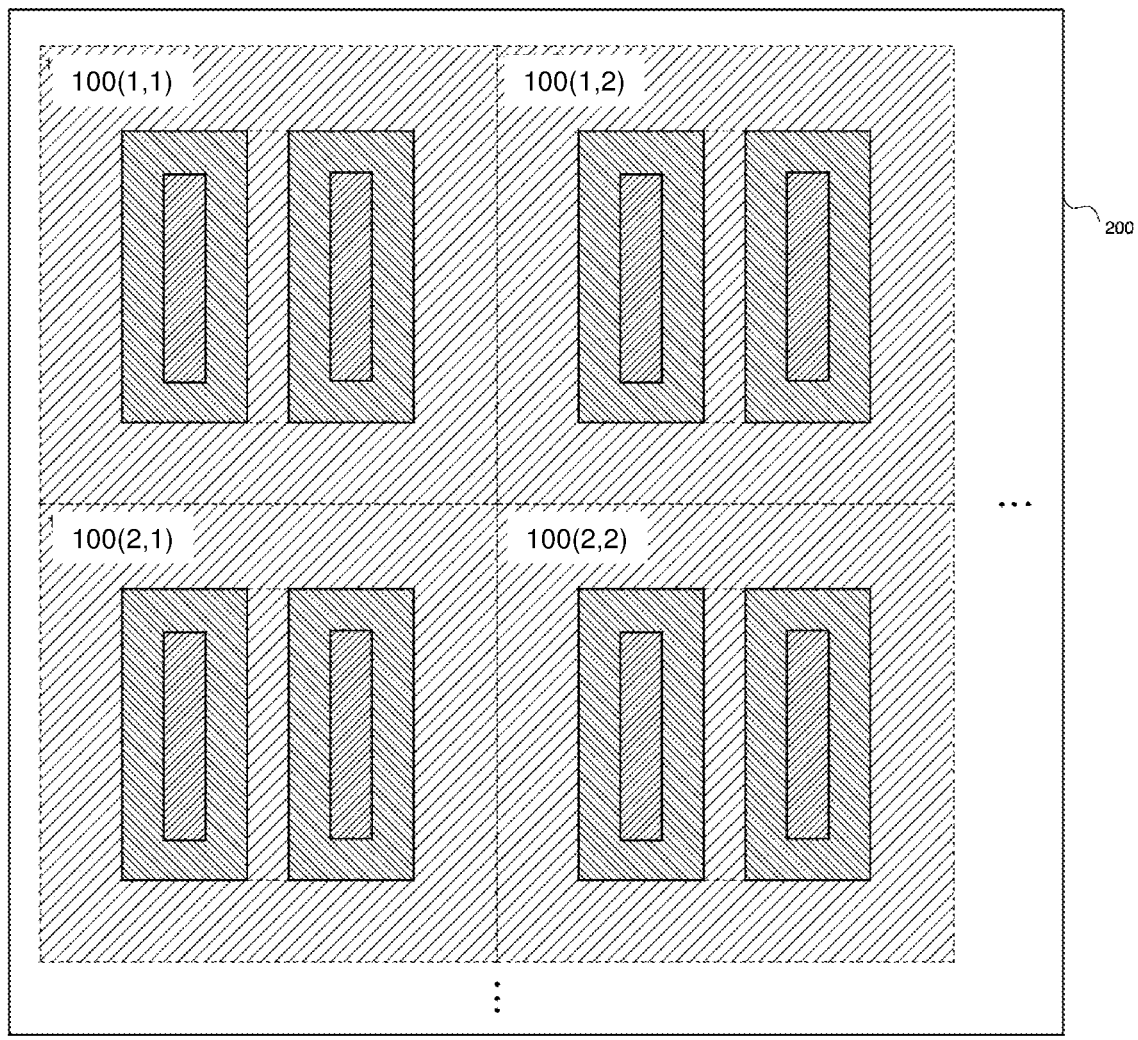
FIG. 3 shows an image sensor made from such pixel elements, according to a second embodiment of the present disclosure.

With reference to FIG. 3, the image sensor 200 comprises a matrix of pixel elements 100 of FIGS. 2A-B and a controller (not shown). Individual pixel elements of the matrix are connected to the controller, via electrical connections.

In this embodiment, the first and second primary charge-collection nodes 104a and 104b within a same pixel element 100 are closer to each other than to adjacent primary charge-collection nodes of neighbouring pixel elements 100.

Figure 4A:
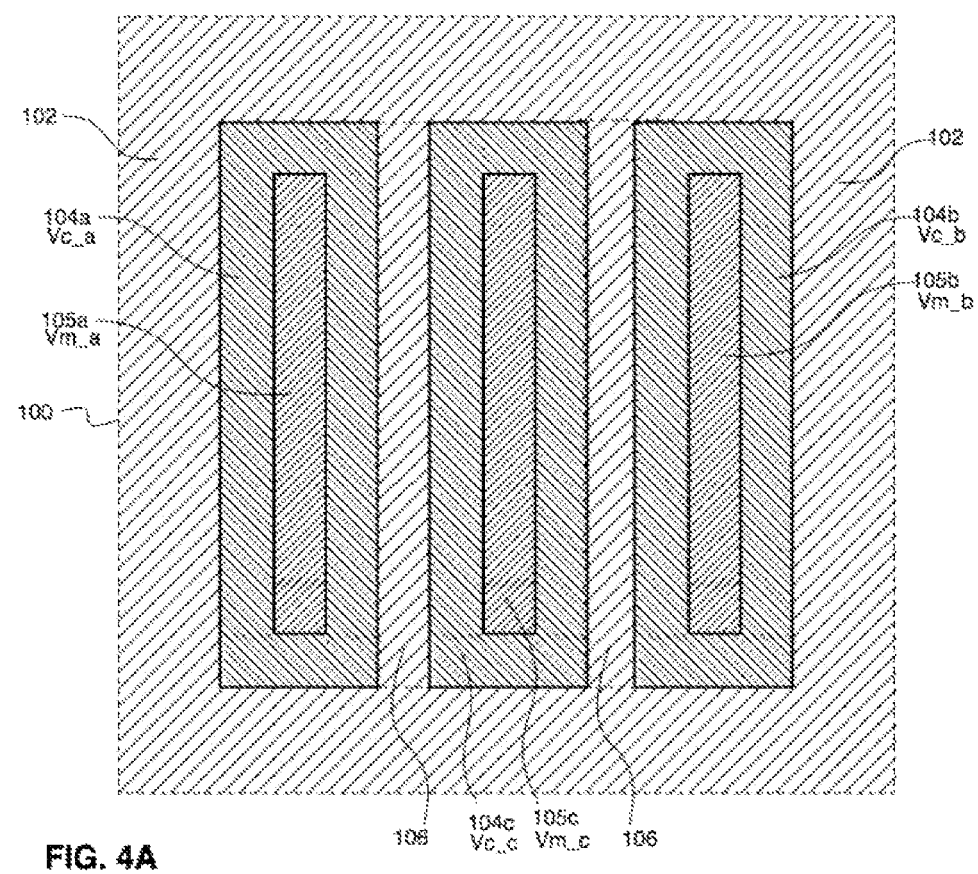
FIG. 4A shows a pixel element, according to a third embodiment of the present disclosure.

FIG. 4A shows a top view of the pixel element 100, according to a third embodiment of the present disclosure. In FIG. 4A, the pixel element 100 comprises three primary charge-collection nodes 104a, 104b and 104c arranged in a side-by-side manner.

Figure 4B:
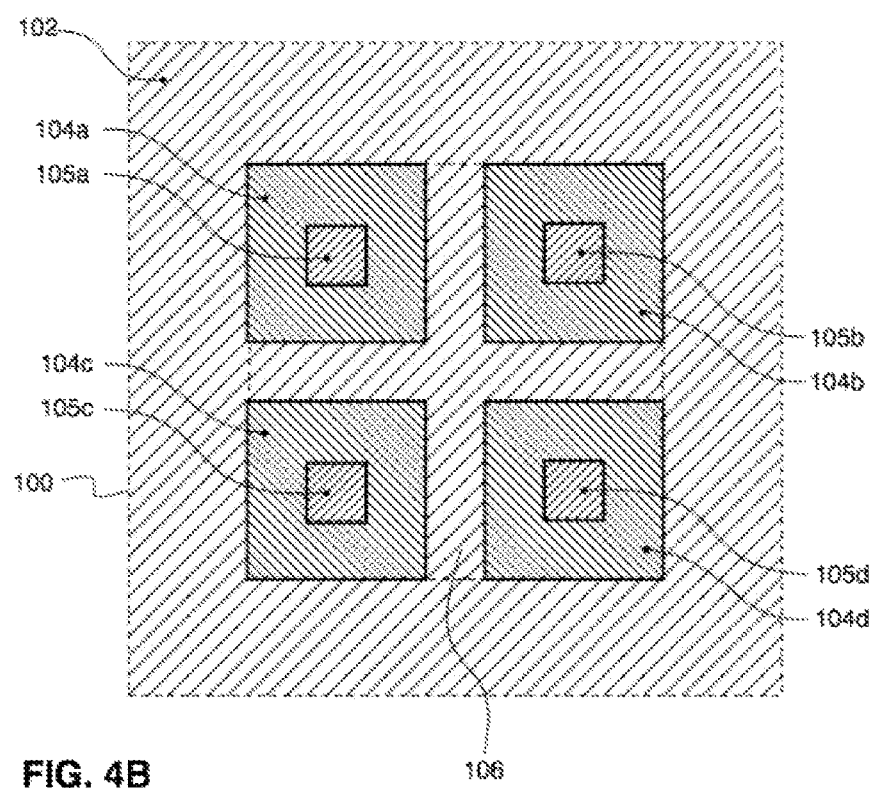

FIG. 4B shows a top view of the pixel element 100, according to a fourth embodiment of the present disclosure.

In FIG. 4A, the pixel element 100 comprises four primary charge-collection nodes 104a, 104b, 104c and 104d arranged in a two-by-two array.

Figure 4C:
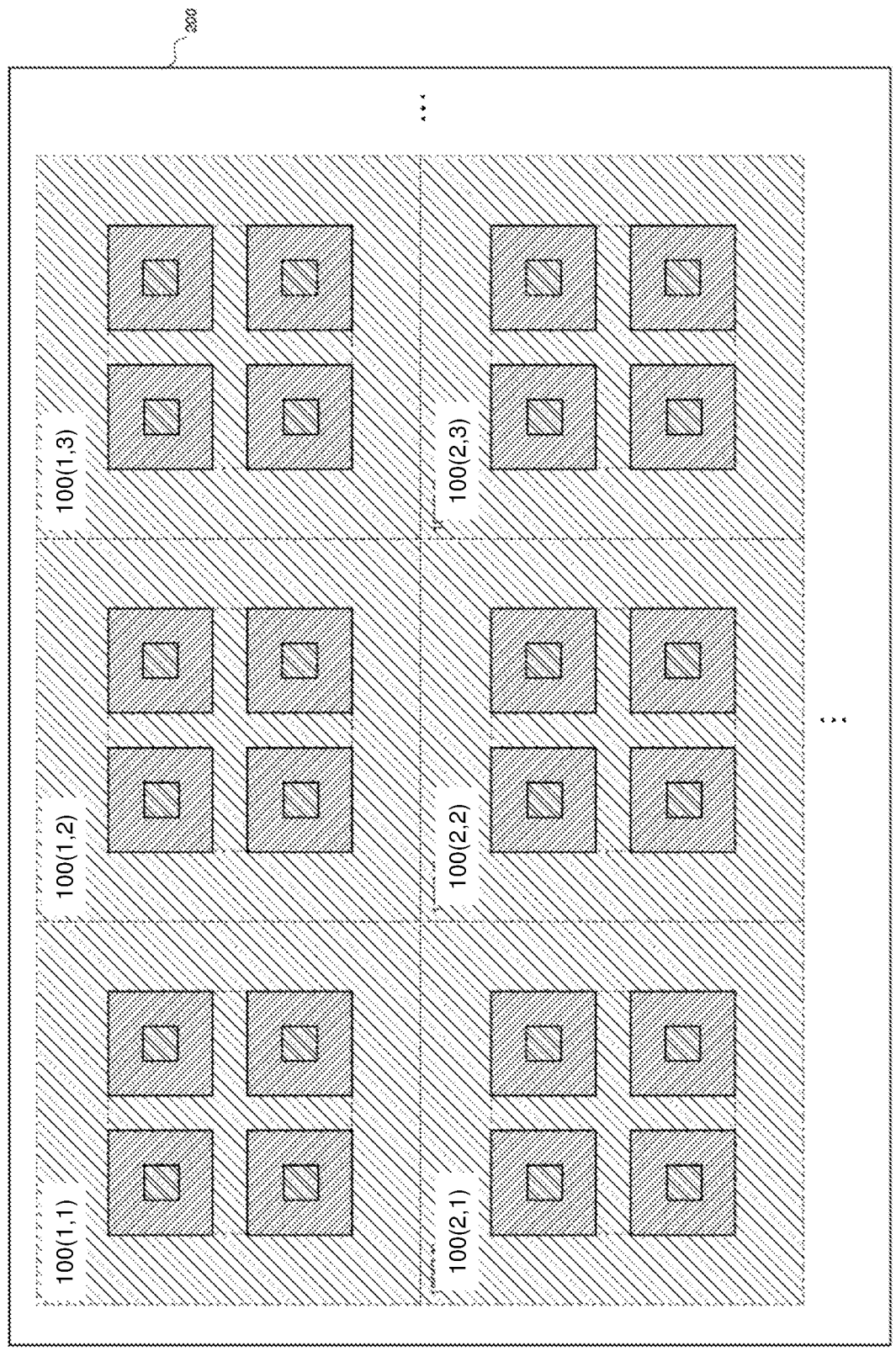
FIG. 4C shows an image sensor made from such pixel elements, according to a fourth embodiment of the present disclosure.

With reference to FIG. 4C, the image sensor 200 comprises a matrix of pixel elements 100 of FIG. 4B and a controller (not shown). Individual pixel elements of the matrix are connected to the controller, via electrical connections.

Optionally, the primary charge-collection nodes and/or modulating nodes are connected to form different groups. As an example, in FIG. 4B, the primary charge-collection nodes 104a and 104c could be connected together, while the primary charge-collection nodes 104b and 104d could be connected together. In such a case, modulating nodes of such connected primary charge-collection nodes could be controlled together to form a group.

Figure 5A:
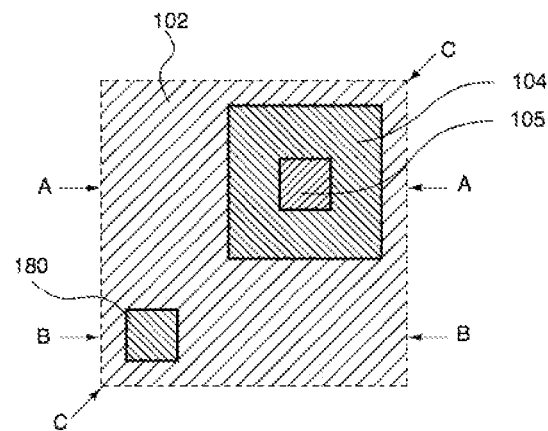
Figure 5B:
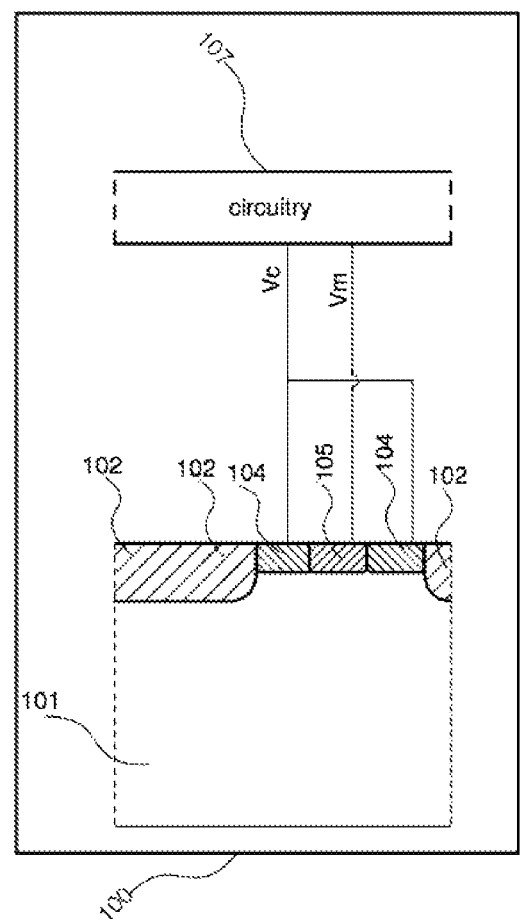
Figure 5C:
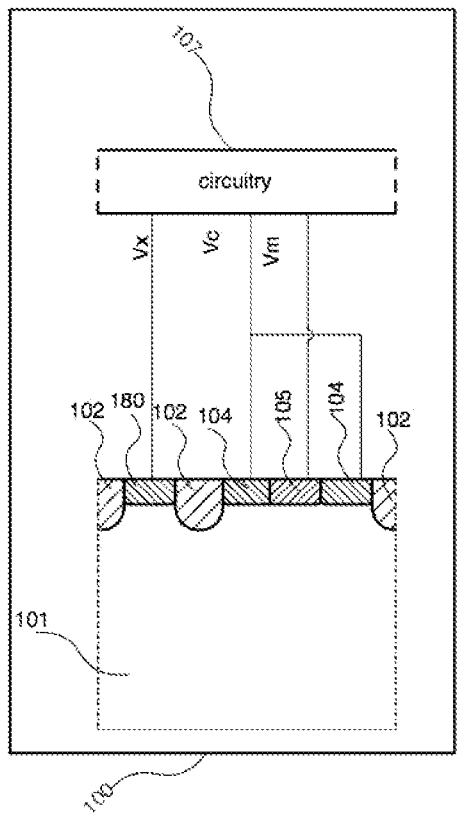
Figure 5D:
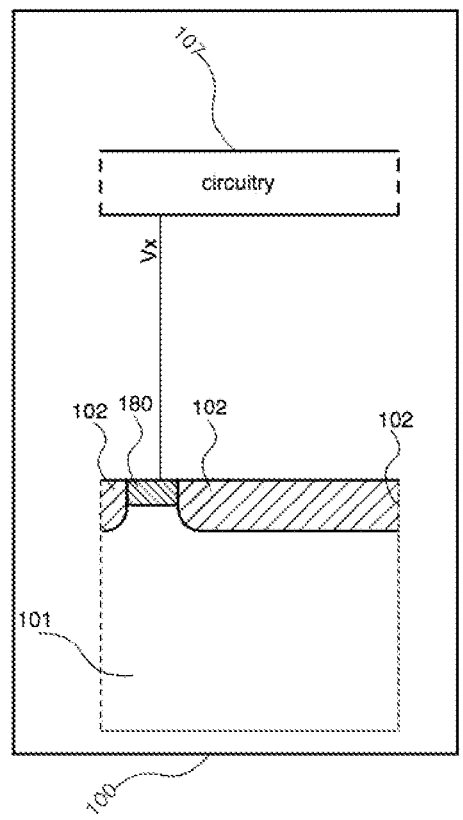

FIG. 5A shows a top view of the pixel element 100, FIGS. 5B, 5C and 5D show section views of the pixel element 100 for cutting planes A-A, C-C and B-B, respectively, according to a fifth embodiment of the present disclosure.

With reference to FIGS. 5A-D, the pixel element 100 comprises a semiconductor substrate 101 of a first or second conductivity type, a first primary charge-collection node 104, a first modulating node 105, a secondary charge-collection node 180, a peripheral node 102 and a circuitry 107. The secondary charge-collection node 180 does not have a corresponding modulating node (i.e., it does not surround any modulating node). The secondary charge-collection node 180 is made of a first conductivity-type semiconductor material.

In FIGS. 5B-D, Vc represents a voltage at the first primary charge collection node 104, Vm represents a modulating voltage at the first modulating node 105, and Vx represents a voltage at the secondary charge-collection node 180. The modulating voltage Vm on the first modulating node 105 alters the electric field distribution in a vicinity of the first primary charge-collection node 104, thereby modulating the quantum efficiency of the first primary charge-collection node 104. Likewise, the quantum efficiency of the secondary charge-collection node 180 can be altered with the voltage Vx. The secondary charge-collection node 180 is useful in attaining, for example, the global shutter functionality and an improvement in a resolution of a captured image, as will be described later in the present disclosure.

Figure 6:
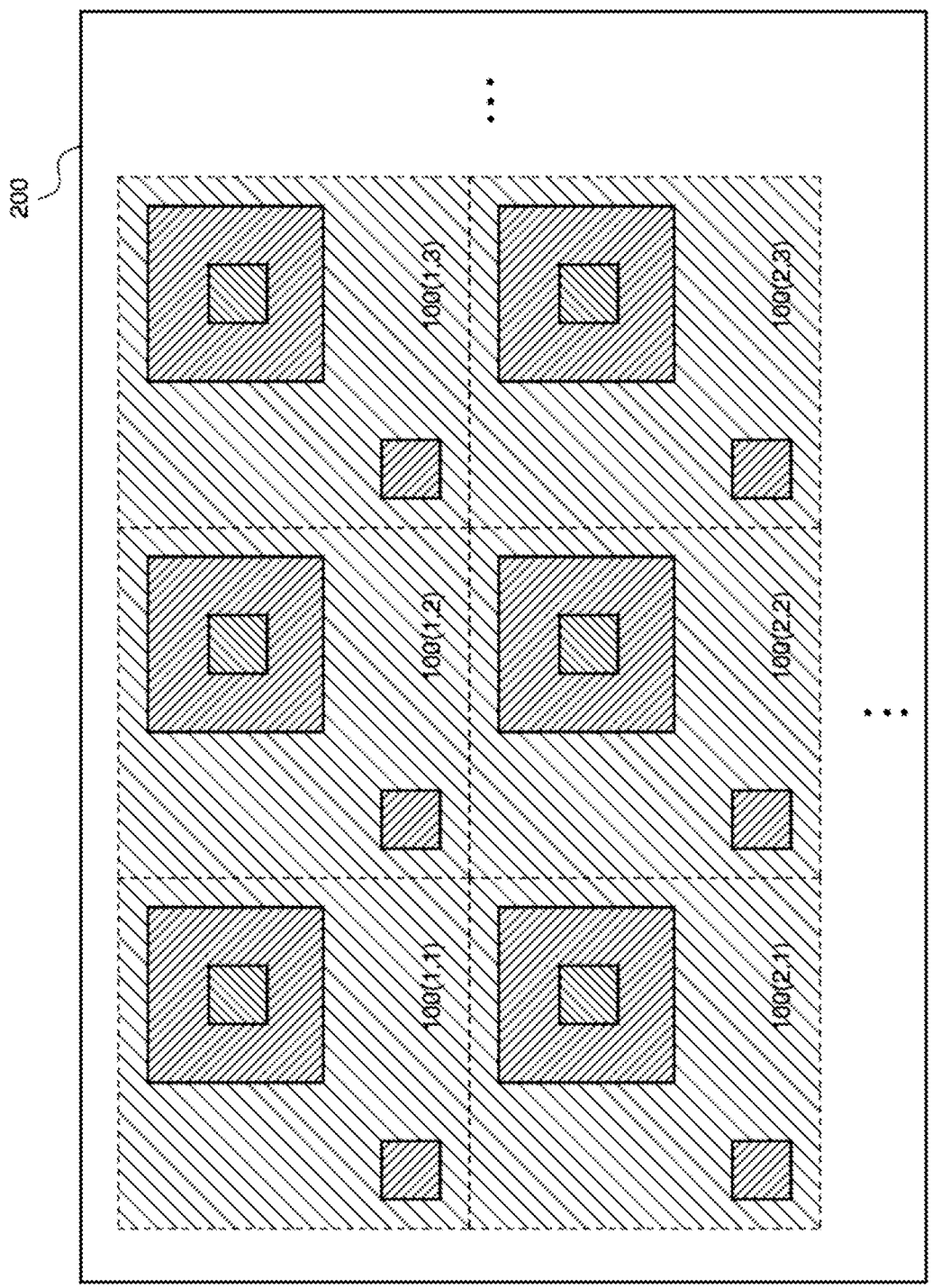
FIG. 6 shows an image sensor made from such pixel elements, according to a fifth embodiment of the present disclosure.

With reference to FIG. 6, the image sensor 200 comprises a matrix of pixel elements 100 of FIGS. 5A-D and a controller (not shown). Individual pixel elements of the matrix are connected to the controller, via electrical connections.

FIG. 6 is an exemplary illustration of how primary and secondary charge-collection nodes 104 and 180 can be located with respect to each other in one embodiment. It will be appreciated that there can be multiple primary charge-collection nodes and/or secondary charge-collection nodes arranged and placed in various possible ways in a pixel element.

Figure 7A:
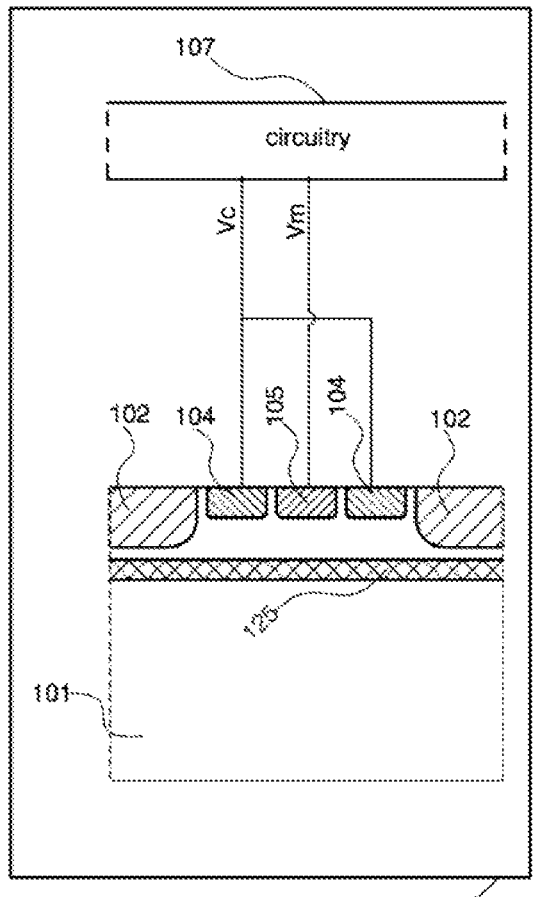
FIGS. 7A-H 7J-N and 7P-R show a pixel element, according to various embodiments of the present disclosure.

FIG. 7A shows a section view of the pixel element 100, according to a sixth embodiment of the present disclosure. The pixel element 100 comprises a semiconductor substrate 101 of a first or second conductivity type, a first primary charge-collection node 104, a first modulating node 105, a peripheral node 102, a circuitry 107 and a tuning implantation 125. The tuning implantation 125 is implanted into the semiconductor substrate 101. It will be appreciated that there can be multiple layers of such tuning implantations, and they can be made of either a first conductivity-type semiconductor material or a second conductivity-type semiconductor material.

The purpose of a tuning implantation is to help the charge collection for a larger volume, and, for example, to help in collection of the charge from a particular depth in the semiconductor substrate. This is potentially useful, for example, in making a primary or secondary charge-collection node sensitive to a particular wavelength, and less sensitive to other(s).

Figure 7B:
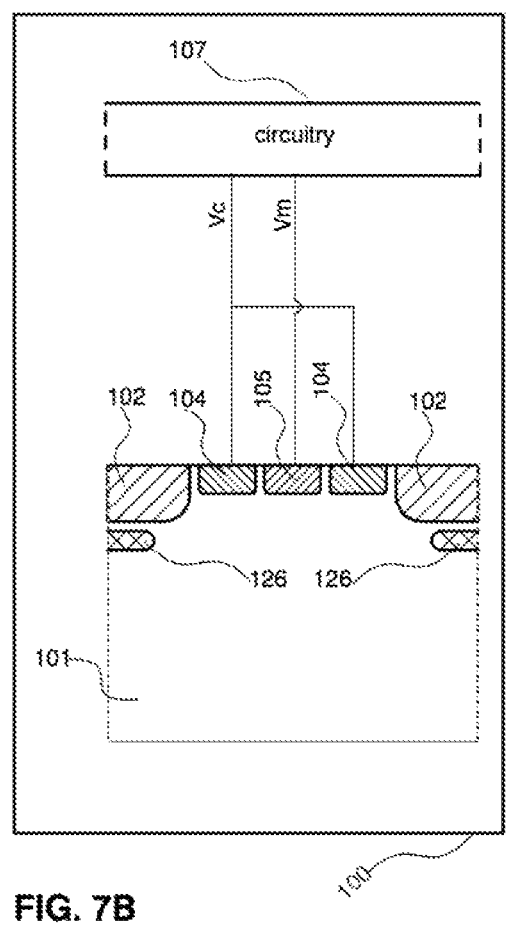

FIG. 7B shows the pixel element 100 with a structured tuning implantation 126.

FIGS. 7A and 7B also highlight that there can be a gap between the peripheral node 102, the primary charge-collection node 104 and the modulating node 105; said gap may be required, for example, due to reasons of semiconductor fabrication or electrical isolation.

Figure 7C:
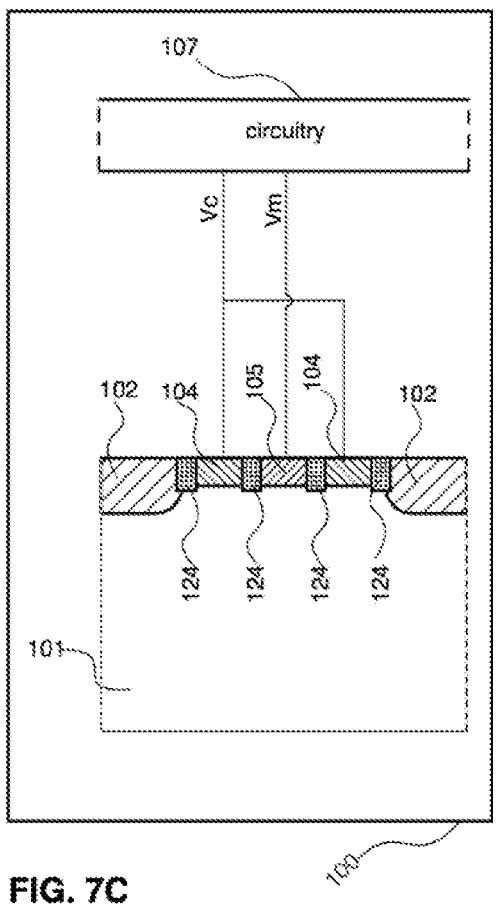

FIG. 7C shows a section view of the pixel element 100, according to a seventh embodiment of the present disclosure. In FIG. 7C, the pixel element 100 comprises a Shallow Trench Isolation (STI) 124 that is used between implantations. The use of such STI may be required, for example, due to reasons of semiconductor fabrication or electrical isolation, and in order to minimize parasitic capacitance between different nodes of the pixel element.

Figure 7D:
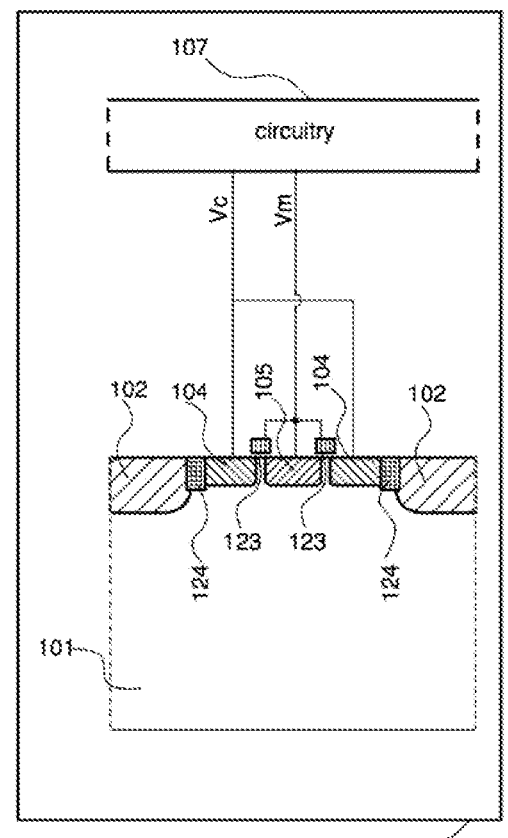

FIG. 7D shows a section view of the pixel element 100, according to an eighth embodiment of the present disclosure. In this implementation, gates 123 (for example, such as polysilicon gates) are used between the primary charge-collection node 104 and the modulating node 105 to reduce leakage currents therebetween. The gates 123 induce a field effect that lowers the conductance between the charge-collection node 104 and the modulating node 105.

The gates 123 are connected to the modulating node 105 (which is at the modulating voltage Vm). However, the gates 123 could also be controlled by dedicated voltage sources or other voltage nodes in the circuitry 107 or a peripheral circuitry (for example, such as the controller 202).

Also shown in FIG. 7D is an optional STI 124 that may be used at the boundaries of the semiconductor materials to improve electrical isolation and to reduce, for example to minimize, parasitic capacitance. It will be appreciated that a gate with a controlled voltage can be used in place of an STI between any implants or nodes.

Optionally, the image sensor 200 is fabricated as a single chip, wherein the charge-collection nodes 104 and/or 180, the circuitry 107 and the controller 202 are all located on the same semiconductor substrate 101.

Alternatively, optionally, different parts of the image sensor 200 are divided into different semiconductor substrates (chips) that are electrically connected to each other, wherein said semiconductor substrates can be made of silicon or other semiconductor materials. It will be appreciated that while the image sensor 200 is readily applicable in silicon-based realizations, any other semiconductor material, for example, such as compound semiconductors like GaAs, InP, and Germanium-based semiconductors can also be used.

A part or an entirety of the circuitry 107 and/or the controller 202 can reside on separate substrates, wherein chip-to-chip connections within the circuitry 107 and to the charge-collection nodes 104 and/or 180, the modulating nodes 105 and peripheral node 102 may be needed. In this case, the charge-collection nodes 104 and/or 180, the modulating nodes 105, the peripheral node 102 and possibly a part of the circuitry 107 along with the controller 202 are located in a chip denoted as a collection chip, while some or all of the circuitry 107 is located in another chip denoted as a readout chip or multiple other chips. Said readout chip may also be called a readout integrated circuit. A benefit of using a separate collection chip and readout chip(s) is that optimal technology can be used for both the collection chip and the readout chip(s).

Furthermore, while the circuitry 107 may comprise resources (for example, such as transistors, capacitors and the like) that are associated with a particular charge-collection node, it will be appreciated that some resources of the circuitry 107 may be shared with other charge-collection nodes within a given pixel element. Additionally, some resources of the circuitry 107 of a given pixel element may be shared with other pixel elements. Such sharing of resources is not shown in the figures, for the sake of simplicity only.

Figure 7E:
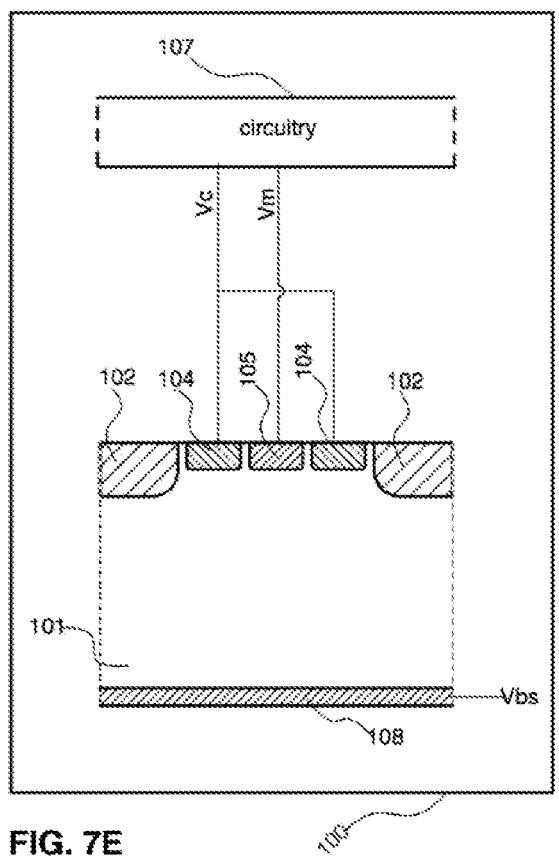

FIG. 7E shows a section view of the pixel element 100, according to a ninth embodiment of the present disclosure. The pixel element 100 further comprises a backside conductive layer 108.

The backside conductive layer 108 is arranged on the backside of the semiconductor substrate 101. The backside conductive layer 108 is configured to collect and conduct the second conductivity-type mobile charges.

The backside conductive layer 108 is configured to be electrically connected to a bias voltage (Vbs). This helps to fully deplete the semiconductor substrate 101 within the pixel element 100, and facilitates attainment of a better quantum efficiency and modulation contrast.

Figure 7F:
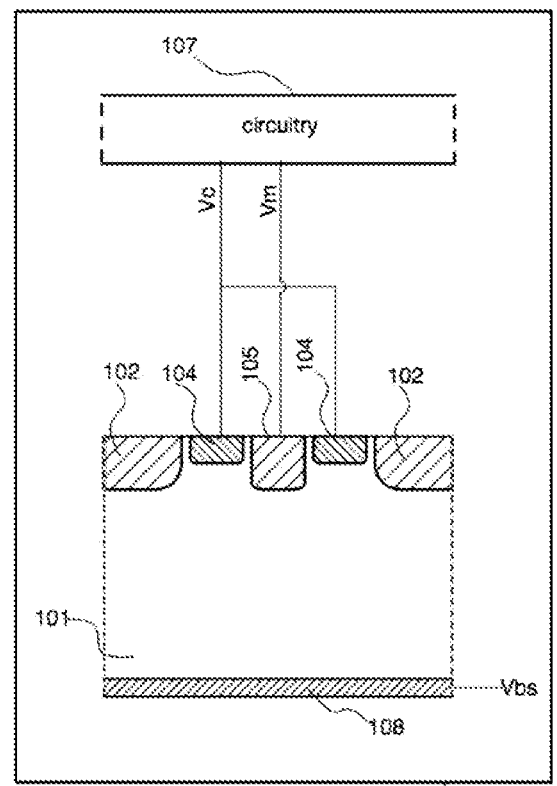

FIG. 7F shows a section view of the pixel element 100, according to a tenth embodiment of the present disclosure. In FIG. 7F, the modulating node 105 extends deeper into the semiconductor substrate 101. In principle, it is possible to fabricate components (for example, such as transistors) into the modulating node 105, if the volume of the modulating node 105 is large enough.

Notably, widths, depths and doping concentrations/profiles of the charge collecting nodes 104 and 108, the modulating nodes 105 and the peripheral node 102 affect the efficiency of the quantum efficiency modulation.

Figure 7G:
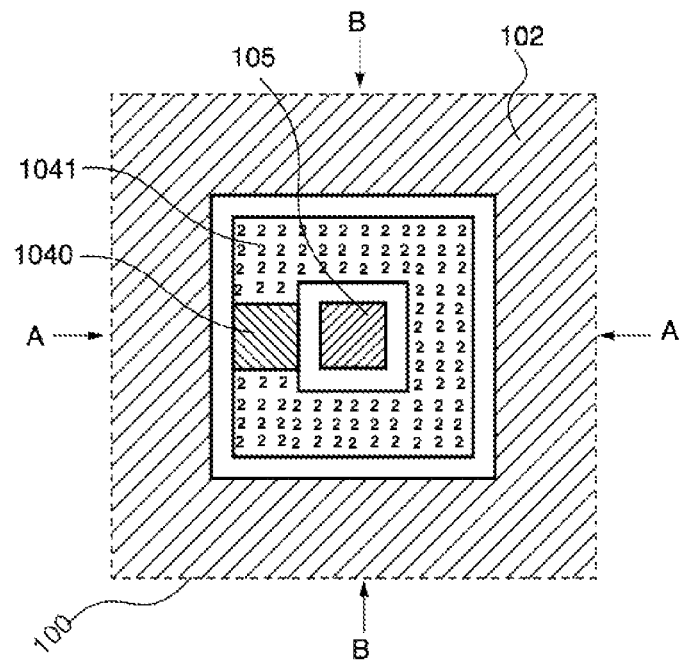
Figure 7H:
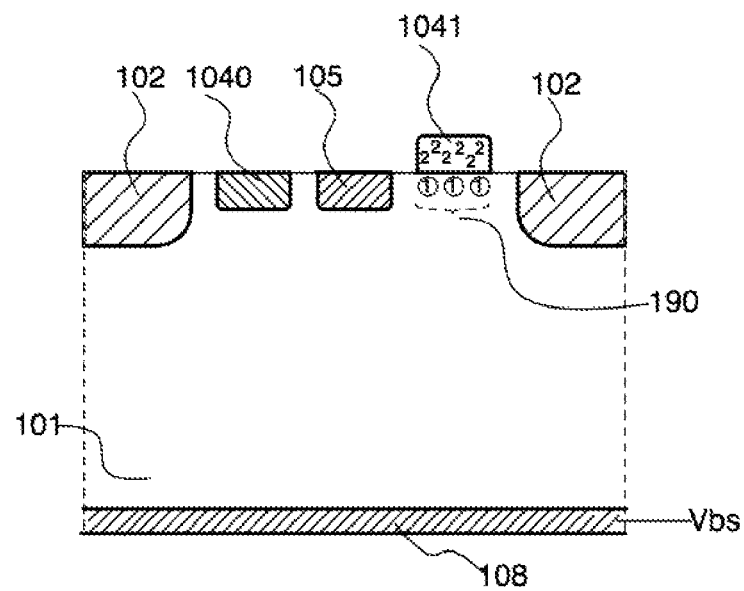
Figure 7J:
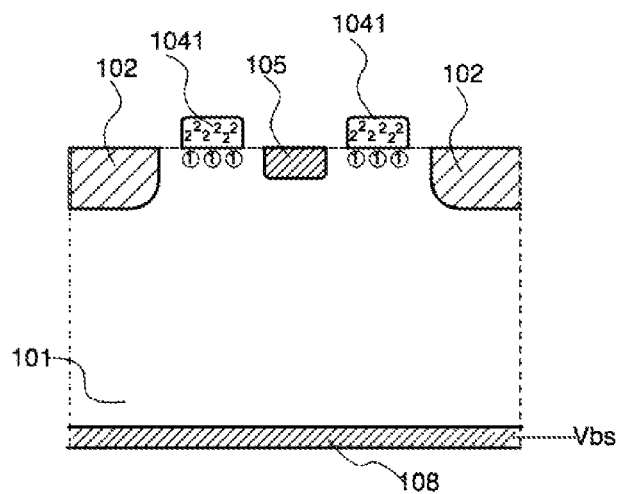

FIG. 7G shows a top view of the pixel element 100, FIGS. 7H and 7J show section views of the pixel element 100 for cutting planes A-A and B-B, respectively, according to an eleventh embodiment of the present disclosure. In this embodiment, the primary charge-collection node 104 has a gap in its ring form.

Instead of having the primary charge-collection node 104 made solely of a first conductivity-type semiconductor material, the primary charge-collection node 104 comprises a region 1040 of a first conductivity-type semiconductor material and a region 1041 of an insulator material that is charged with second conductivity-type charges.

FIGS. 7H and 7J highlight that a layer of mobile first conductivity-type charge carriers 190 is formed inside the semiconductor material at the semiconductor-insulator interface.

Figure 7K:
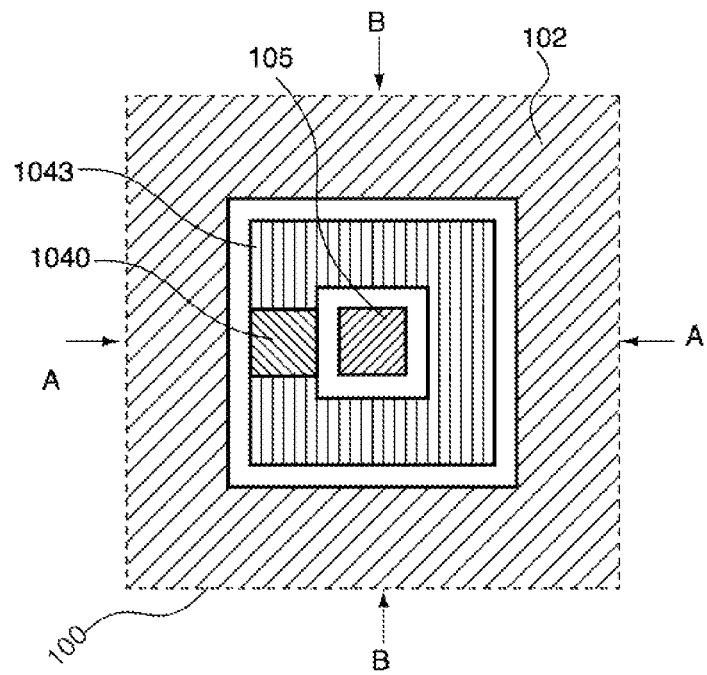
Figure 7L:
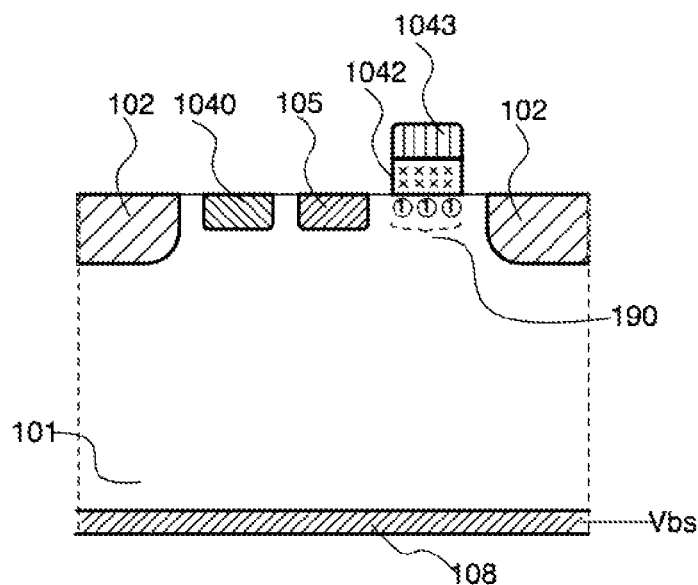
Figure 7M:
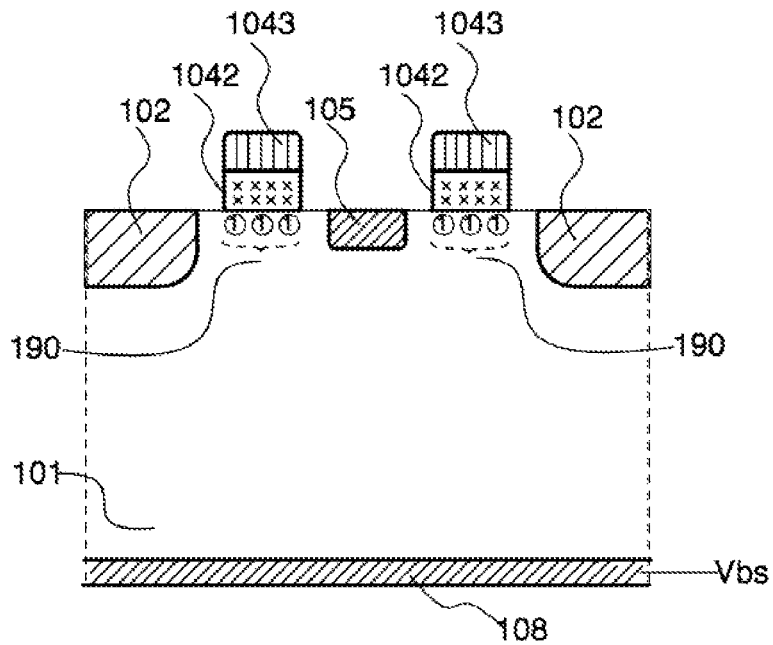

FIG. 7K shows a top view of the pixel element 100, FIGS. 7L and 7M show section views of the pixel element 100 for cutting planes A-A and B-B, respectively, according to a twelfth embodiment of the present disclosure. The primary charge-collection node 104 comprises a region 1040 of a first conductivity-type semiconductor material, a region 1042 of an insulator material, and a region 1043 of a conductor material, wherein the region 1043 is formed over the region 1042. The region 1043 can be connected to the region 1040, or be controlled independently.

FIGS. 7L and 7M highlight that the conductor-insulator-semiconductor stack forms a gate structure, where a voltage at the conductor 1043 can be arranged to a voltage level that results in the formation of a layer of mobile first conductivity-type charge carriers 190 underneath the gate structure.

Figure 7N:
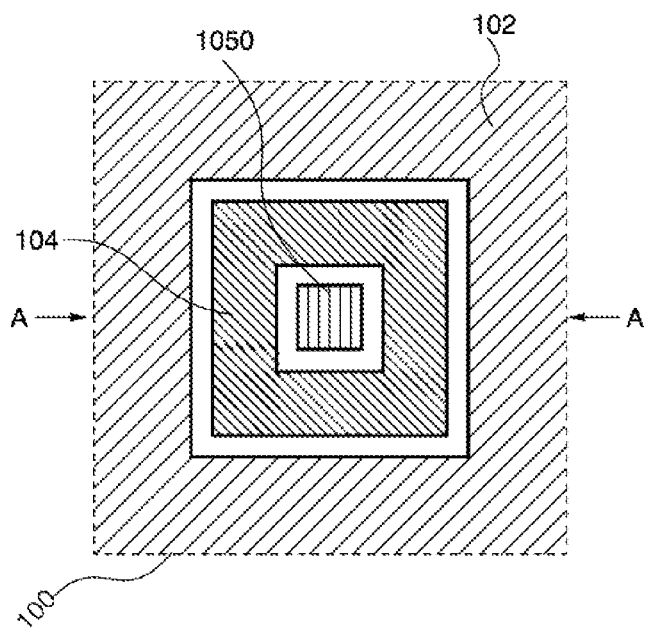
Figure 7P:
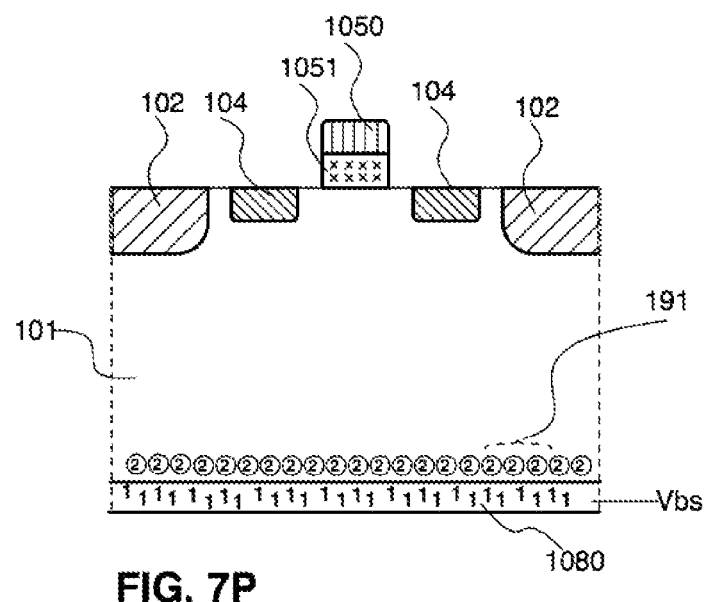

FIG. 7N shows a top view of the pixel element 100, FIG. 7P shows a section view of the pixel element 100 for a cutting planes A-A, according to a thirteenth embodiment of the present disclosure. The modulating node comprises a region 1050 of a conductor material and a region 1051 of an insulator material, wherein the region 1050 is formed over the region 1051.

FIG. 7P highlights that a stack of conductor insulator-semiconductor forms a gate that can induce a layer of mobile charge carriers in the semiconductor beneath the insulator of the region 1051, when a suitable voltage is applied to the conductor of the region 1050. Controlling the voltage of the region 1050 has a similar effect as controlling a modulation node that is formed by a second conductivity-type semiconductor.

FIG. 7P also shows an alternative embodiment for the backside conductive layer, which is shown as a layer 191 of mobile second conductivity-type charge carriers formed inside the semiconductor material at a semiconductor-insulator interface between the semiconductor substrate 101 and an insulator layer 1080. The insulator layer 1080 is made of an insulator material that comprises first conductivity-type charges.

Figure 7Q:
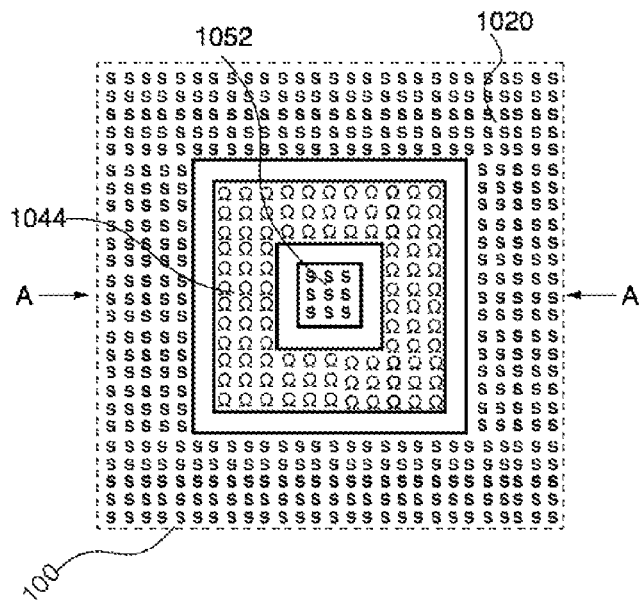
Figure 7R:
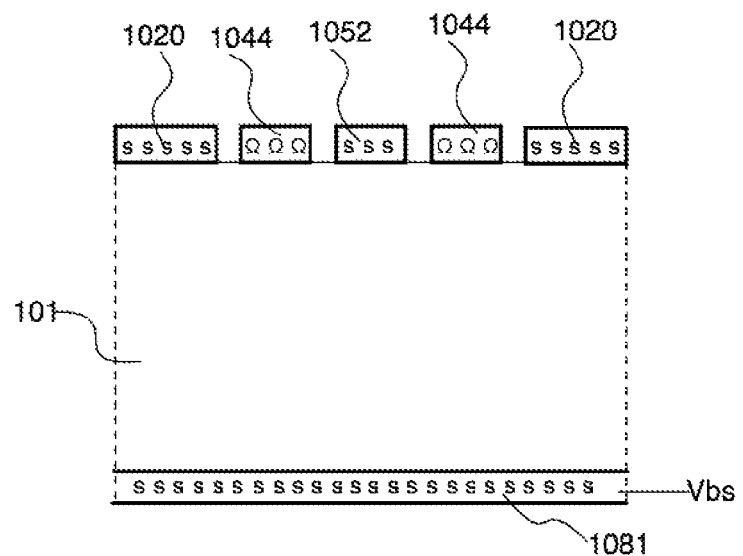

FIG. 7Q shows a top view of the pixel element 100, FIG. 7R shows a section view of the pixel element 100 for a cutting planes A-A, according to a fourteenth embodiment of the present disclosure. The peripheral node is denoted by 1020, and is made of a conductor forming a Schottky diode with the underlying semiconductor material, wherein the Schottky diode comprises a Schottky barrier for mobile first conductivity-type charge carriers. The primary charge-collection node is denoted by 1044, and is made of a conductor forming an Ohmic contact with the underlying semiconductor material for mobile first conductivity-type charge carriers. The modulating node is denoted by 1052, and is made of a conductor material forming a Schottky diode with the underlying semiconductor material, wherein the Schottky diode comprises a Schottky barrier for first conductivity-type charge carriers.

FIG. 7R also shows an alternative embodiment for the backside conductive layer, which is shown as a layer 1081 of a conductor material forming a Schottky diode with the semiconductor substrate 101, wherein the Schottky diode comprises a Schottky barrier for mobile first conductivity-type charge carriers.

It will be appreciated that various implementation techniques illustrated in conjunction with FIGS. 7A to 7R are optional and merely examples; any combination of said techniques may or may not be used in various embodiments of the present disclosure.

FIGS. 8A-F are some example schematic illustrations of how the quantum efficiency of pixel elements can be modulated to change their charge-collection volumes, pursuant to embodiments of the present disclosure. FIGS. 8A-F show section views of a portion of a matrix of pixel elements, in accordance with an embodiment of the present disclosure.

Assume the matrix of pixel elements with i=[1,M] rows and j=[1,N] columns, wherein M and N are positive integers 3 and 6, respectively. A particular pixel element within the matrix is identified with 100(i,j).

Figure 8A:
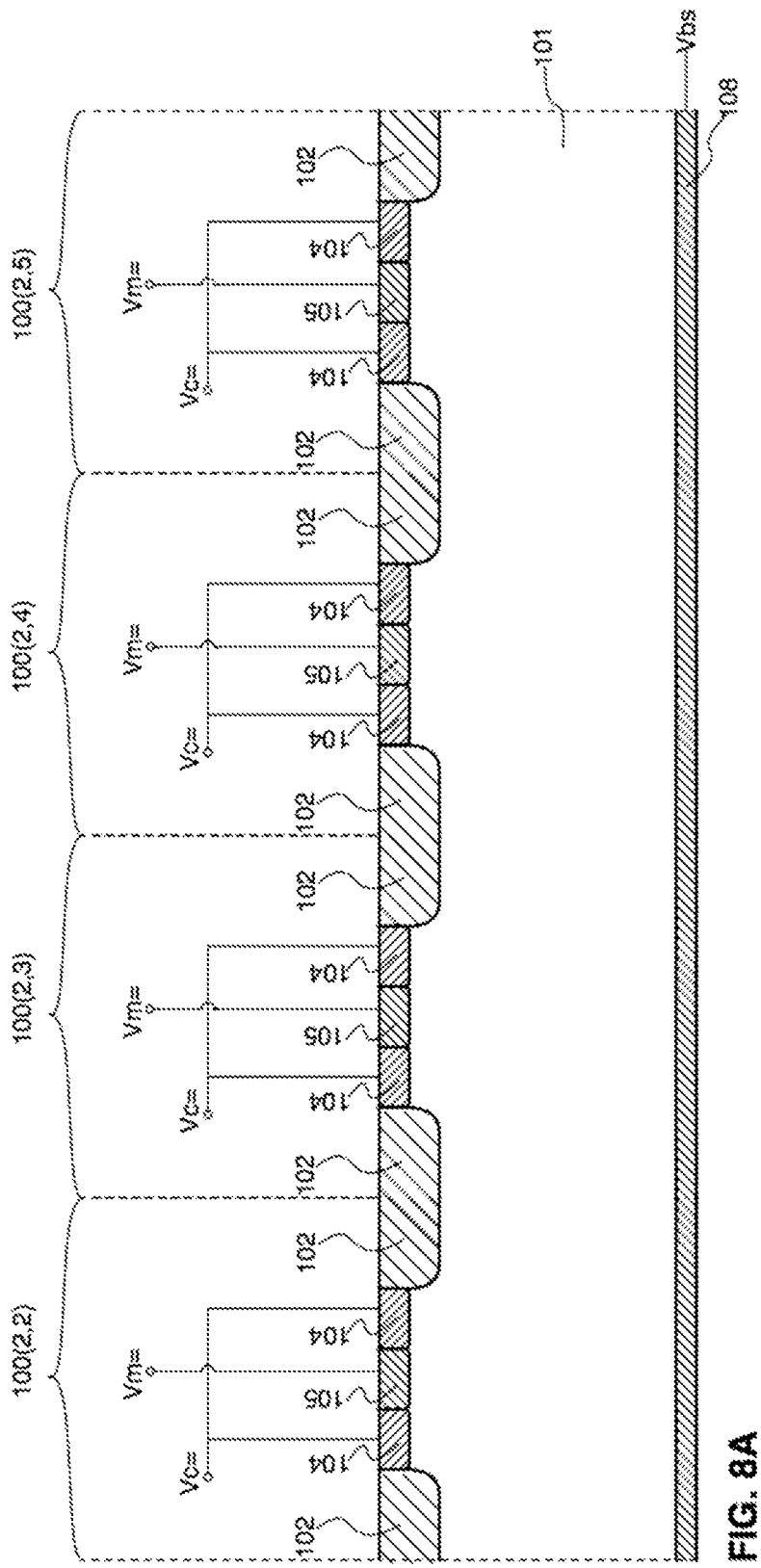
FIGS. 8A-F are example illustrations of how the quantum efficiency of pixel elements can be modulated to change their charge-collection volumes, pursuant to embodiments of the present disclosure.

FIG. 8A shows a section view of a portion of a second row of the matrix, wherein said portion comprises pixel elements 100(2,2), 100(2,3), 100(2,4) and 100(2,5) of the matrix. Therefore, all pixel elements shown in FIG. 8A are surrounded by their neighbouring pixel elements within the matrix, and therefore, have a well-defined neighbourhood. Furthermore, assume there is a high enough reverse bias between the backside conductive layer 108 and the primary charge-collection nodes 104 of the pixel elements to essentially fully deplete the semiconductor substrate 101 within the whole pixel element volume. It will be appreciated that the semiconductor substrate 101 being essentially fully depleted is not necessarily required for an image sensor to work, but the illustration in FIGS. 8A-F assumes said condition.

Next, for illustration purposes only, there will now be considered an illustrative example of the relative magnitudes of the voltages. In the illustrative examples, the first conductivity-type semiconductor material is set to the n-type semiconductor (namely, donor impurities added to a semiconductor); said setting of the first conductivity-type semiconductor material allows use of both magnitudes of potential differences and signs of potential differences for purposes of illustration. The voltage of the peripheral node 102 is denoted as the ground potential (namely, zero volts) with respect to which other voltages are referred to. Exemplary voltages could be such that the backside conductive layer 108 is at −15V, the peripheral node 102 is at 0 V, the voltage on the charge-collection nodes 104 are allowed to be in a range between 5 V and 3 V.

In FIGS. 8A-F, Vc=Vr; Vr is the reset voltage and in this example, is 5 V; the charge-collection nodes 104 are at the voltage Vc at the start of the integration. In this case, a potential difference between Vc and Vbs is between 18 V and 20 V; such a potential difference between the charge-collection nodes 104 and the backside conductive layer 108 is typically enough to essentially fully deplete a relatively thick-thinned high-resistivity substrate. The actual reverse bias voltage between the charge-collection nodes 104 (Vbs) that is large enough to essentially fully deplete the semiconductor substrate 101 depends on the substrate material, a substrate doping level and a thickness of the semiconductor substrate 101. Said reverse bias voltage can be found out, for example, by physical simulations. The modulating voltages Vm of the modulating nodes 105 should be below the voltages of the primary charge-collection nodes 104, in order to avoid forward biasing the p-n junctions between the primary charge-collection nodes 104 and the modulating nodes 105. In this illustrative example, the modulating voltages Vm corresponding to the high quantum-efficiency state and the low quantum-efficiency state could be in an order of Vhq=2.5 V and Vlq=0 V, respectively.

The example implementation uses also intermediate modulating voltages, which could in the illustrative example be a voltage Vint_H=1.25V that yields the intermediate high quantum-efficiency state and a voltage Vint_L=0.75V that yields the intermediate low quantum-efficiency state, respectively.

Figure 8B:
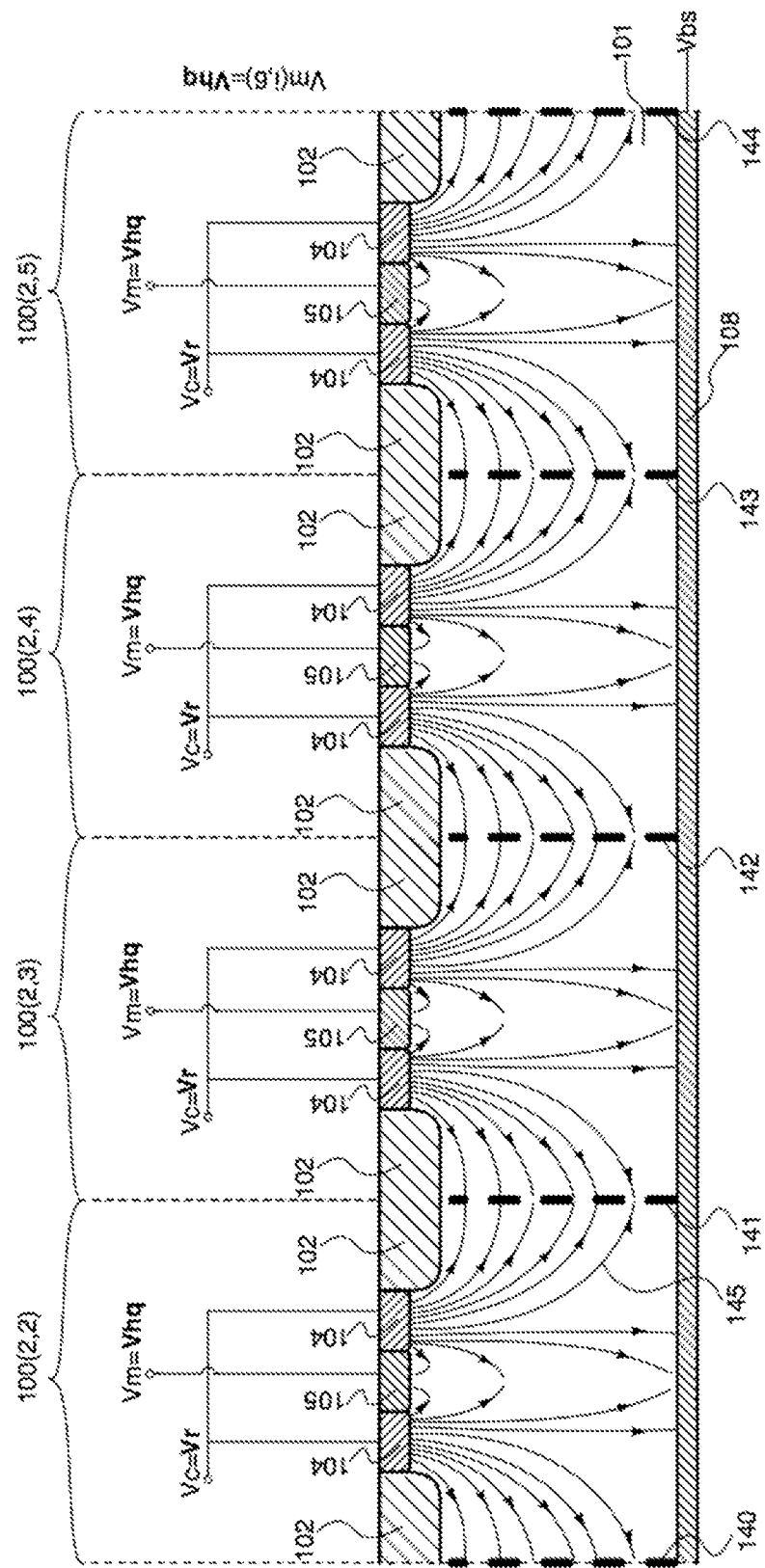

FIG. 8B shows a first example case, where all the pixel elements in the matrix have a Vhq in their modulating nodes 105; in other words, the pixel elements are in the high quantum-efficiency state. The arrows 145 show electric field lines in the semiconductor substrate 101. The primary charge-collection node 104 of the pixel element 100(2,2) collects charge from a region depicted by the thick dashed lines 140 and 141; the primary charge-collection node 104 of the pixel element 100(2,3) collects charge from a region depicted by the thick dashed lines 141 and 142; the primary charge-collection node 104 of the pixel element 100(2,4) collects charge from a region depicted by the thick dashed lines 142 and 143; the primary charge-collection node 104 of the pixel element 100(2,5) collects charge from a region depicted by the thick dashed lines 143 and 144. The thick dashed lines 140, 141, 142 and 143 in FIG. 8B represent boundaries of charge collection volumes between adjacent pixels. It should be noted that in FIG. 8B while approaching a boundary of a charge collection volume the electric field component that is perpendicular to the boundary of charge collection volume reduces smoothly towards the boundary and reaches zero at the boundary. There is a vertical electric field in the charge collection volume boundary to either 102 or 108. It should be noted that in a more detailed figure there would also be illustrations of electric field lines running between the peripheral node 102 and the charge collection node, in a similar fashion as there are electric field lines between the modulating node 105 and the charge collection node. These are not drawn in the figure for clarity sake.

Figure 8C:
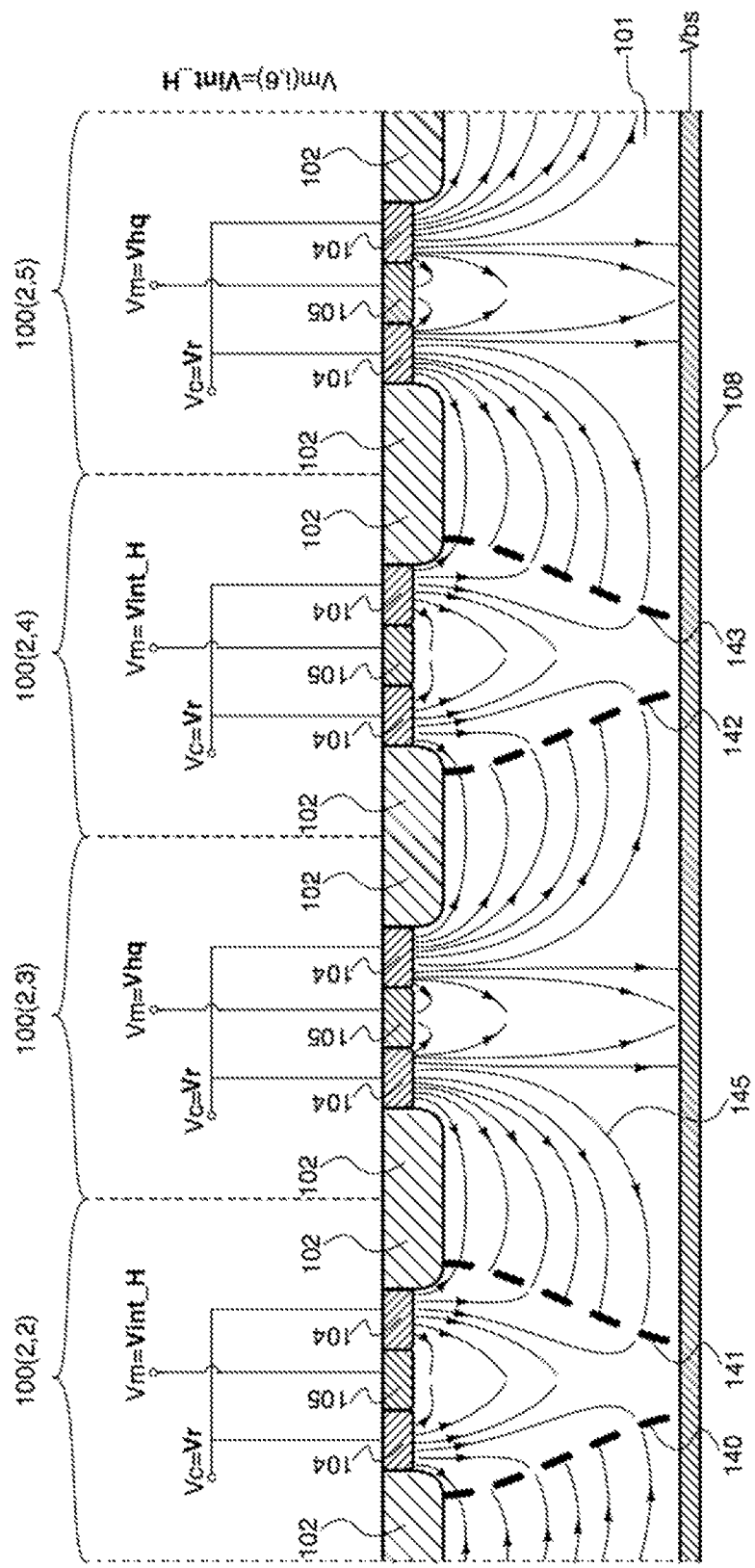

FIG. 8C shows a second example case, where odd columns of the pixel elements have Vhq in their modulating nodes 105 (namely, are in the high quantum-efficiency state) and even columns of the pixel elements have a Vint_H in their modulating nodes 105 (namely, are in the intermediate high quantum-efficiency state). The electric field lines (depicted by the arrows 145) have changed according to the changes in the modulating voltages; the thick dashed lines 140 and 141, as well as 142 and 143 have moved closer to each other and bent. It is to be noted here that the thick dashed line 144 has moved towards an adjacent pixel element 100(2,6) and is not shown in FIG. 8C. As a result of the changes in the modulating voltages, the primary charge-collection nodes 104 in the even columns collect photogenerated charge from a narrower charge-collection volume as compared to FIG. 8B. On the other hand, the primary charge-collection nodes 104 in the odd columns collect charge from a wider charge-collection volume as compared to FIG. 8B.

Figure 8D:
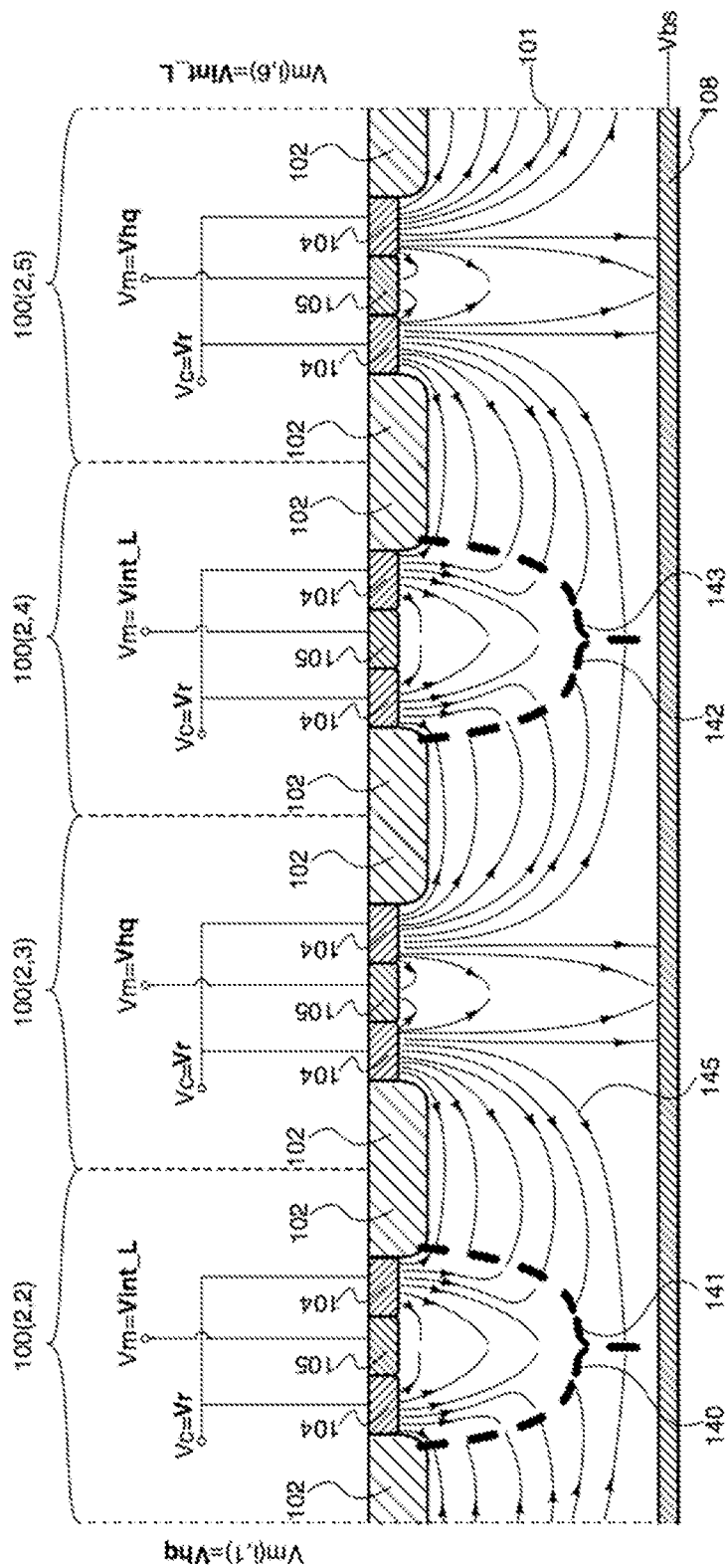

FIG. 8D shows a third example case, where the odd columns of the pixel elements have Vhq in their modulating nodes 105 (namely, are in the high quantum-efficiency state) and the even columns of the pixel elements have a Vint_L in their modulating nodes 105 (namely, are in the intermediate low quantum-efficiency state). The thick dashed lines 140 and 141, as well as 142 and 143 are closer to each other as compared to FIG. 8C. Said lines are on top of each other near the backside of the semiconductor substrate 101. As a result, the primary charge-collection nodes 104 in the even columns do not collect charge that is photogenerated in the vicinity of the backside. This effectively means that short wavelengths that are absorbed near the backside are not captured by the even columns of the pixel elements. Thus, spectrally-selective imaging is possible; in the example of FIG. 8D, the primary charge-collection nodes 104 in the even columns absorb light that has in effect been long-pass filtered by the pixel elements in the odd columns.

Figure 8E:
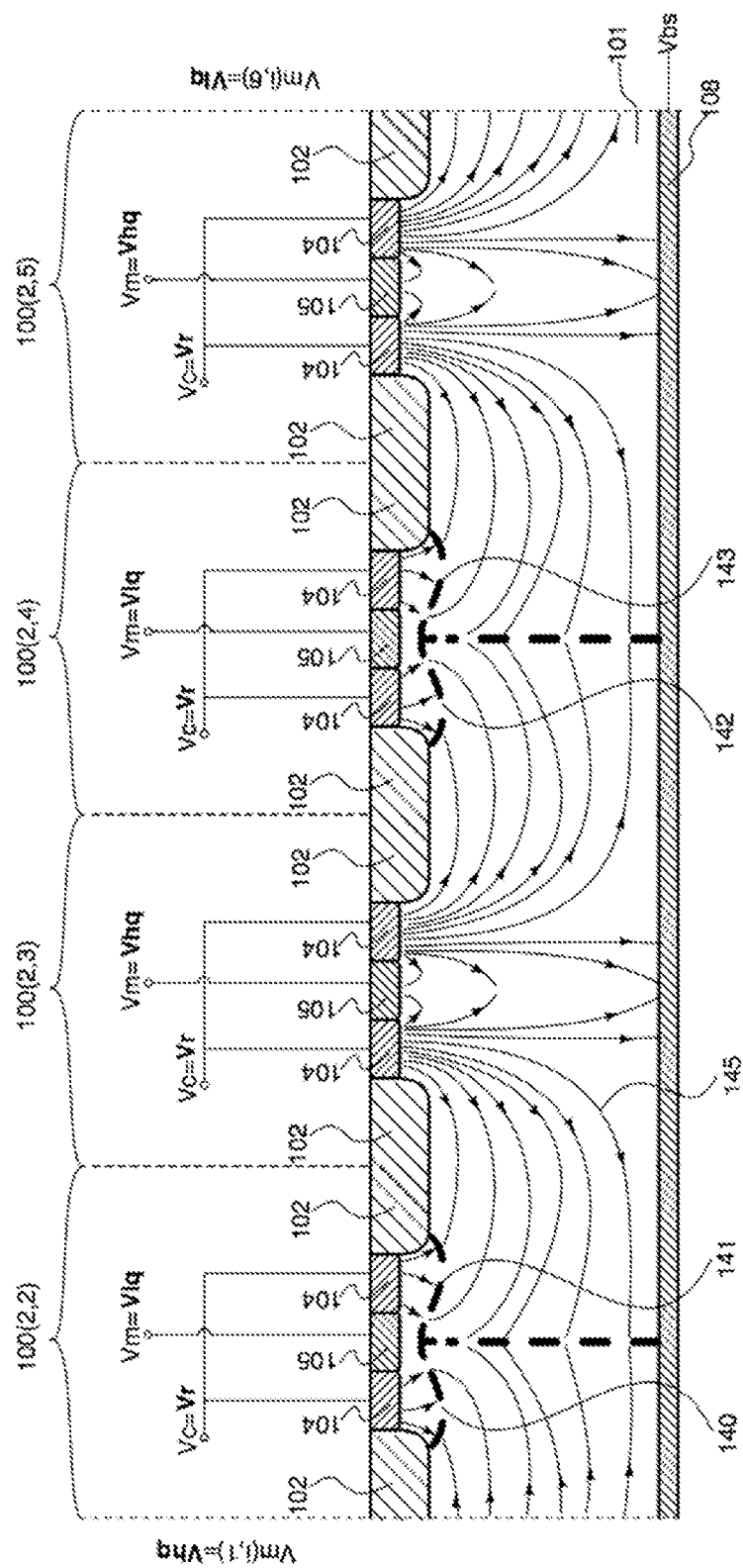

FIG. 8E shows a fourth example case, where the odd columns of the pixel elements have Vhq in their modulating nodes 105 (namely, are in the high quantum-efficiency state) and the even columns of the pixel elements have a Vlq in their modulating nodes 105 (namely, are in the low quantum-efficiency state). In this case, the pixel elements in the even columns collect charge only from the immediate vicinity of their primary charge-collection nodes 104 as indicated by the thick dashed lines 140, 141, 142 and 143.

Figure 8F:
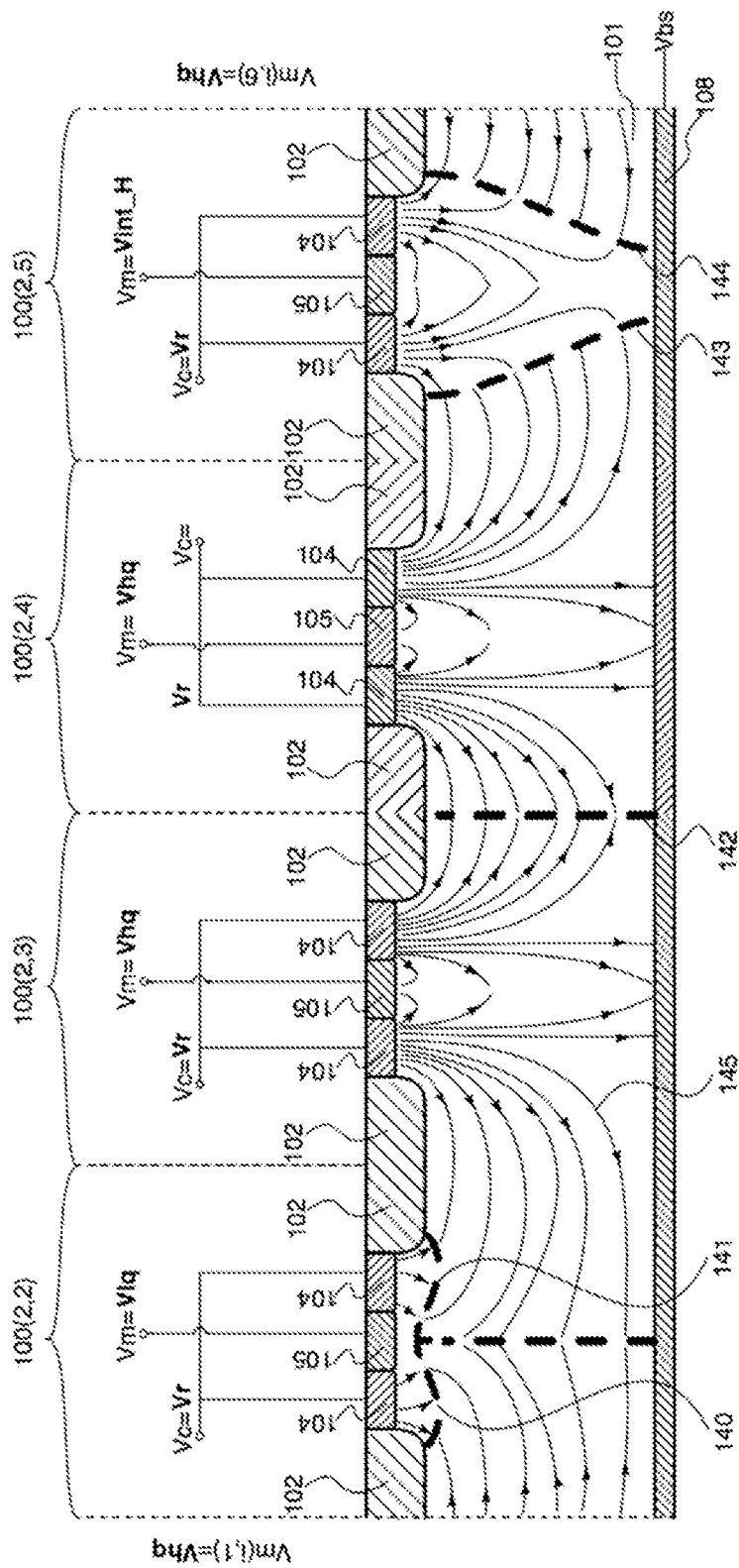

FIG. 8F shows a fifth example case, where:
the pixel elements 100($i$,1) have Vm=Vhq,
the pixel elements 100($i$,2) have Vm=Vlq, the pixel elements 100(*i*,3) have Vm=Vhq,
the pixel elements 100(*i*,4) have Vm=Vhq,
the pixel elements 100(*i*,5) have Vm=Vint_H, and
the pixel elements 100(*i*,6) have Vm=Vhq.

This example case illustrates that different combinations of modulating voltages are possible within the matrix of pixel elements. It will be appreciated that by modulating the quantum efficiency, it is possible to change the charge-collection volume from which a pixel element collects photogenerated charges. In effect, the pixel boundaries in terms of collecting photogenerated charges are not fixed rather they are flexible, i.e., programmable by modulating the quantum efficiency.

The exemplary illustrations in FIGS. 8A-F were drawn for an example embodiment in which each pixel element comprises a single primary charge-collection node. It will be appreciated that the quantum efficiency can be modulated in a similar manner in various other embodiments of the present disclosure. The principle described in FIGS. 8A-F can be extended to pixel elements with multiple primary and/or secondary charge-collection nodes, and to image sensors comprising matrices of a higher dimension. Moreover, in an example embodiment in which each pixel element comprises a secondary charge-collection node in addition to the primary charge-collection node, the voltage Vx of the secondary charge-collection node could be used to alter the quantum efficiency of the secondary charge-collection node.

Figure 21A:
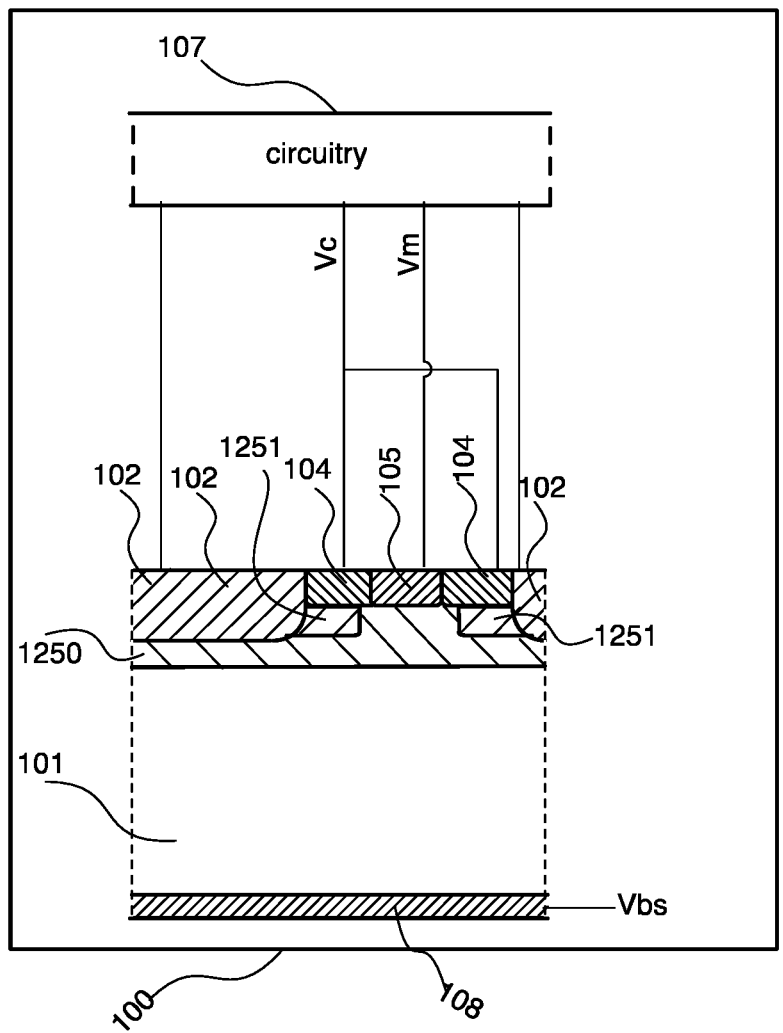
FIG. 21A-C are a schematic illustrations of using tuning implantations, in accordance with an embodiment of the present disclosure

FIG. 21A is an illustration of an another example of using tuning implantations. An implant 1251 is of second conductivity type semiconductor material, and an implant 1250 is of first conductivity type semiconductor material. The implants 1251 and 1250 might be lightly doped so that said implants are fully depleted when the sensor is operated. The implant 1251 aims to improve the modulation, while the implant 1250 helps steer mobile first conductivity type charges towards the charge collection node. These implants can also be used individually, for example only 1250 or only 1251, while their combination might result for improved modulation of quantum efficiency.

Figure 21B:
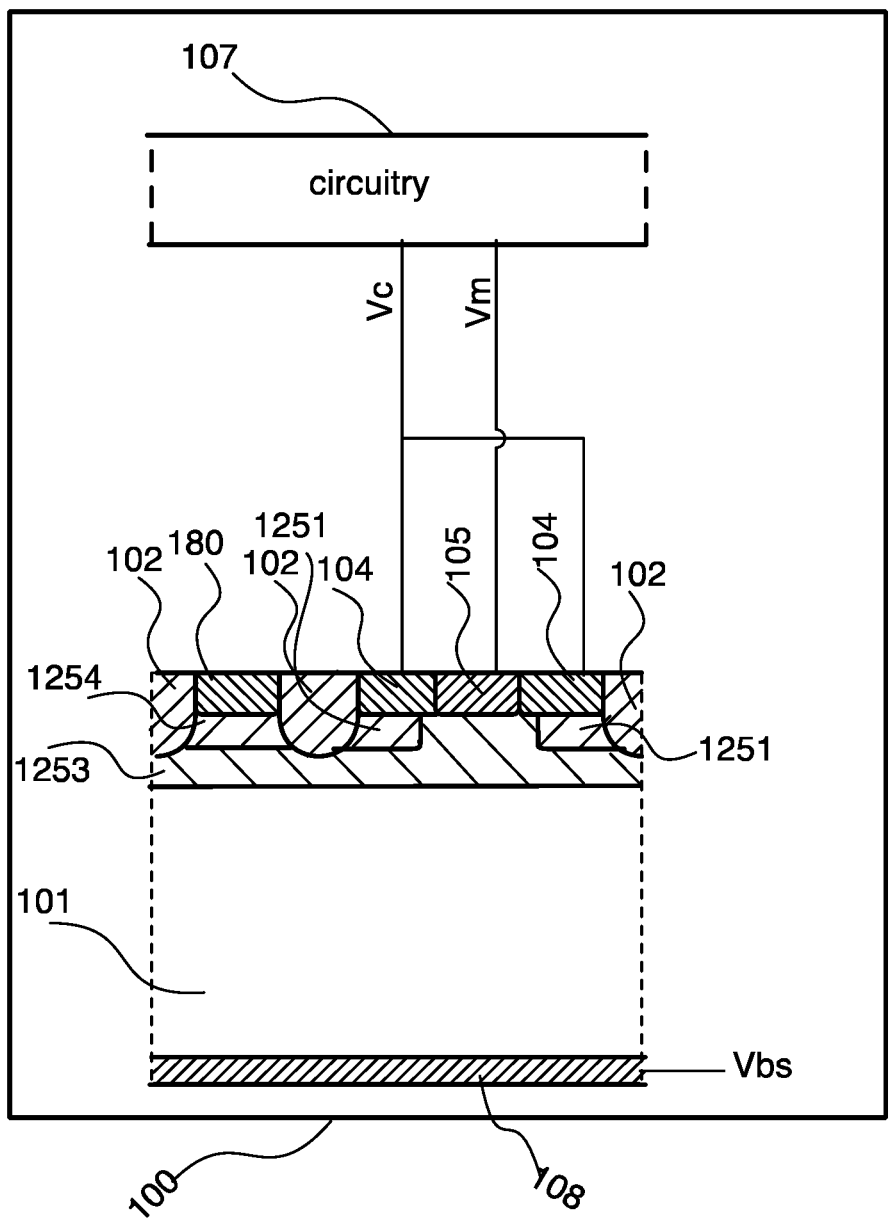

FIG. 21B is an illustration of an example of using tuning implantations with a pixel element with one primary and one secondary charge collection node. There is implant of second conductivity type semiconductor material 1251, as well as implant of first conductivity type semiconductor material 1253. Furthermore, there is implant of second conductivity type semiconductor material 1254 below the secondary charge collection node 180. The tuning implants helps steer charge to primary 104 and secondary 180 charge collection nodes and facilitate the quantum efficiency modulation of said charge collection nodes. The implants 1251, 1253 and 1254 can be lightly doped so that said implants are fully depleted when the sensor is operated.

Figure 21C:
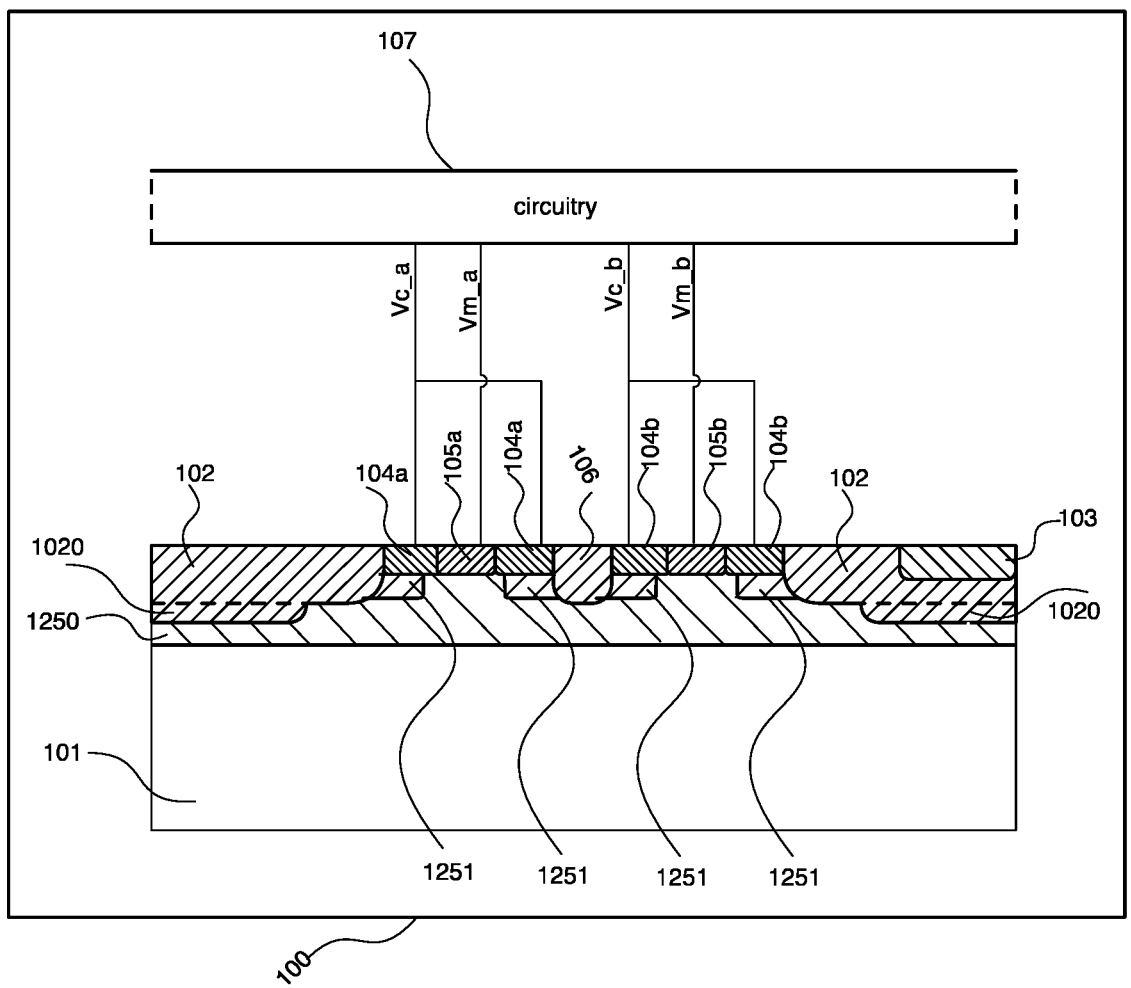

FIG. 21C is an illustration of an example of using tuning implantations with a pixel element with two primary charge collection nodes. The situation is analogous to that of using two pixel elements of FIG. 21A.

It is also possible to illustrate an example of using tuning implantations with a pixel element with two primary charge collection nodes. The situation is analogous to that of using two pixel elements of FIG. 21C, except that now the tuning implantation 1252 is structured so that it does not extend all the way to the edge of the pixel element. This helps separate the charge collection volumes of one pixel element from charge collection nodes of adjacent pixel elements. The implants 1251 and 1252 can be lightly doped so that said implants are fully depleted when the sensor is operated.

The described tuning implantations are illustrative examples and can be used in different combinations.

Figure 22:
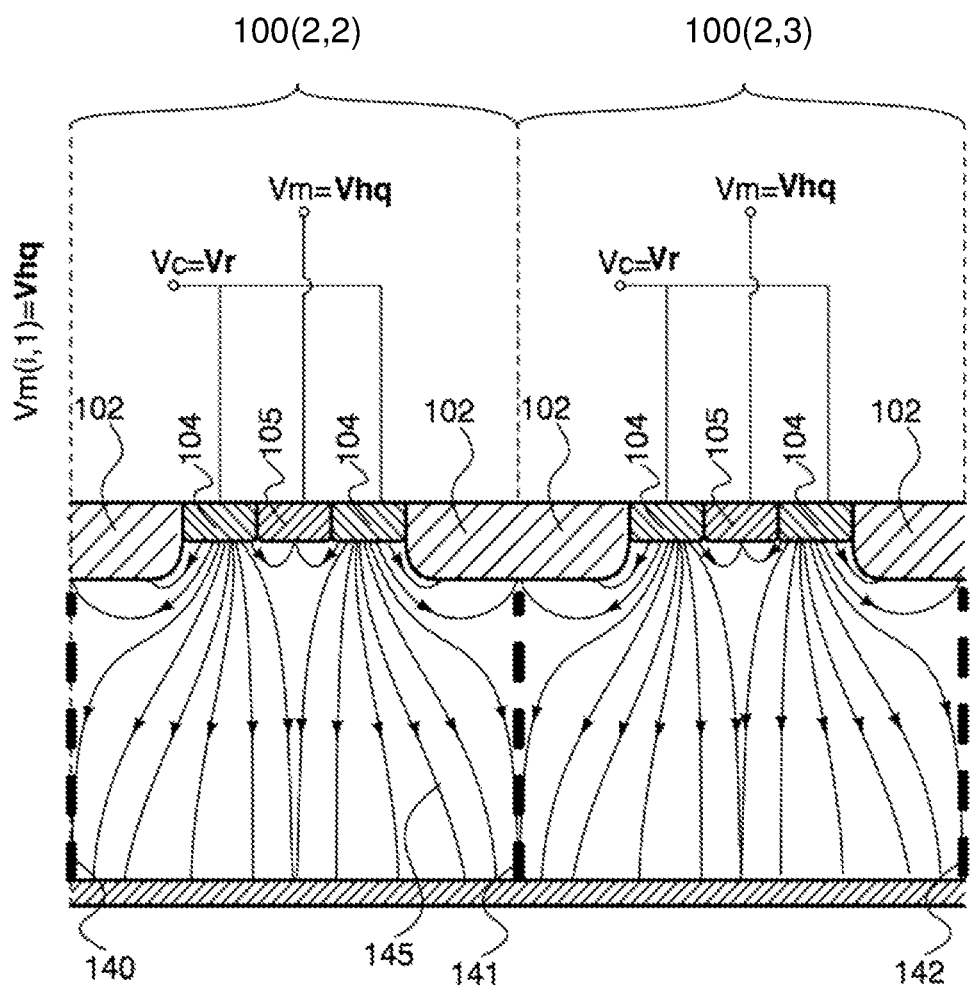
FIG. 22 is an illustration of electric filed distribution of the pixel elements, in accordance with an embodiment of the present invention.

FIG. 22 provides a more detailed illustration of the electric field distribution of the pixel elements and biasing conditions of FIG. 8B. The thick dashed lines 140, 141 and 142 of FIG. 22 represent boundaries of charge collection volumes between adjacent pixels. It should be noted that similarly to FIG. 8B while approaching a boundary of a charge collection volume the electric field component that is perpendicular to the boundary of charge collection volume reduces smoothly towards the boundary and reaches zero at the boundary. In FIG. 22 the electric field lines are drawn to illustrate that the second conductivity type mobile charges which are generated at the charge boundary end up either at the peripheral node 102 or at the backside conductive layer 108. That is because there is a vertical electric field in the charge collection volume boundary to either 102 or 108. In FIG. 22 are also illustrated electric field lines running between the peripheral node 102 and the charge collection node (these are not illustrated in FIGS. 8B, 8C, 8D, 8E, and 8F for clarity reasons) in a similar fashion as there are electric field lines between the modulating node 105 and the charge collection node.

As a note to FIG. 8B, FIGS. 8C, 8D, 8E, and 8F show the electric field lines only roughly, but the boundaries between charge collection volumes behave qualitatively as illustrated in FIGS. 8B, 8C, 8D, 8E, and 8F.

Figure 9A:
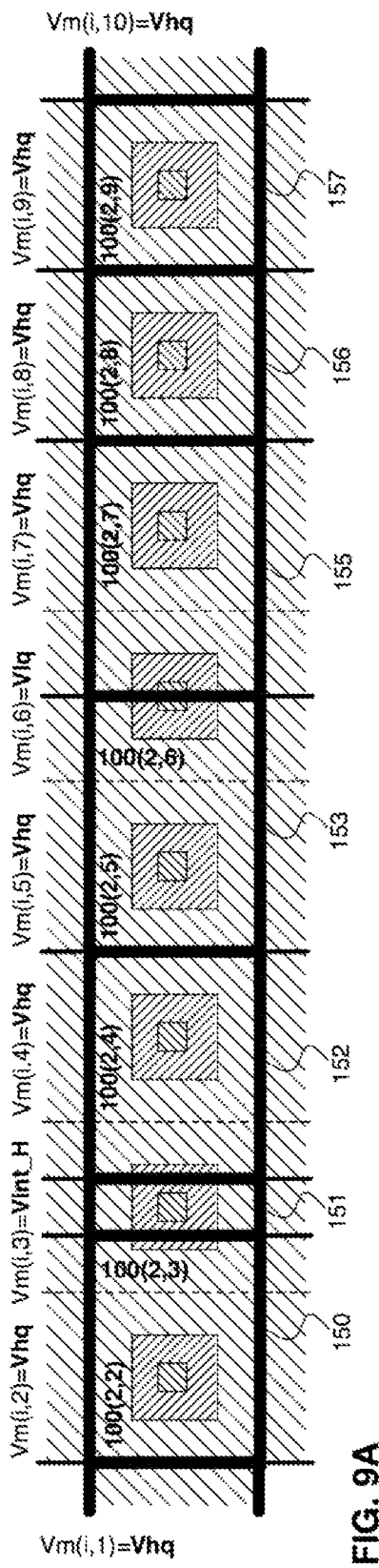
FIGS. 9A-B are other example illustrations of how the quantum efficiency of pixel elements can be modulated to change their charge-collection volumes, pursuant to embodiments of the present disclosure.
Figure 9B:
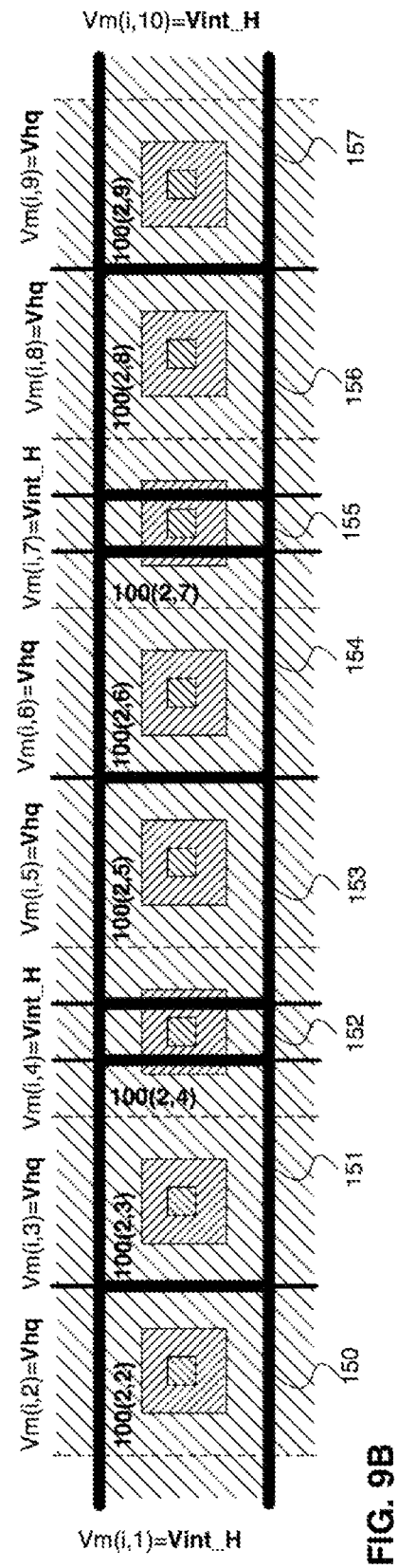

FIGS. 9A-B are other example illustrations of how the quantum efficiency of pixel elements can be modulated to change their charge-collection volumes, pursuant to embodiments of the present disclosure. FIGS. 9A-B show top views of a portion of a matrix of pixel elements, in accordance with an embodiment of the present disclosure.

For illustration purposes only, there will now be considered the matrix of pixel elements with i=[1,M] rows and j=[1,N] columns, wherein M and N are positive integers 3 and 10, respectively. Said portion comprises pixel elements 100(2,2), 100(2,3), 100(2,4), 100(2,5), 100(2,6), 100(2,7), 100(2,8) and 100(2,9) of the matrix.

Primary charge-collection nodes of the pixel elements 100(2,2), 100(2,3), 100(2,4), 100(2,5), 100(2,6), 100(2,7), 100(2,8) and 100(2,9) collect photogenerated charge from charge-collection volumes beneath areas 150, 151, 152, 153, 154, 155, 156 and 157, respectively. It will be appreciated that the areas 150, 151, 152, 153, 154, 155, 156 and 157 are merely indicative. As is observable in FIGS. 8A-F, a charge-collection volume from which a given primary charge-collection node collects photogenerated charge depends on the depth at which the photogeneration takes place.

The primary charge-collection nodes, modulating nodes and peripheral nodes of the pixel elements 100(2,2), 100(2,3), 100(2,4), 100(2,5), 100(2,6), 100(2,7), 100(2,8) and 100(2,9) shown in FIGS. 9A-B are not labelled, for the sake of clarity only.

FIG. 9A shows an example case, where:
the pixel elements 100(*i*,1) have Vm=Vhq,
the pixel elements 100(*i*,2) have Vm=Vhq,
the pixel elements 100(*i*,3) have Vm=Vint_H,
the pixel elements 100(*i*,4) have Vm=Vhq,
the pixel elements 100(*i*,5) have Vm=Vhq,
the pixel elements 100(*i*,6) have Vm=Vlq,
the pixel elements 100(*i*,7) have Vm=Vhq,
the pixel elements 100(*i*,8) have Vm=Vhq,
the pixel elements 100(*i*,9) have Vm=Vhq, and
the pixel elements 100(*i*,10) have Vm=Vhq.

It will be appreciated that boundaries of the volumes in terms of collecting photogenerated charge (namely, the charge-collection volumes) can be changed electrically with the modulating voltages.

FIG. 9B shows another example case, where:

the pixel elements 100(*i,j*) whose j satisfies mod(j,3)=1 have Vm=Vint_H (the intermediate high quantum-efficiency state), while other pixel elements 100(*i,j*) whose j satisfies mod(j,3)=0 and mod(j,3)=2 have Vm=Vhq (the high quantum-efficiency state).

It is to be noted that the notation of the modulo operation mod(j,3) is equivalent to j mod 3. It can be observed from FIG. 9B that in this example case, the pixel elements 100(2,*j*) whose mod(j,3)=1 collect photogenerated charge from about one-third of the actual width of the pixel element, while photogenerated charge from remaining two-third of the pixel element are collected by adjacent pixel elements 100(2,*j*) whose mod(j,3)=0 or mod(j,0)=2.

Moreover, measurements of photogenerated charge in various cases, for example, wherein:

Case A: all pixel elements have Vm=Vhq,
Case B: pixel elements satisfying mod(j,3)=1 have Vm=Vint_H,
Case C: pixel elements satisfying mod(j,3)=2 have Vm=Vint_H, and
Case D: pixel elements satisfying mod(j,3)=0 have Vm=Vint_H, can be used to divide each pixel element vertically into three parts. Thus, with these four measurements, a vertical resolution of the matrix can be three times the number of pixel elements in a row. It will be appreciated that the abovementioned cases are merely an example for illustrating the principle behind the modulating voltages and their patterns. Different combinations of modulating voltages and their patterns can be used to divide a pixel element into parts, resulting in an increased resolution.

Figure 10A:
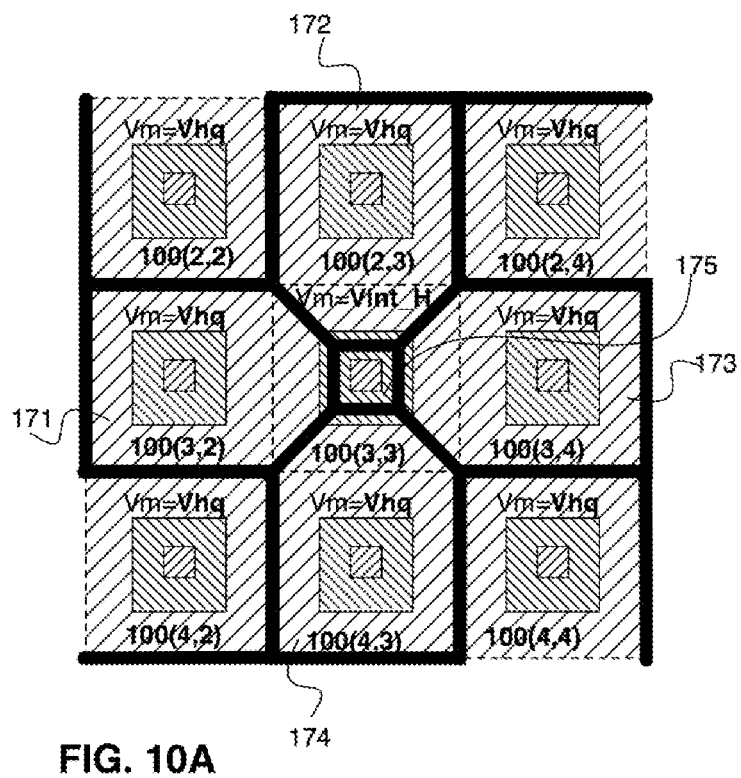
FIGS. 10A-E are yet other example illustrations of how the quantum efficiency of pixel elements can be modulated to change their charge-collection volumes, pursuant to embodiments of the present disclosure.
Figure 10B:
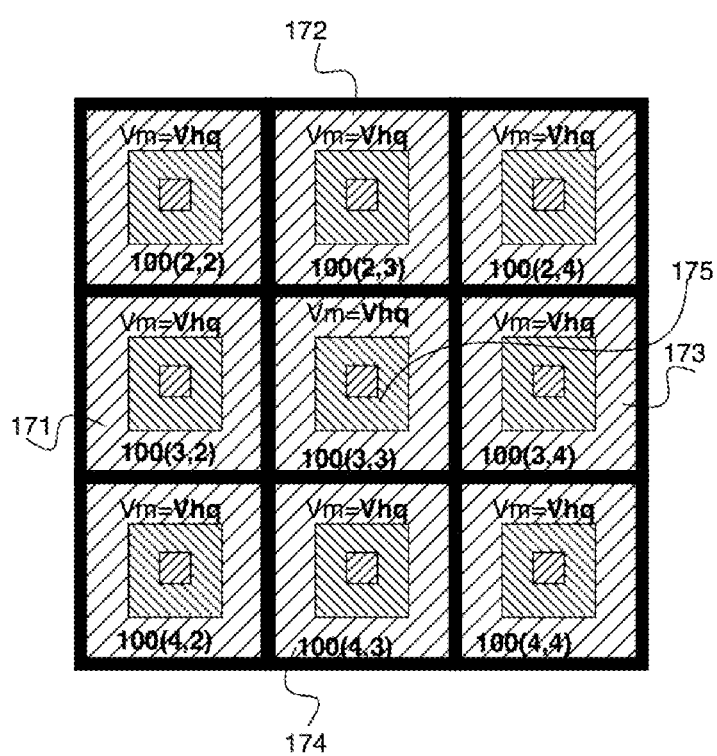

FIGS. 10A-B are yet other example illustrations of how the quantum efficiency of pixel elements can be modulated to change their charge-collection volumes, pursuant to embodiments of the present disclosure. FIGS. 10A-B show top views of a portion of a matrix of pixel elements, in accordance with an embodiment of the present disclosure. For illustration purposes only, there will now be considered the matrix of pixel elements with i=[1,M] rows and j=[1,N] columns, wherein M and N are positive integers 5 and 5, respectively.

With reference to FIG. 10A, pixel elements 100(3,3), 100(1,2), 100(2,5), 100(5,4) and 100(4,1) have Vm=Vint_H, while other pixel elements have Vm=Vhq. Primary charge-collection nodes of the pixel elements 100(3,2), 100(2,3), 100(3,4), 100(4,3) and 100(3,3) collect photogenerated charge from charge-collection volumes beneath areas (shown enclosed by thick lines) 171, 172, 173, 174 and 175.

With reference to FIG. 10B, all of the pixel elements have Vm=Vhq. As a result, the charge-collection volumes have become symmetric.

Figure 10C:
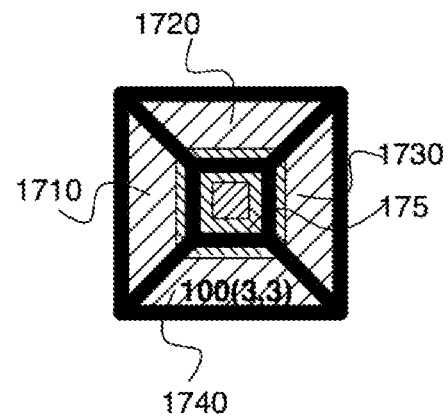

In FIG. 10C, the pixel element 100(3,3) has been split into five areas 1710, 1720, 1730, 1740, 175.

Figure 10D:
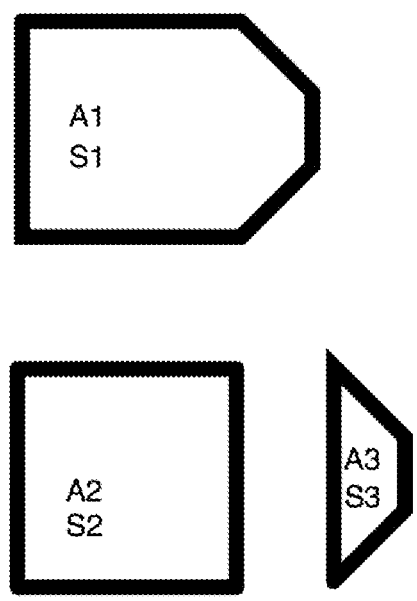

FIG. 10D shows how the number of photogenerated charges per unit area and time can be computed for charge-collection volumes underneath the areas 1710, 1720, 1730, 1740 and 175.

With reference to FIG. 10D, the area 171 of FIG. 10A and the area 171 of FIG. 10B are represented by A1 and A2, respectively. An area 1710 (namely, a difference between the areas represented by A1 and A2) is represented by A3.

Likewise, the number of photogenerated charges (namely, electrons generated due to an optical signal) per unit area and time have been represented by S1, S2 and S3 for the areas A1, A2 and A3, and are mathematically related as follows:

$$S3=(A1*S1-A2*S2)/A3$$

In this way, flexible (namely, programmable) charge-collection volumes of a pixel element can be used to increase the resolution of an image sensor, for example, by capturing multiple images with different patterns of the modulating voltages Vm.

Figure 10E:
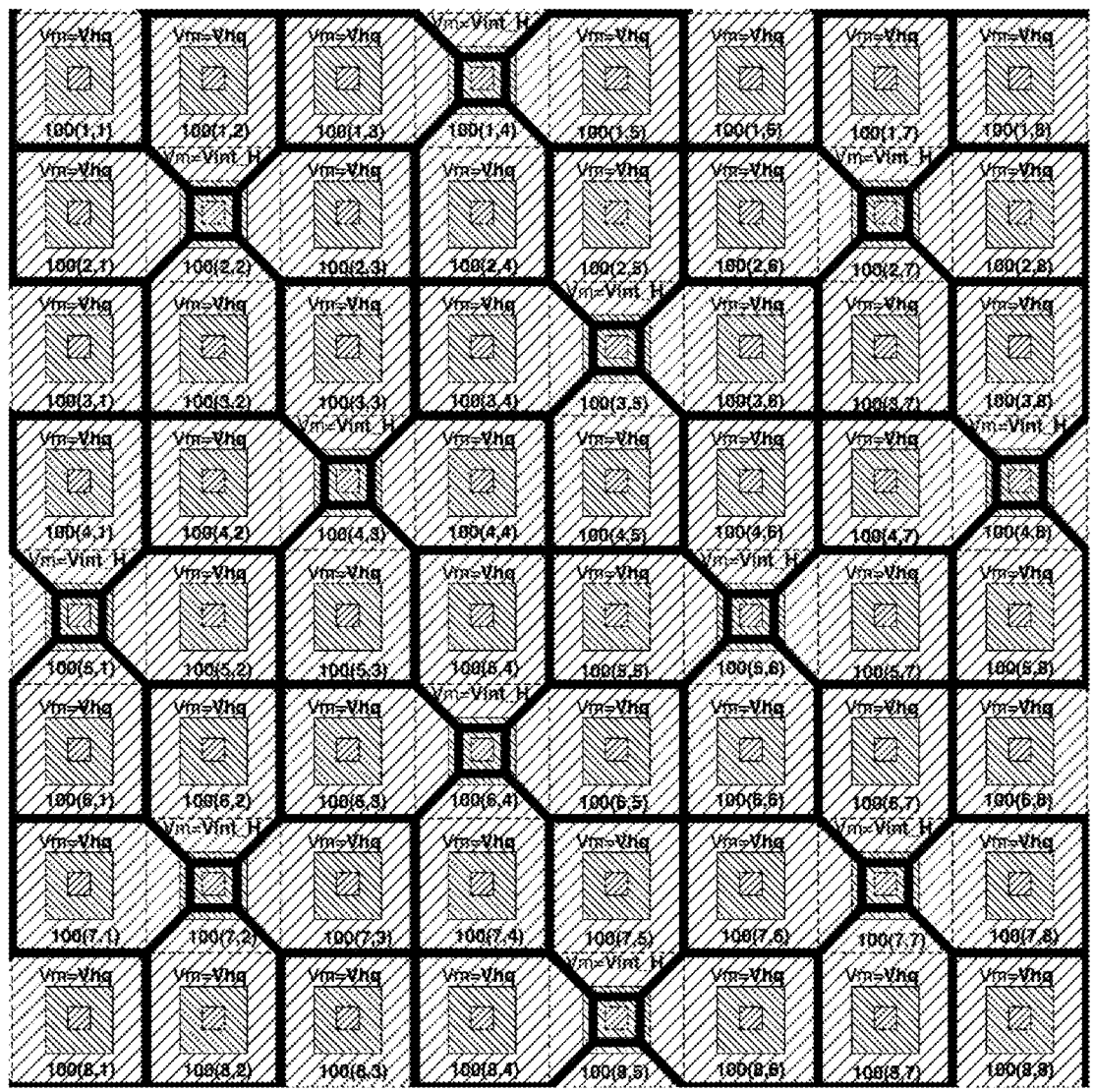

Next, FIG. 10E is a schematic illustration of how the resolution can be improved with the aid of a larger matrix of pixel elements, in accordance with an embodiment of the present disclosure. FIG. 10E shows the matrix having M and N equal to 8.

With reference to FIG. 10E, pixel elements that satisfy mod(2*(i−1)+j+1,5)=0 have Vm=Vint_H, while other pixel elements have Vm=Vhq. A first picture Pic1 is captured using this modulating voltage pattern.

For illustration purposes only, there will now be considered that six pictures are captured using following modulating voltage patterns:

| | |
|---|---|
| $Vm=Vint\_H$ if mod(2*(*i*−1)+*j*+1,5)=0,else $Vm=Vhq$ | Pic1: |
| $Vm=Vint\_H$ if mod(2*(*i*−1)+*j*+1,5)=1,else $Vm=Vhq$ | Pic2: |
| $Vm=Vint\_H$ if mod(2*(*i*−1)+*j*+1,5)=2,else $Vm=Vhq$ | Pic3: |
| $Vm=Vint\_H$ if mod(2*(*i*−1)+*j*+1,5)=3,else $Vm=Vhq$ | Pic4: |
| $Vm=Vint\_H$ if mod(2*(*i*−1)+*j*+1,5)=4,else $Vm=Vhq$ | Pic5: |
| $Vm=Vhq$ | Pic6: |

As a result, the first picture Pic1 has a pattern of Vm as shown in FIG. 10E; the second picture Pic2 has the same pattern shifted right by one position; the third picture Pic3 has the same pattern shifted down by one position; the fourth picture Pic4 has the same pattern shifted up by one position; the fifth picture Pic5 has the same pattern shifted right by one position; the sixth picture Pic6 is taken with Vm=Vhq for all the pixel elements. These six pictures have enough information to virtually split all the pixel elements in five parts each in a manner that is similar to that shown in conjunction with FIGS. 10C and 10D. This yields in five times more pixel values than there are charge-collection nodes in the matrix. In effect, imaging speed is traded for resolution, a worthy trade-off, especially in good lighting conditions.

It will be appreciated that the pattern of the modulating voltages used in FIG. 10E is merely an example. As a charge-collection volume from which a given primary charge-collection node collects photogenerated charge can be changed electrically, various modulating voltage patterns and schemes can be introduced to boost the resolution. As an example, instead of using Vm=Vint_H for the selected pixel elements while capturing the pictures Pic1, Pic2, Pic3, Pic4 and Pic5, Vm=Vlq can be used for said selected pixel elements. In such a case, the pixel elements can be virtually split into four parts.

Figure 11A:
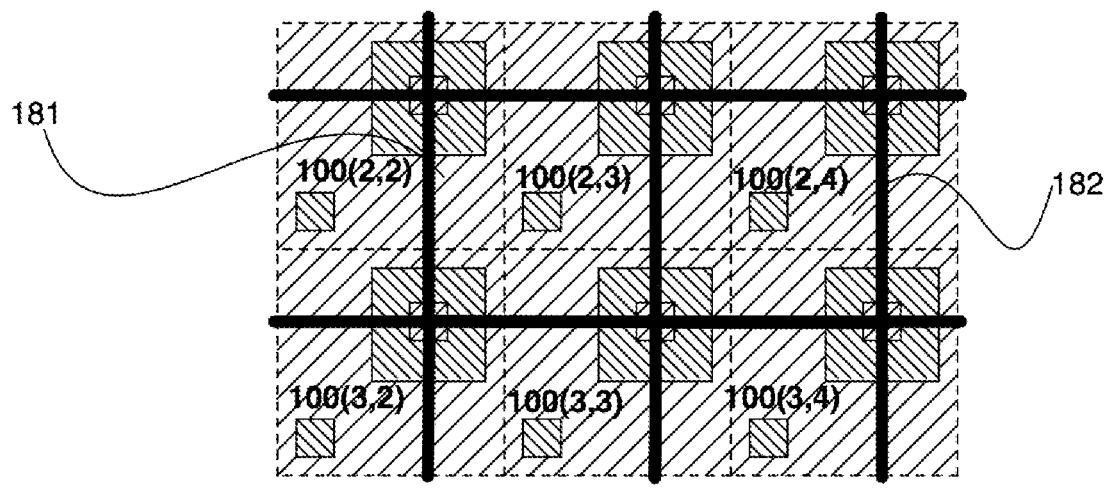
FIGS. 11A-C are still other example illustrations of how the quantum efficiency of pixel elements can be modulated to change their charge-collection volumes, pursuant to embodiments of the present disclosure.
Figure 11B:
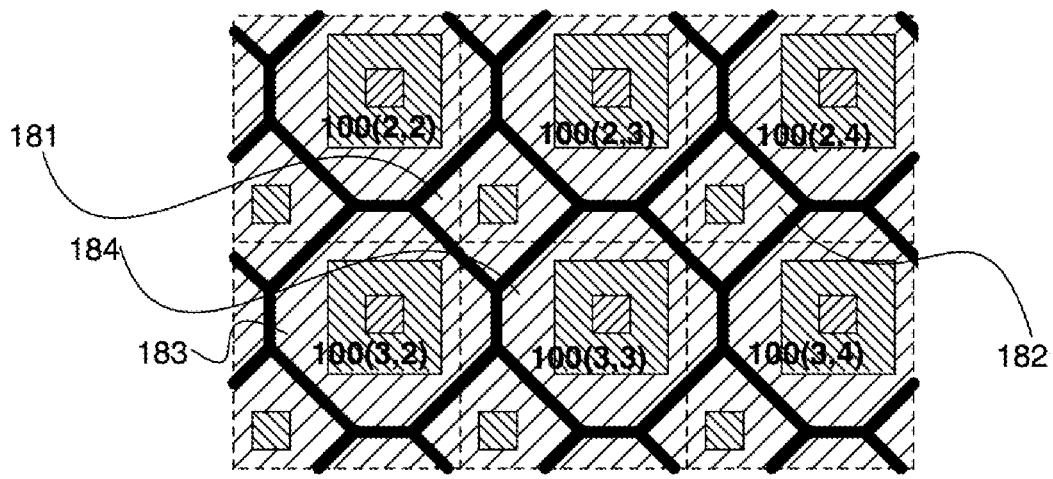
Figure 11C:
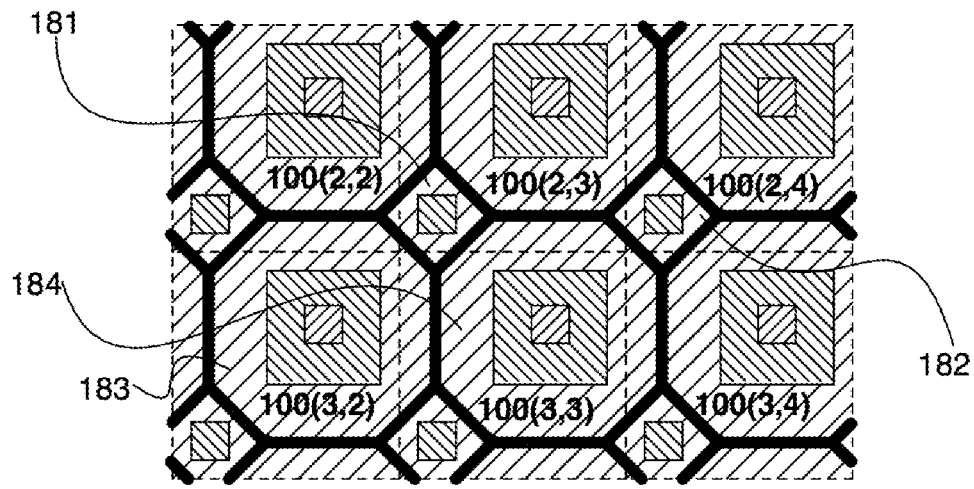

FIGS. 11A-C are still other example illustrations of how the quantum efficiency of pixel elements can be modulated to change their charge-collection volumes, pursuant to embodiments of the present disclosure. FIGS. 11A-C show top views of a portion of a matrix of pixel elements, in accordance with another embodiment of the present disclosure. For illustration purposes only, there will now be considered the matrix of pixel elements with i=[1,M] rows and j=[1,N] columns, wherein M and N are positive integers 4 and 5, respectively. With reference to FIGS. 11A-C, the pixel elements comprise a secondary charge-collection node in addition to a primary charge-collection node, for example as shown in FIG. 5A.

It is to be noted that the voltage polarities used here are based on an assumption that the first conductivity-type semiconductor is an n-type semiconductor.

With reference to FIG. 11A, all the pixel elements have their secondary charge-collection nodes in the high quantum-efficiency state, and have their primary charge-collection nodes in the low quantum-efficiency state. In other words, all the pixel elements have Vx=Vhq and Vm=Vlq. Secondary charge-collection nodes of the pixel elements 100(2,3) and 100(2,4) collect photogenerated charge from charge-collection volumes beneath areas (shown enclosed by thick lines) 181 and 182.

With reference to FIG. 11B, the quantum efficiencies of the primary charge-collection nodes of all the pixel elements are increased and/or the quantum efficiencies of the secondary charge-collection nodes of all the pixel elements is decreased. In other words, Vm is increased, while Vx is decreased, as compared to their previous values in FIG. 11A. The primary charge-collection nodes of the pixel elements 100(3,2) and 100(3,3) collect photogenerated charge from charge-collection volumes beneath areas (shown enclosed by thick lines) 183 and 184. It will be appreciated that the areas 181 and 182 have shrunk in size, as compared to FIG. 11A.

With reference to FIG. 11C, the quantum efficiencies of the primary charge-collection nodes of all the pixel elements are further increased and/or the quantum efficiencies of the secondary charge-collection nodes of all the pixel elements is further decreased, as compared to FIG. 11B. It is to be noted here that voltages Vx can be read out after the photogenerated charge has been collected; thus, the secondary charge-collection nodes can contribute to the resolution of the image sensor similar to the primary charge-collection nodes.

FIGS. 12A-D are schematic illustrations of the circuitry 107 of the pixel element 100, in accordance with various embodiments of the present disclosure. For purposes of illustration, the first conductivity-type semiconductor material is assumed to be an n-doped semiconductor material; the operation with respect to the p-doped first conductivity-type semiconductor material could be explained in a similar manner. Preferably the semiconductor substrate 101 is a high-resistivity or intrinsic semiconductor material.

Figure 12A:
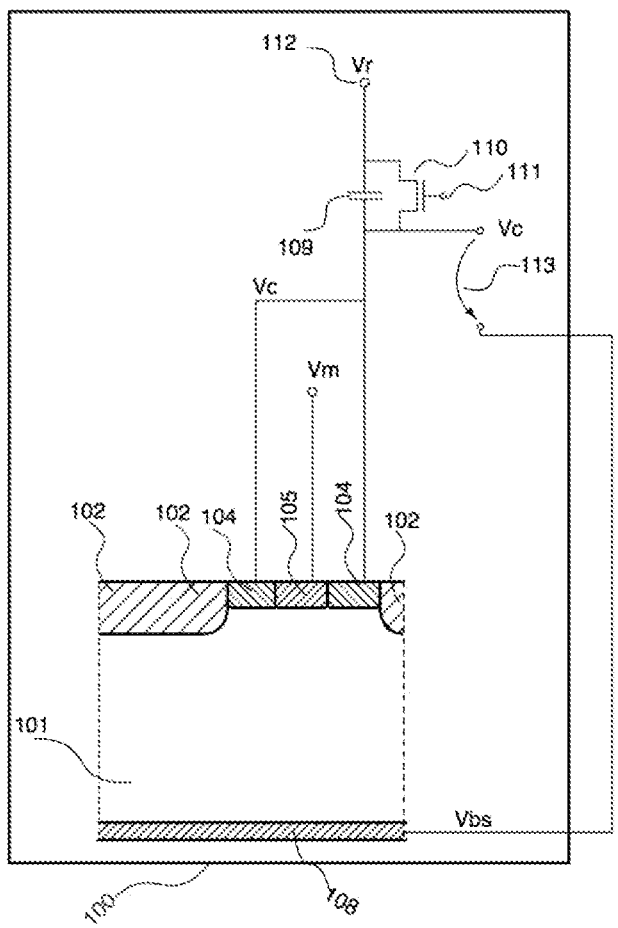
FIGS. 12A-D are schematic illustrations of a circuitry of a pixel element, in accordance with various embodiments of the present disclosure.

With reference to FIG. 12A, the pixel element 100 comprises a single primary charge-collection node 104 without any secondary charge-collection node. Vm is the modulating voltage of the modulating node 105 and is used to modulate the quantum efficiency of the primary charge-collection node 104, whose voltage is Vc.

FIG. 12A shows only an exemplary part of the circuitry 107, wherein the circuitry 107 comprises a switch 110. In an example embodiment, the switch 110 can be implemented as an NMOS transistor, which is used to pull Vc towards the reset voltage Vr available at a node 112. The switch 110 has a gate 111. The circuitry 107 also comprises a capacitor 109 that is used to store the photogenerated collected charge. The capacitor 109 could be a dedicated capacitor, a parasitic capacitor or a combination of different capacitive elements.

The potential difference between the primary charge-collection node 104 and the backside conductive layer 108 is denoted by a label 113. This potential difference should be high enough (typically, in an order of 15 volts) if a high-resistivity substrate is to be essentially fully depleted.

A matrix of such pixel elements 100 can be used to capture a picture as follows:

First, the voltage Vc of the primary charge-collection nodes of all the pixel elements are initialized by pulling Vc towards the reset voltage Vr through the switch 110, by asserting the voltage at the transistor gate 111. In this example, Vr could be 5 V.

Next, the voltage at the transistor gate 111 is de-asserted, and thus, the primary charge-collection nodes are left floating. Photogenerated charge starts to lower the voltage Vc at the primary charge-collection nodes from the initial value, which was approximately Vr. The modulating voltage Vm can be used to after the quantum efficiency of the corresponding primary charge-collection nodes.

Finally, after a certain integration time, the capacitor 109 holds a signal Vr-Vc that is available for readout. The signal range could be, for example, 2V, so that the primary charge-collection nodes 104 would be at least at a potential that is 3V higher than the peripheral nodes 102.

It will be appreciated that this is a simplified procedure for taking a picture. In real life, various techniques, for example, such as Correlated Double Sampling (CDS) in which the reset voltage value is read before the signal, can be used. Also, different pixel elements may have different integration times.

It is to be noted here that the voltage at the primary charge-collection node 104 should stay above a certain value in order to prevent a current from flowing between the peripheral node 102 (or the modulating node 105) and the primary charge-collection node 104, and, if applicable, keep the semiconductor substrate 101 essentially fully depleted. If the primary charge-collection node 104 is at a sufficiently high voltage, the primary charge-collection node 104 essentially isolates the modulating node 105 from the peripheral node 102. The voltage polarities in the explanation below assume the first conductivity-type semiconductor material to be of an n-type semiconductor.

FIG. 12A is an example illustration of one possible way to restrict the voltage range of the primary charge-collection node 104 when the first conductivity-type semiconductor material is an n-type semiconductor. One way to prevent the voltage Vc at the primary charge-collection node 104 from becoming too low is to use the switch 110 to connect and disconnect the reset voltage Vr to/from the primary charge-collection node 104. During reset, the transistor gate 111 of the switch 110 is pulled to a high voltage, so that the switch 110 is fully conducting, namely is turned ON. Then, the gate voltage can be set approximately to Vtarg+Vth, wherein Vtarg is a targeted lower bound of the voltage of the primary charge-collection node 104, and Vth is a threshold voltage of the switch 110 (namely, the reset transistor). In this way, when the voltage at the primary charge-collection node 104 reaches Vtarg, the gate-source voltage of the switch 110 is at Vth. If the voltage at the primary charge-collection node 104 further decreases, a current through the switch 110 is increased, essentially preventing the voltage at the primary charge-collection node 104 from lowering. In practice, such limiting happens gradually. It will be appreciated that Vth has been used in the above example just for illustration purposes.

Figure 12B:
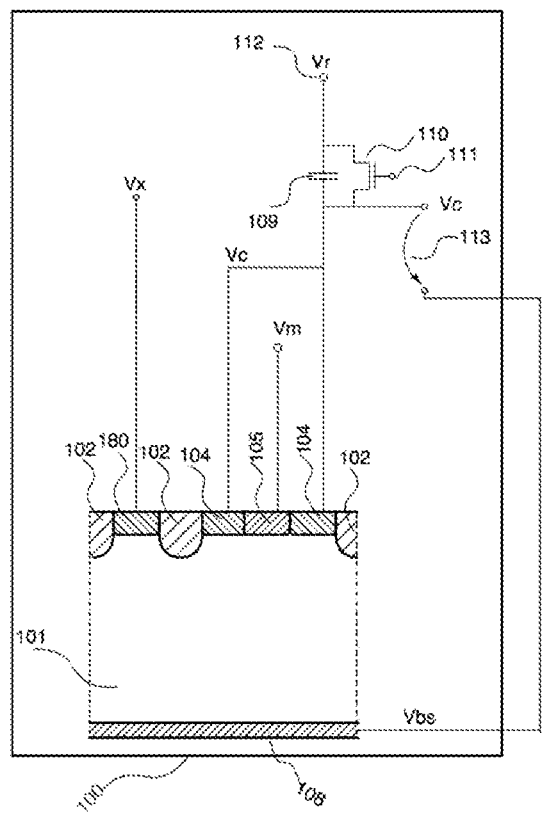

With reference to FIG. 12B, the pixel element 100 comprises a primary charge-collection node 104 and a secondary charge-collection node 180. The secondary charge-collection node 180 has the voltage Vx, and is connected to the circuitry 107 (said connection not shown in FIG. 12B). The voltage Vx can be used to control the quantum efficiency of the secondary charge-collection node 180.

Figure 12C:
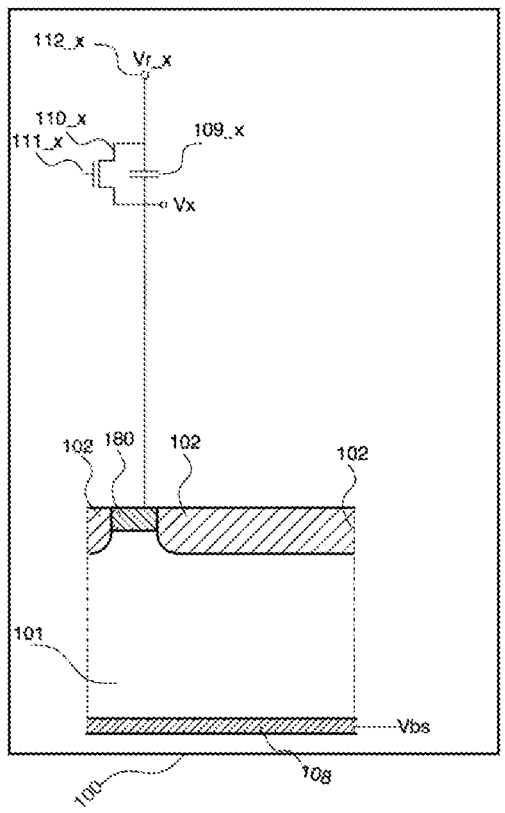

With reference to FIG. 12C, the pixel element 100 comprises a single secondary charge-collection node 180, without any primary charge-collection node. The secondary charge-collection node 180 can be reset with a switch 110_x, which can be implemented as a transistor whose gate is controlled by the voltage at a node 111_x. The reset voltage Vr_x is provided at a node 112_x. The circuitry 107 also comprises a capacitor 109_x for storing the charge. The pixel element 100 of FIG. 12C works much like the pixel element 100 of FIG. 12A, except that there is no modulating node. Herein, the modulation of the quantum efficiency is possible with Vr_x. If Vr_x is at a high voltage during reset, the quantum efficiency is high; similarly, if Vr_x is at a low voltage during reset, the quantum efficiency is low.

Assume that the capacitor 109_x is reset, and then the node 111_x is de-asserted. If the voltage at the node 112_x is modulated at this point, some of that modulation connects capacitively through the capacitor 109_x to the secondary charge-collection node 180, resulting in a modulation of the quantum efficiency of the secondary charge-collection node 180. This allows for modulation of the quantum efficiency during integration. Larger is the capacitance of the capacitor 109_x relative to the total capacitance of the secondary charge-collection node 180, higher is the capacitive modulation effect described above. Similarly, as was described in the example of FIG. 12A for the primary charge-collection node 104, the voltage range of the secondary charge-collection node 180 can be restricted with the aid of the switch 110_x.

Figure 12D:
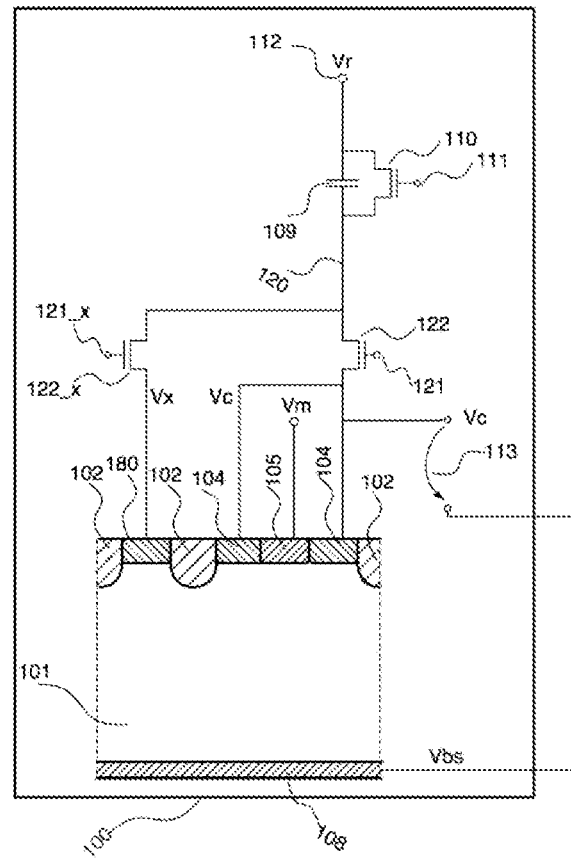

With reference to FIG. 12D, the pixel element 100 comprises a primary charge-collection node 104 and a secondary charge-collection node 180. The circuitry 107 comprises a switch 122_x, which can be implemented by way of a transistor that is controlled by a gate 121_x. The switch 122_x connects the secondary charge-collection node 180 to a node 120 when the voltage at a node 121_x is asserted. Similarly, the circuitry 107 further comprises a switch 122, which can be implemented by way of a transistor that is controlled by a gate 121. The switch 122 can connect the primary charge-collection node 104 to the node 120. This means that pictures can be taken both with the secondary charge-collection node 180 and the primary charge-collection node 104, and both store the charge into the capacitor 109.

It will be appreciated that the pixel elements 100 shown in FIGS. 12A-D are only exemplary illustrations of the circuitry 107. The principle described herein can be extended to other types of pixel elements having different numbers of primary charge-collection nodes and/or secondary charge-collection nodes. Notably, there can be more than one storage capacitor in a given pixel element. For example, in FIG. 12D, there could be a bank of capacitors that could store, for example, captured signals, reset values (for CDS) and derived signals.

Figure 13:
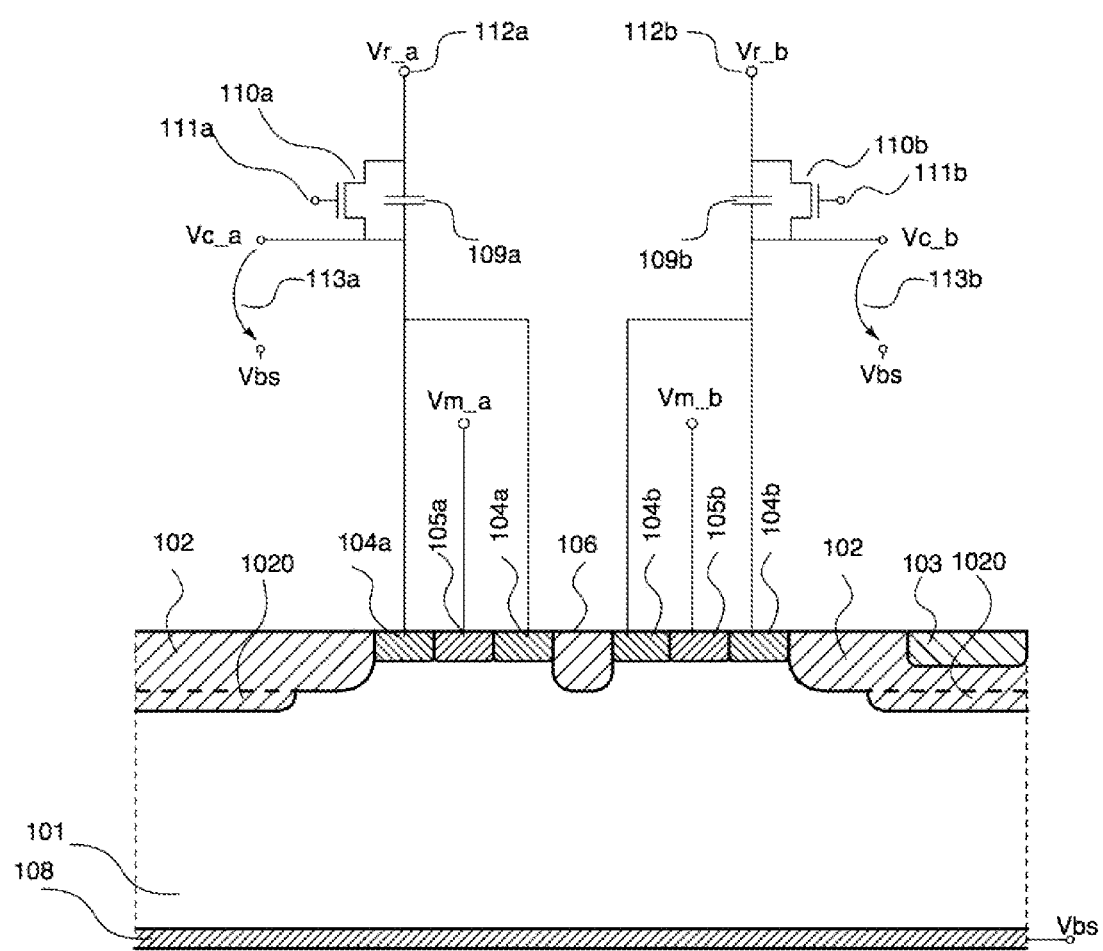
FIG. 13 is a schematic illustration of a circuitry of a pixel element, in accordance with an embodiment of the present disclosure.

FIG. 13 is a schematic illustration of the circuitry 107 of the pixel element 100, in accordance with an embodiment of the present disclosure. With reference to FIG. 13, the pixel element 100 comprises first and second primary charge-collection nodes 104a and 104b, for example, as shown in FIG. 2A.

The pixel element 100 comprises a backside conductive layer 108 fabricated to be a backside of the semiconductor substrate 101. The backside conductive layer 108 is biased to the bias voltage Vbs. The circuitry 107 comprises first and second switches 110a and 110b (which can be implemented by way of transistors) associated with the first and second primary charge-collection nodes 104a and 104b, respectively. Similarly, transistor gates 111a and 111b of the switches 110a and 110b can be used to control the conductances of the switches 110a and 110b, respectively. The circuitry 107 further comprises storage capacitors 109a and 109b. A label 113a represents potential differences between the charge-collection node 104a and the backside conductive layer 108, while a label 113b represents potential differences between the charge-collection node 104b and the backside conductive layer 108. Vr_a and Vr_b are first and second reset voltages at nodes 112a and 112b, respectively.

Other parts (for example, such as possible source followers) of the circuitry 107 that may be used have not been shown in FIG. 13, for the sake of clarity only.

Figure 14A:
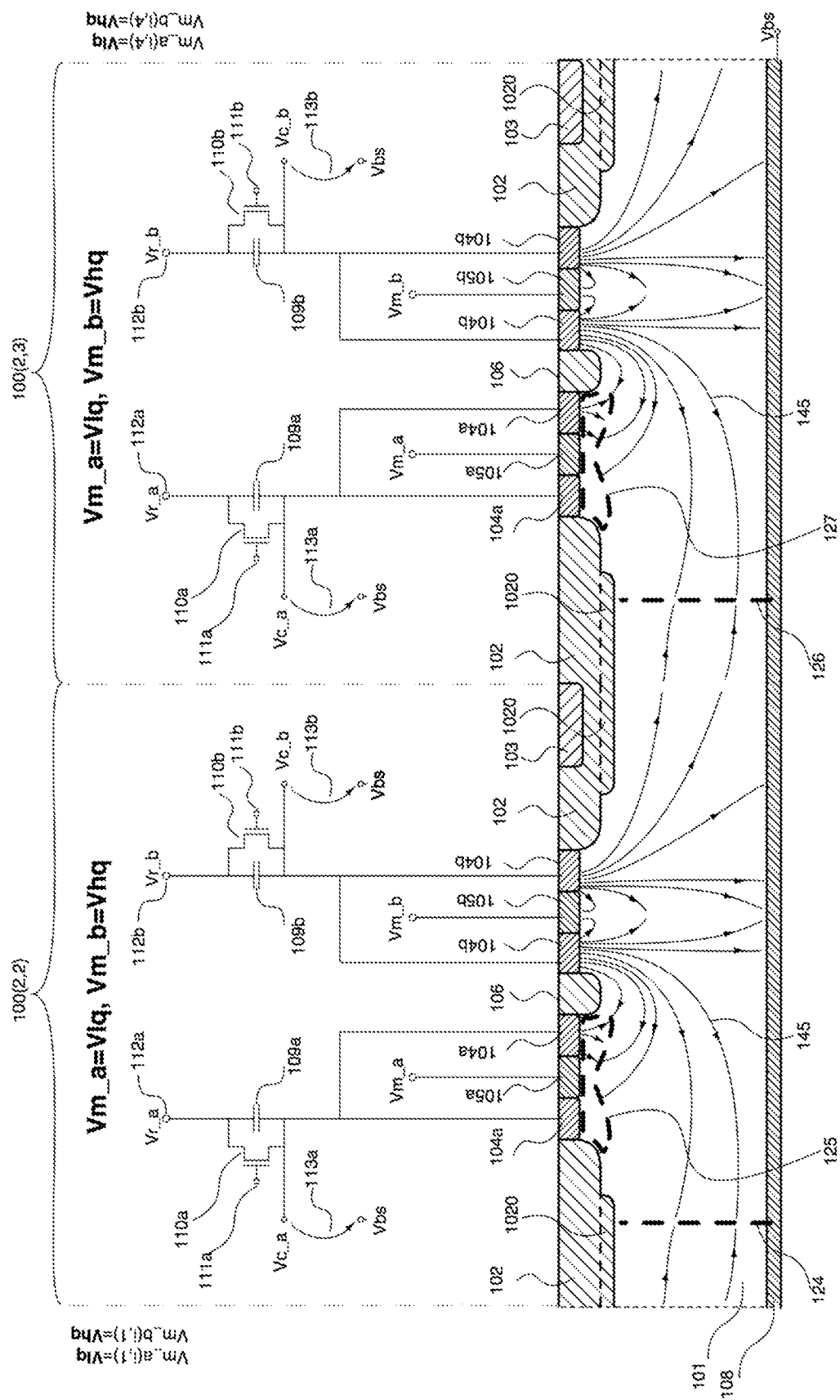
FIGS. 14A-B are schematic illustrations of how the collection of charge can be modulated, according to an embodiment of the present disclosure.
Figure 14B:
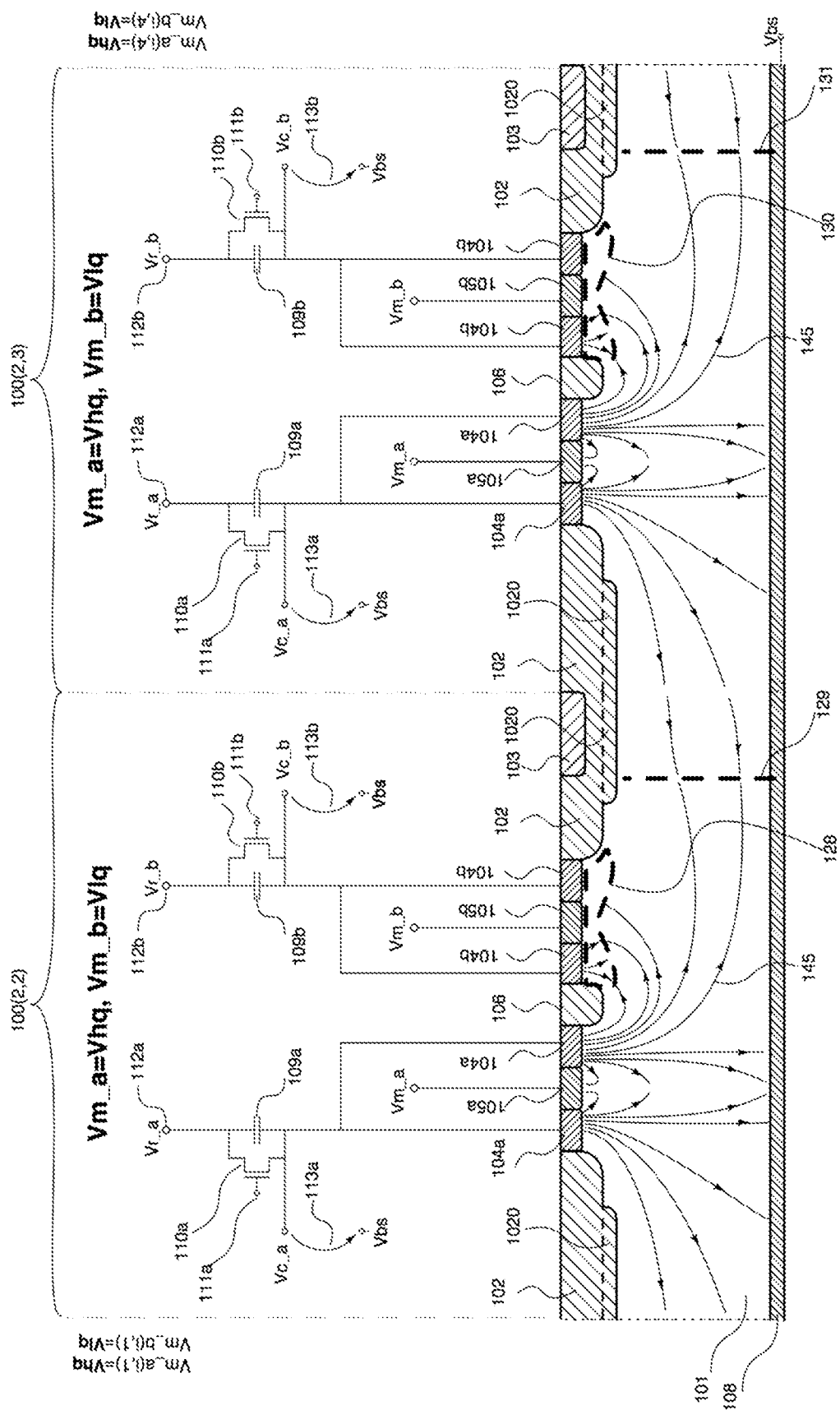

FIGS. 14A-B are schematic illustrations of how the collection of charge can be modulated, in the pixel element 100 of FIG. 13. The semiconductor substrate 101 is optionally a thinned high-resistivity substrate. It is assumed that the first conductivity-type semiconductor is an n-type semiconductor material. It is also assumed that the switches 110a and 110b are n-type transistors. Furthermore, a large enough potential difference 113a and 113b is arranged between the primary charge-collection nodes and the backside conductive layer 108 to essentially fully deplete the semiconductor substrate 101. The switches 110a and 110b are used to pull the primary charge-collection nodes 104a and 104b close to their reset voltages Vr_a and Vr_b before an image capture starts. The storage capacitors 109a and 109b need not be dedicated capacitors, but can be formed, for example, by parasitic capacitances of the charge-collection nodes 104a and 104b and/or other attached components, for example, such as the transistor gates. It is to be noted here that the capacitors 109a and 109b could have different values, one could have a low capacitance (namely, a high conversion gain) and the other could have a high capacitance (namely, a high full-well capacity), for example.

With reference to FIG. 14, it is assumed that the reset voltages Vr_a and Vr_b are 5V. The pixel signal range (namely, the voltage range of Vc_a, Vc_b) could be from 5V to 3V; in this case, the charge-collection nodes 104a and 104b would always be at least at a 3V higher potential than the peripheral node 102 (which is at the ground level). The bias voltage Vbs is −15V, Vhq is 2.5V and Vlq is 0V. The modulating voltage of 0V yields the low quantum-efficiency state, while the modulating voltage of 2.5V yields the high quantum-efficiency state to its corresponding primary charge-collection node.

With reference to FIGS. 14A-B, the primary charge-collection nodes 104a and 104b have been pulled towards the first and second reset voltages Vr_a and Vr_b using the switches 110a and 110b (by controlling the corresponding gate voltages 111a and 111b), respectively. After the reset operation, the switches 110a and 110b have been arranged to cut-off the operating region with the gate voltages 111a and 111b to prevent a further current flow between the drain nodes 112a and 112b and the primary charge-collection nodes 104a and 104b, respectively. The modulating voltages Vm_a and Vm_b can be at 2.5V (=Vhq) during the reset. The primary charge-collection nodes 104a and 104b compete for the photogenerated charge within the substrate 101; charges that are collected by the primary charge-collection nodes 104a and 104b are stored to the capacitors 109a and 109b, respectively.

Next, the quantum efficiency modulation principle will be explained. FIG. 14A shows the pixel elements 100(2,2) and 100(2,3) within a matrix of M=3 rows and N=4 columns. The modulating voltage Vm_a=Vlq and the modulating voltage Vm_b=Vhq. Approximate electric field lines 145 are shown in FIGS. 14A and 14B. The primary charge-collection node 104a of the pixel element 100(2,2) that is in the low quantum-efficiency state collects the photogenerated charge from a small volume circumscribed by a thick dashed line 125, while the primary charge-collection node 104b of the pixel element 100(2,2) that is in the high quantum-efficiency state collects the photogenerated charge from a large volume of the substrate 101 between thick dashed lines 124 and 126 (excluding the volume circumscribed by the thick dashed line 125). The charge that is photogenerated on the left side of the thick dashed line 124 is collected by the primary charge-collection node 104b of the pixel element 100(2,1).

Similarly, the primary charge-collection node 104a of the pixel element 100(2,3) collects photogenerated charge from a small volume circumscribed by a thick dashed line 127, while the primary charge-collection node 104b of the pixel element 100(2,3) collects photogenerated charge from a large volume of the substrate 101 between a thick dashed line 126 and a line 124 (not shown) of the pixel element 100(2,4) (excluding the volume circumscribed by the thick dashed line 127). Thus, a fraction of charge that is photogenerated in the substrate 101 within a given pixel element may be collected by a neighbouring pixel element.

In the pixel element 100 of FIG. 13, the primary charge-collection nodes 104a and 104b are close to each other (namely, the region 106 between said primary charge-collection nodes 104a and 104b is relatively thin), in order to minimize said charge collection by neighbouring pixel elements. It is to be noted here that the fill factor is essentially 100% because essentially all the charge generated beneath the pixel element is collected by one of the primary charge-collection nodes. It will be appreciated that if the substrate 101 of the pixel element 100 is essentially fully depleted as is assumed in FIGS. 14A and 14B, the photogenerated charge rapidly drifts to the primary charge-collection nodes 104a and 104b.

With reference to FIG. 14B, the pixel elements have Vm_a=Vhq and Vm_b=Vlq. Charge-collection volumes from which the primary charge-collection node 104b of the pixel element 100(2,2) and the primary charge-collection node 104b of the pixel element 100(2,3) collect photogenerated charge are circumscribed by thick dashed lines 128 and 130, respectively. Similar to FIG. 14A, the primary charge-collection node 104a of the pixel element 100(2,3) collects photogenerated charge from a large volume of the substrate 101 between thick dashed lines 129 and 131, excluding the volume circumscribed by the thick dashed lines 130.

It is interesting to note that if the incoming light goes through an infrared (IR) cut filter before reaching a relative thick (namely, in an order of tens of micrometres) thinned chip, the modulation contrast approaches 100%. This is because practically all short wavelength light gets absorbed near the backside and very little light gets absorbed in the vicinity of the primary charge-collection nodes that are in the low quantum-efficiency state (namely, volumes circumscribed by the thick dashed lines 125, 127, 128 and 130), as the primary charge-collection nodes are located on the front side of the pixel elements.

FIG. 15 is a schematic illustration of how a small primary charge-collection node size can be obtained, whilst having a high modulation contrast and charge collection from the whole area of the pixel element 100, in accordance with an embodiment of the present disclosure. FIG. 15 shows a schematic representation of a possible pixel readout circuitry that can be employed. A higher potential difference between the primary charge-collection nodes (104a and 104b) and the peripheral node 102 allows for a smaller primary charge-collection node area in relation to the whole area of the pixel element 100.

In an example case, the drain and source voltages at the nodes 112a, 112b, 114a, 114b, 119a and 119b of switches 110a, 110b, 115a, 115b, 117a and 117b, respectively, are set, so that the reverse bias between the primary charge-collection nodes (104a and 104b) and the peripheral node 102 is maximized, while keeping the transistor terminal voltages at a safe voltage range (namely, a voltage range that does not harm the transistors).

It is to be noted here that the switches can be implemented by way of first conductivity-type transistors, for example, such as NMOS transistors that can be built into the peripheral node (p-well) 102, so that the substrates of shutter transistors 122a and 122b, reset transistors 109a and 109b, source follower transistors 115a and 115b and load transistors 117a and 117b are tied to the peripheral node 102. The shutter transistors 122a, 122b are optional and are used to separate the primary charge-collection nodes 104a and 104b from storage nodes 120a and 120b, respectively. This provides one way of attaining global shutter imaging.

Source followers formed by the transistors 115a and 115b and the transistors 117a and 117b buffer the signals stored on the capacitors 109a and 109b, respectively. These source followers have output nodes 116a and 116b. The shutter transistors 122a and 122b have gate nodes 121a and 121b, having corresponding gate control voltages Vsh_a and Vsh_b, respectively. The gate control voltages Vsh_a and Vsh_b are used to turn the shutter transistors 122a and 122b to conducting or cut-off operation regions, respectively. The load transistors 117a and 117b have gate nodes 118a and 118b, which are used to set bias currents of the source followers. The transistors 115a and 115b have drain terminals 114a and 114b, respectively. The transistors 117a and 117b have source terminals 119a and 119b.

During readout, the modulating voltages Vm_a and Vm_b are preferably set to predetermined values, in order to minimize fluctuations due to capacitive connections between the modulating node 105a and the primary charge-collection node 104a, as well as between the modulating node 105b and the primary charge-collection node 104b. After readout, the pixel element can be reset with the switches 110a and 110b that short circuit the nodes of the capacitors 109a and 109b. At this point the reset voltage at the nodes 120a and 120b can be read out or used within the pixel element to be used for double sampling or correlated double sampling.

It will be appreciated that FIG. 15 does not depict a complete pixel circuitry, and the use of the pixel element in an image sensor is not limited to the specific readout configuration explained above. In practice, implementing such pixel elements into an image sensor would also need separate selection devices connected to the gates 116a and 116b, in order to choose which pixel element out of a matrix of pixel elements is read out. Also, for example, the load transistors 117a and 117b could be placed in a peripheral circuitry (namely, a controller of the image sensor). Pixel element voltages such as those at the nodes 104a, 104b, 120a and 120b can be used for pixel-level signal processing and/or readout.

It is possible to increase the reset voltages Vr_a and Vr_b at the nodes 112a and 112b to, for example, 8V. This increases the potential difference between the primary charge-collection nodes (104a and 104b) and the peripheral node 102 (including the region 106). However, measures need to be taken to ensure that the transistors of the pixel circuit can handle such high voltages, as the transistors may nominally be, for example, designed to operate with 1.8V or 2.5V supplies. In one embodiment, applicable high and low supply voltages at the nodes 114a, 114b, 119a and 119b of the pixel circuitry of FIG. 15 can be set independently of the reset voltages at the nodes 112a and 112b and the peripheral node voltage at the peripheral node 102. For example, if the reset voltages Vr_a and Vr_b are 8V, the voltage at the nodes 114a and 114b could be 7.5V and the voltage at the nodes 119a and 119b could be 5V assuming the use of 2.5V transistors. In this way, the transistor terminal voltages would be in the allowed range. The non-zero body bias of the transistors would affect the threshold voltages, which would have to be taken into account in terms of designing of the circuitry 107.

As FIG. 15 shows an illustrative example of the principle behind designing the pixel circuitry, a real implementation could have different transistor circuits with a different number of independent supply voltages. It will be appreciated that the pixel circuitry is not restricted to this particular configuration. If the conductivity types of the semiconductor materials are interchanged, the polarities of the voltage supplies also need to be interchanged. As an example, in case the first semiconductor material is a p-type semiconductor, and the second semiconductor material is an n-type semiconductor, the circuit 107 collects holes. Also, in such a case, an n-type modulating node would be surrounded by a p-type primary charge-collection node. Furthermore, the voltage polarities would need to be changed if the semiconductor materials were interchanged, and the readout electronics (for example, such as transistors and the like) would need to be redesigned to take into account the changed voltage polarities and voltage ranges. Moreover, if the first conductivity-type semiconductor material is a p-type semiconductor, the voltages at the charge-collection nodes 104a and 104b should stay below a certain value, in order to prevent a current from flowing between the peripheral node 102 and the charge-collection nodes 104a and 104b, respectively.

Figure 16:
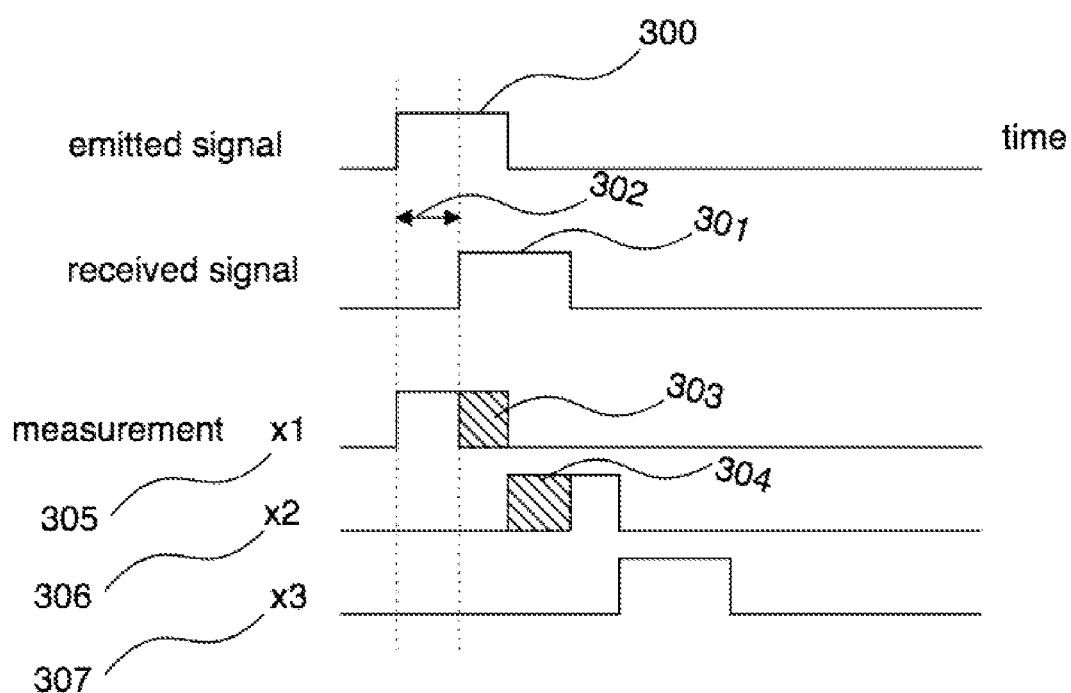

Next, FIG. 16 is a schematic illustration of an exemplary PTOF implementation of a system for capturing images, according to an embodiment of the present disclosure. In FIG. 16, there is shown an emitted signal, which is a light pulse 300 emitted by a light emitter of the system at a first moment of time. The emitted light pulse 300 hits a target, and is reflected back from the target at a second moment of time.

The reflected light pulse is received as a received signal, which is detected as a light pulse 301 at the system. A time difference 302 between the edges of the emitted light pulse 300 and the received light pulse 301 represents the time of flight.

Measurements of the received signal are observed in separate measurement cycles. FIG. 16 shows three measurement cycles 305, 306 and 307 (namely, x1, x2, x3). The first measurement cycle 305 starts at the same time at which the light pulse 300 is emitted. The measurement cycle 305 is followed by the measurement cycles 306 and 307. The received signal, due to the reflected light pulse 301, is observed during reflected signal duration 303 and 304 in the measurement cycles 305 and 306, respectively. It is to be noted here that the measurement cycle 307 is so much later in time that any measured signal is beyond a targeted distance range of the image sensor. Therefore, the measurement cycle 307 is likely to have only small amounts of the signal that is due to the emitted/reflected signal; it is dominated by background illumination, which represents a normal intensity image of a given scene.

It is well known [see reference Sensors 2015, 15, 4624-4642; doi:10.3390/s150304624] that a normalized distance can be obtained by a fraction $x2-x3/((x1-x3)+(x2-x3))$. It is to be noted here that the denominator represents the total received reflected signal.

Optionally, the aforementioned three measurements could be carried out by having a sensor circuit with three modulated charge-collection nodes, which could be laid out next to each other, for example, as shown in FIG. 4A. In such a case, after repeated measurements with multiple emitted pulses and repeating cycles 305, 306 and 307, the charge-collection nodes aggregate a sufficient amount of charge. The charge-collection nodes 104a and 104b of FIG. 4A yield the values of x1 and x2, while and the charge-collection node 104c of FIG. 4A yields the value of x3 (background) in a similar fashion.

Such a multi-mode image sensor that is capable of detecting multiple modalities (for example, such as the ToF and intensity image) is highly useful in enabling novel image capture/processing schemes. It is to be noted here that the signal captured during x3 at the charge-collection node 104c is a conventional intensity image without a contribution of the emitted signal. In one embodiment, pixel-parallel signal processing is applied to compute the ToF result as follows: $x2-x3/((x1-x3)+(x2-x3))$, which is used in focal plane processing, together with a normal intensity image.

In one embodiment, while the image sensor acquires the signal, the pixel circuitry carries out computation on the signals of the pixel element (for example, the voltages of primary and/or secondary charge-collection nodes, the voltages of the storage elements, the voltages of the modulating nodes, and so on), thereby resulting in derived values. When a local pixel voltage (or current) signal, or derived values, or pixel signal/signals or derived values in a specific pixel element or a pixel neighbourhood meets certain criteria, the pixel circuitry can detect that such criteria are met, and may signal to the outside of the matrix that it has information ready for readout. Preferably, selected signal values of the pixel element, or pixel elements in the neighbourhood of the pixel element that meet certain criteria, are read out of the matrix of pixel elements, while other pixel elements may continue capturing the signal. Selected signals may also be stored at the time the pixel neighbourhood meet the certain criteria. It is to be noted here that the principle of monitoring pixel signals and/or neighbour pixels signals or a function of these signals, determining locally when a certain condition is met and requesting/serving readout of the pixel signal and/or the neighbour pixels signals, and/or storing selected signals locally based on the certain criteria is a general way of computing and applies beyond the modulated image sensor of embodiments of the present disclosure.

Figure 17:
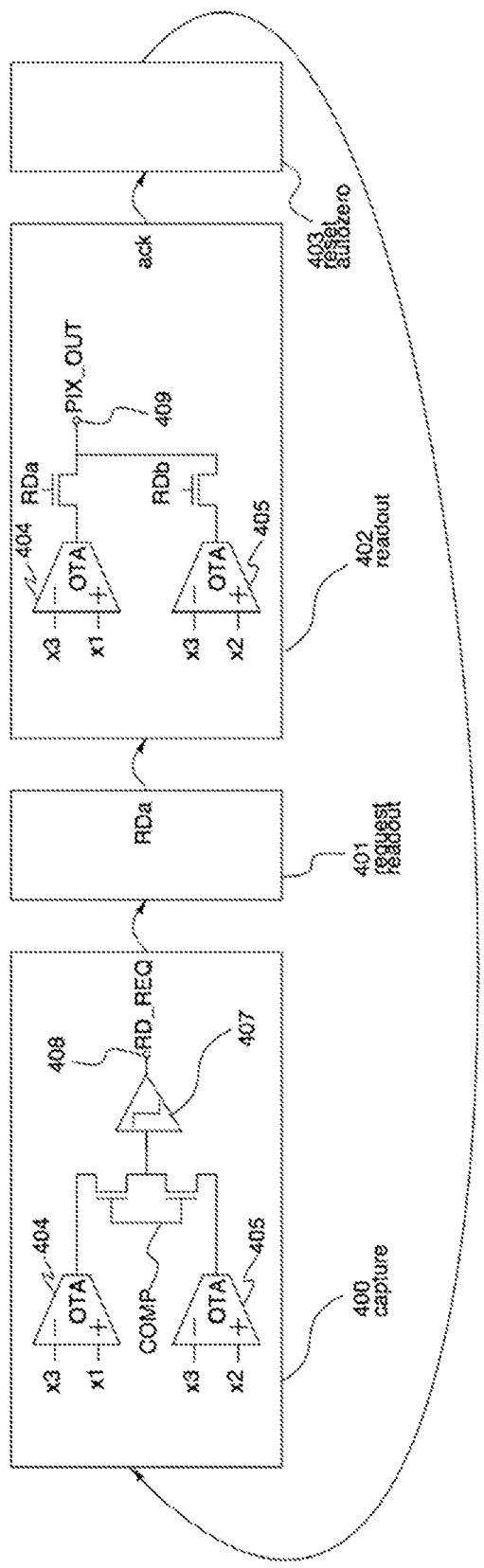
FIG. 17 is a flowchart depicting the exemplary PTOF implementation, according to an embodiment of the present disclosure.

FIG. 17 is a flowchart depicting the principle described above. In the flowchart, phases 400, 401, 402 and 403 indicate different operational phases of the circuitry within a given pixel element.

In the phase 400 (namely, an image capture phase), the total received reflected signal that originates from the emitted signal is computed using two Operational Transconductance Amplifiers (OTA s)404 and 405, and the result is compared with a current-mode comparator 407 to a threshold value. Optionally, said threshold value is tunable; an apparatus for creating the threshold value is internal to the current-mode comparator 407 and is not shown in FIG. 17.

It is to be noted here that in the phase 400, there is a voltage COMP controls switch transistor between 404, 405 and 407, so that the outputs of the OTA s 404 and 405 and the input of the current-mode comparator 407 are connected together. When the outputs of the OTA s 404 and 405 are connected together, the resulting sum current represents ((x1−x3)+(x2−x3)), namely, the total reflected signal that originates from the light source (for example, a light emitter).

Once said sum current is above a threshold (that is selected to ensure distance measurement quality), there is enough signal to reliably determine the distance, and transition to the phase 401 takes place. In the phase 401, a read request (RD_REQ) is signalled for. It is to be noted here that alternatively or additionally to the readout request, the phase 401 could also activate other functionalities, for example, such as a local storage process, not shown in FIG. 17.

In the phase 401, the circuit waits for a read acknowledgement signal RDa from a peripheral circuit; once RDa is received, the circuit moves to a readout state, namely the phase 402.

In the phase 402, x1−x3 (RDa active) and x2−x3 (RDb active, driven by a peripheral circuitry) can be read out from a node PIX_OUT 409 (or stored locally) through switch transistors that are controlled by signals RDa and RDb. After the readout, the circuit moves to the phase 403.

In the phase 403, the circuit can be reset. In this regard, an autozero operation to a cancel OTA offsets can be performed, if desired. Afterwards, the circuit returns to the phase 400 to wait for a new condition in which there is enough signal for a reliable distance measurement. Alternatively, instead of the readout as shown in the phase 402, the fraction x2−x3/((x1−x3)+(x2−x3)) can be computed at a pixel level so that the distance information is readily available, for example, for pixel-level processing.

Figure 18:
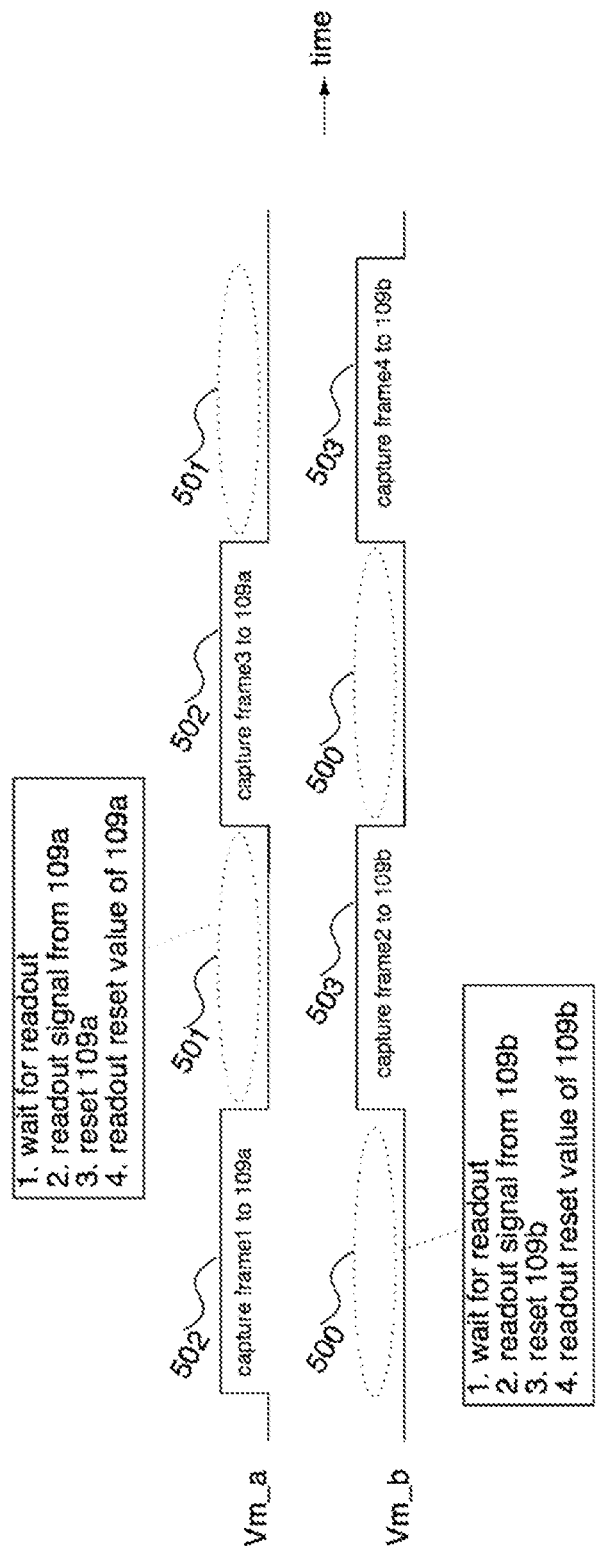
FIG. 18 is a schematic illustration of an exemplary Global-Shutter (GS) imaging implementation of a system for capturing images, according to an embodiment of the present disclosure.

FIG. 18 is a schematic illustration of an exemplary Global-Shutter (GS) imaging implementation of a system for capturing images, according to an embodiment of the present disclosure. In the GS imaging, incoming light is collected also during readout. In other words, essentially no incoming signal is lost during readout. The GS imaging can be performed so that readout and image capture can be carried out simultaneously.

It is to be noted here that shutter transistors (for example, 121a and 121b shown in FIG. 15) are not needed in the GS imaging, provided that the modulation contrast is high enough. Therefore, for illustration purposes herein, it is assumed that the shutter transistors can be omitted. The principle being the GS imaging implementation can be understood with the aid of FIGS. 18 and 13.

FIG. 18 shows the operation during different phases of voltage pulses Vm_a and Vm_b applied to the modulating nodes 105a and 105b of the pixel element 100 of FIG. 13, respectively. During a modulation pulse phase 502 (Vm_a HI), the primary charge-collection node 104a collects the charge of a frame 1 to the capacitor 109a. At the same time, at a modulation pulse phase 500 (Vm_b LO), the primary charge-collection node 104b first waits for readout, then a frame 0 is read out from the primary charge-collection node 104b, the capacitor 109b is reset, and the reset value of the capacitor 109b is read out. Thereafter, during a modulation pulse phase 503 (Vm_b HI), a frame 2 is captured, while at the same time, during a modulation pulse phase 501 (Vm_a LO), the circuit waits for readout, then the frame 1 is read out from the capacitor 109a, the capacitor 109a is reset, and the reset value of the capacitor 109a is read out. These phases are repeated continuously. It is to be noted here that the reset values are read out to be used for (correlated) double sampling that uses the reset and signal values.

If shutter transistors were used, they would be in a conducting mode during the modulation pulse phases 502 and 503, and they would be turned to a cut-off region (namely, a sample signal to the capacitors 109a and 109b) in the beginning of the modulation pulse phases 500 and 501. Sampling a capacitor fixes the capacitor thermal noise to on average kT/C. If no shutter transistors are used, such sampling does not take place at the pixel level. Since there are various ways to reduce the thermal noise in the readout path (namely, read noise) at a column level, embodiments of the present disclosure have potential to very low noise global-shutter imaging that does not waste essentially any incoming light.

In an embodiment, the image sensor is used for High-Dynamic Range (HDR) imaging. The modulating voltages Vm_a and Vm_b connected to the modulating nodes 105a and 105b (shown, for example, in FIG. 13) can be modulated repeatedly during one frame so that the duty cycles of the two modulation sources are different. As an example, the primary charge-collection node 104a can be kept much longer in the high quantum-efficiency state as compared to the primary charge-collection node 104b. This means that the primary charge-collection node 104a can capture more signal than primary charge-collection node 104b. Both signals, corresponding to the same image frame, can then be read out of the image sensor.

The same circuit that can be used for the HDR imaging works also with the GS imaging without any need for modifications. It is also possible to combine GS imaging and HDR imaging as GSHDR imaging by using different integration times for the two primary charge-collection nodes 104a and 104b in the GS imaging implementation described above. As an example, the modulation pulse phases 502 and 503 of FIG. 18 could be of different lengths. In this way, every other frame would be captured with a different integration time, and these GS images could be combined to generate an HDR image.

It will be appreciated that the GS imaging and the GSHDR imaging schemes explained above do not need a fast modulation of the quantum efficiency; the modulation needs not be altered during the same integration cycle. Therefore, a secondary charge-collection node could also be used in place of the primary charge-collection nodes 104a and/or 104b. The quantum efficiencies of the secondary charge-collection nodes could be modulated by reset voltages Vr_x, for example.

Figure 19:
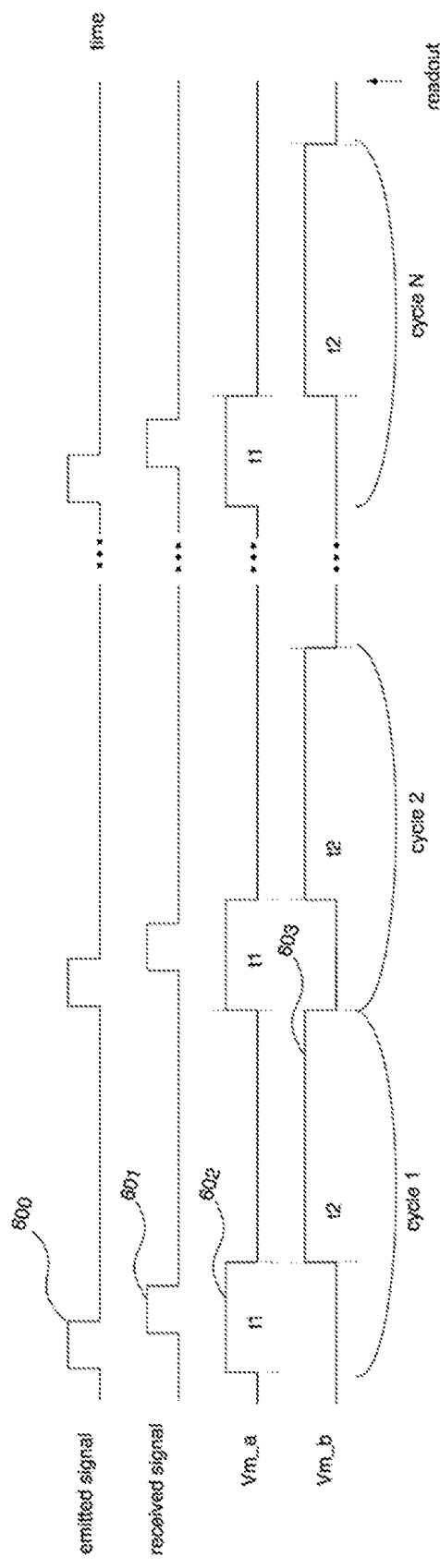
FIG. 19 is a schematic illustration of an exemplary implementation of a light emitter with a pulsed light field in the aforementioned system, according to an embodiment of the present disclosure.

In one embodiment, the image sensor pursuant to embodiments of the present disclosure can be applied for Signal-to-Background Ratio (SBR) improvement. In this embodiment, the aforementioned system comprises a light emitter with a pulsed light field that has a low duty cycle. In this context, the term background generally refers to any captured signal component that does not originate from a signal emitted by the light emitter. As compared to light sources that are ON all the time, the light emitter employs a pulsed, low duty cycle that helps to improve the SBR, while coping with average emitted power and emitted pulse power regulations. FIG. 19 is a schematic illustration of an exemplary implementation of the aforementioned light emitter with a pulsed light field in the aforementioned system, according to an embodiment of the present disclosure. The SBR is improved versus an average emitted power; such improvement is possible by pulsing the emitted light and collecting the photogenerated charge due to reflected emitted light to one group of primary charge-collection nodes, while incoming signal that is due to ambient/background illumination is collected to another group of primary charge-collection nodes. It is to be noted here that in a mufti-mode image sensor, the signal due to ambient/background illumination can be used as a conventional intensity image.

In FIG. 19, an emitted signal 600 is a pulsed light field that has a low duty cycle. A received signal 601 is reflected back from a target in a given scene. It is assumed that the charge-collection nodes 104a and 104b are initially reset, and, if applicable, reset values are read out for CDS. The image sensor is modulated in such a way that the modulating voltage Vm_a goes high with the emitted signal 600, and stays high for a duration t1, as indicated by a label 602; the duration t1 is the time taken for the signal to be reflected from the maximum distance of interest. After that, the modulating voltage Vm_b goes high (namely, the primary charge-collection node 104b goes to the high quantum-efficiency state) for a duration t2, as indicated by a label 603. This cycle of pulsing the light source and capturing the reflected energy due to the emitted pulse is repeated for N cycles, where N is large enough to guarantee enough signal to be accumulated on the capacitor 109a. The timing needs to satisfy t1<t2, and preferably t1<<t2. This is because the emitted light during a given pulse can be approximately t2/t1 times higher than that emitted by a continuous light source. After the N cycles, the voltage across the capacitor 109a represents the signal due to the reflected light field. It is to be noted here that the voltage across the capacitor 109b corresponds to a normal intensity image of the given scene (namely, without the reflected light field), which can also be read out and used, yielding a multi-mode image sensor.

It will be appreciated that various light field applications like range imaging (see Background of the present disclosure for examples) could benefit from the SBR improvement implementation described above.

In one embodiment, the aforementioned system is employed for spectral imaging purposes. In this case, light fields of different wavelengths are emitted and spectral imaging is performed. Optionally, colour images are obtained without using colour filters, by emitting duty-cycled pulses of three primary colours and by collecting the reflected light due to light fields of the different colours to different primary charge-collection nodes. Again, such duty cycling would help reduce received signals that originate from background illumination. As an example, three colour imaging would require four primary charge-collection nodes, one for each colour and one for collecting light between pulses for the duration t2. Such an arrangement would give a normal intensity image in addition to colour information. Spectral imaging could be applied, for example, for biometry applications and active vision.

It is to be noted here that with the image sensor pursuant to embodiments of the present disclosure, it is also possible to identify the amount of pulse signal while the signal is being captured as was done for ToF signals in FIG. 16. Monitoring the captured signal makes it possible to implement event-based readout (or local storage) for pixels where sufficient signal has been captured. Optionally, the pixel switches from capture to readout states in a self-triggering way. In other words, the state transitions are optionally hard-coded in the pixel circuits, resulting in Multiple Instruction, Multiple Data (MIMD) operation. Furthermore, it is possible that each pixel be reset after its event-based readout (namely, frameless operations). It will be appreciated that similar approach can be applied to pixel-level processing in general.

Figure 20A:
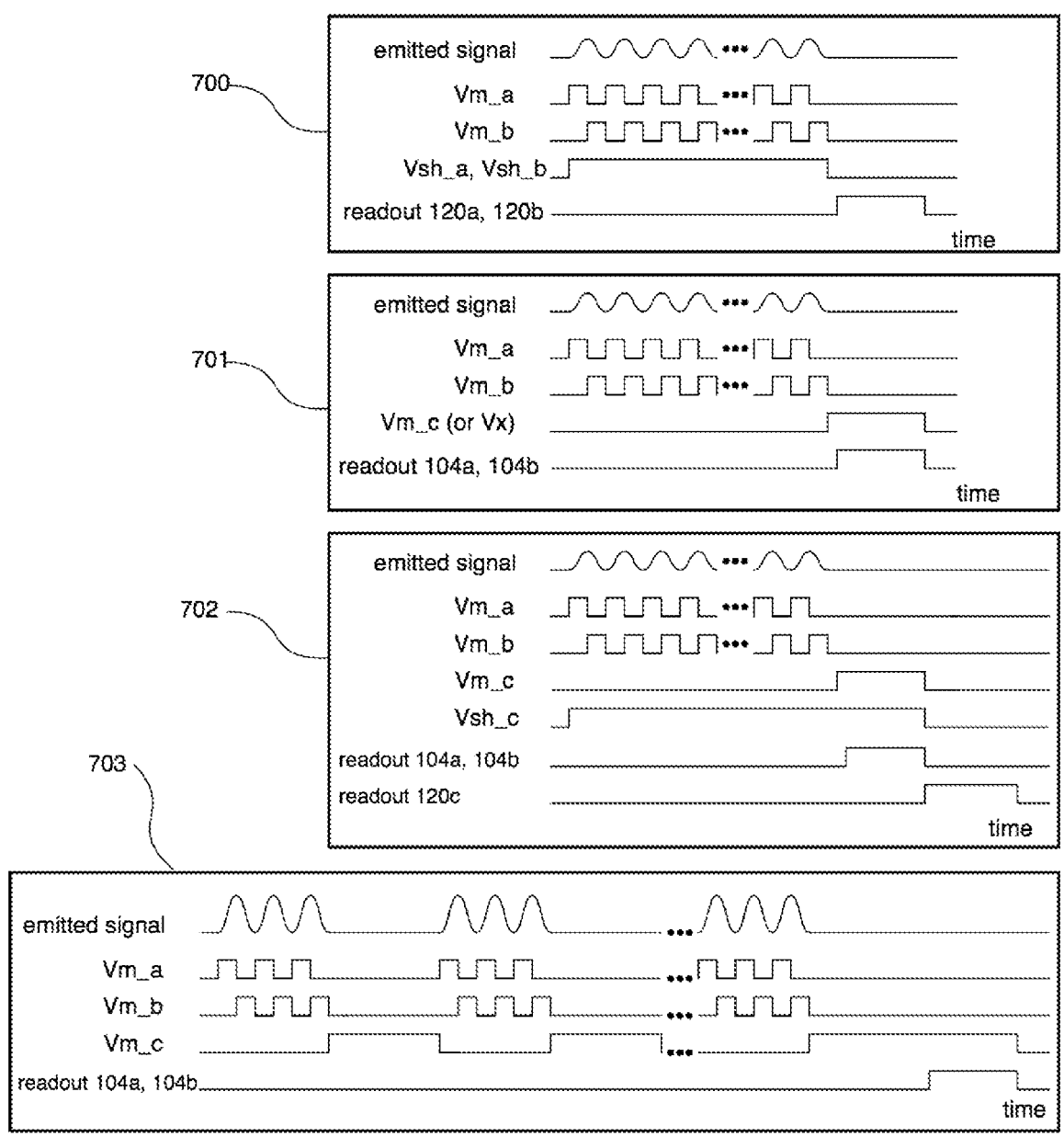
FIG. 20A is a schematic illustration of multi-mode imaging capabilities of the pixel circuit, in accordance with various embodiments of the present disclosure.

FIG. 20A is a schematic illustration of multi-mode imaging capabilities of the pixel circuit, in accordance with various embodiments of the present disclosure. In FIG. 20A, there is shown a timing diagram 700 for a sensor operation that could be used to measure one phase in MTOF imaging, according to a first embodiment of the present disclosure. The timing diagram 700 shows how the use of shutter switches could be avoided, how the image sensor could be used as a mufti-mode image sensor that captures also normal intensity image in addition to the modulated ToF data, and how the average emitted light power could be maintained, while increasing instantaneous emitted light power as to increase signal-to-background level.

A pixel element, for example like that of FIG. 15, could be used in the first embodiment. The emitted signal is a repetitive sinusoidal signal; however, it can also take other shapes, for example, such as a rectangular pulse shape. In the timing diagram 700, charge is collected to the primary charge-collection nodes 104a and 104b. Once a sufficient amount of pulses has been emitted and the corresponding photogenerated charge has been accumulated into the capacitors 109a and 109b, shutter transistors 122a and 122b are turned to cut-off, and readout of voltages from the nodes 120a and 120b is carried out. A problem with using a shutter transistor is that once the switches 110a and 110b turn off, kT/C noise is sampled into the capacitors 109a and 109b. Increasing the capacitance values of the capacitors 109a and 109b reduces kT/C noise, but lowers the sensitivity, namely the conversion gain (V/electron).

Figure 20B:
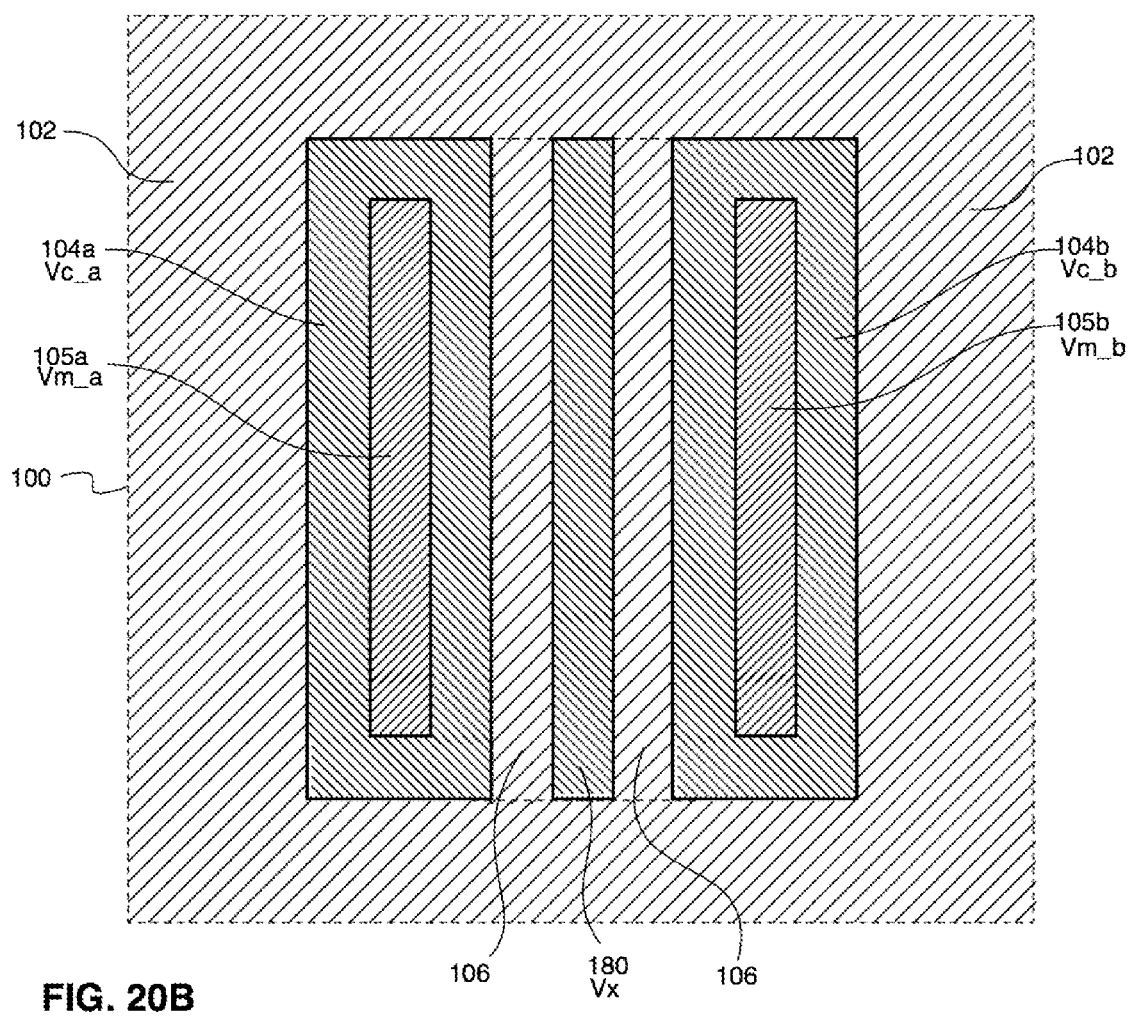
FIG. 20B is a schematic illustration of a pixel element with two primary charge-collection nodes and one secondary charge-collection node, in accordance with an embodiment of the present disclosure.

In FIG. 20A, there is shown another timing diagram 701 according to a second embodiment of the present disclosure, wherein the pixel element comprises a third primary charge-collection node 104c in addition to the primary charge-collection nodes 104a and 104b, for example as illustrated in FIG. 4A. In this case, shutter transistors are not needed at all; they can either be kept on all the time (assuming a high enough modulation contrast), or be left out of the pixel circuit. The signal is accumulated to the charge-collection nodes 104a and 104b. After the accumulation, the quantum efficiency of the third primary charge-collection node 104c is modulated to a high level with the modulating voltage Vm_c applied to the modulating node 105c, and the primary charge-collection nodes 104a and 104b are read out. It is to be noted here that capturing of an instantaneous value of the kT/C noise due to sampling with shutter transistors is eliminated allowing further continuous time noise bandwidth suppression in the signal path, thereby reducing a Root Mean Square (RMS) value of the noise associated with that particular capacitance. It is to be further noted that in the second embodiment described above, the third primary charge-collection node 104c has been used to eliminate the need for shutter transistors; however, a secondary charge-collection node 180 can be used in place of the third primary charge-collection node 104c, where the voltage Vx of the secondary charge-collection node 180 is used to control the quantum efficiency of the secondary charge-collection node 180. An example embodiment of such an arrangement of charge-collection nodes is shown in FIG. 20B, wherein the pixel element 100 comprises two primary charge-collection nodes 104a and 104b and a secondary charge-collection node 180 arranged between the primary charge-collection nodes 104a and 104b. Also, the timing of Vx is shown in the timing diagram 701.

In FIG. 20A, there is shown yet another timing diagram 702 according to a third embodiment of the present disclosure, wherein the pixel element comprises three primary charge-collection node 104a, 104b and 104c, for example as illustrated in FIG. 4A, wherein the third primary charge-collection node 104c has an associated shutter transistor 122c (whose drain is denoted by 120c) and a storage capacitor 109c. It is to be noted here that the shutter transistor 122c and the capacitor 109c are not shown in FIG. 4A; however, they are arranged in a manner that is similar to an arrangement of the shutter transistor 122a, the drain 120a and the capacitor 109a shown in FIG. 15.

The timing diagram 702 is similar to the timing diagram 701, except that after charge is first accumulated to the primary charge-collection nodes 104a and 104b, charge is then accumulated to the primary charge-collection node 104c by modulating the quantum efficiency of the third primary charge-collection node 104c to a high level with the modulating voltage Vm_c applied to the modulating node 105c, followed by turning the shutter transistor 122c to cut-off. Now, the primary charge-collection nodes 104a and 104b contain a phase signal to be used for the ToF measurement, whereas the voltage across the storage capacitor 109c contains a normal intensity image (namely, a global shutter image). Signals from the primary charge-collection nodes 104a and 104b are readout when the primary charge-collection node 104c is in the high quantum-efficiency state. After this, the shutter transistor 122c is turned to a cut-off region and the voltage across the storage capacitor 109c can be read out. Similar to the timing diagram 701, the third primary charge-collection node 104c could be replaced with a secondary charge-collection node 180 and a corresponding shutter transistor, for example as shown in FIG. 20B.

The exemplary implementation described above can be extended to various different configurations of pixel elements. As an example, there could be two primary charge-collection nodes that would collect the ToF information, a first secondary charge-collection node that would capture the conventional image (without shutter transistor) and a second secondary charge-collection node that would capture the signal when the first secondary charge-collection node is being read out.

In FIG. 20A, there is shown still another timing diagram 703 for a variant of ToF phase capture procedure, according to a fourth embodiment of the present disclosure, wherein an aim is to improve the SBR in modulated ToF imaging. In the fourth embodiment, the emitted signal is turned off between separate sets of emitted pulses. When the emitted signal is inactive, charge is collected by the primary charge-collection node 104c of the pixel element 100 of FIG. 4A. This way, the average emitted signal can be kept low enough to meet eye safety regulations, while having a higher transmission power during pulses. It will be appreciated that other variants are also possible. For example, in one variant, the primary charge-collection node 104c is accompanied with the shutter transistor 122c and the capacitor 109c. By turning off the shutter transistor 122c after the accumulation into the capacitor 109c, it is possible to read out the voltage at the drain 120c as the intensity image.

It will be appreciated that various exemplary implementations proposed in the present disclosure, for example, including the ToF imaging, the light field imaging and the resolution enhancement do not necessarily need the modulated image sensor pursuant to embodiments of the present disclosure. Notably, the image sensor can be implemented in various different ways to steer collected charge to different charge-collection nodes.

While embodiments of the present disclosure have been described with a number of exemplary implementations, it will be appreciated that various modifications, and equivalent arrangements, which fall within the scope of the prospective claims are possible.

Modifications to embodiments of the present disclosure described in the foregoing are possible without departing from the scope of the present disclosure as defined by the accompanying claims. Expressions such as including, comprising, incorporating, have, is used to describe and claim the present disclosure are intended to be construed in a non-exclusive manner, namely allowing for items, components or elements not explicitly described also to be present. Reference to the singular is also to be construed to relate to the plural.

What is claimed is:

1. A pixel element comprising:
 a semiconductor substrate of a first or second conductivity type, the semiconductor substrate having a front side and a backside, wherein the semiconductor substrate configured to be exposed to a flux of photons, and to convert the flux of photons to first and second conductivity-type mobile charges;
 a first primary charge-collection node of a first conductivity-type semiconductor material, arranged on the front side of the semiconductor substrate;
 at least one peripheral node of a second conductivity-type semiconductor material, arranged on the front side of the semiconductor substrate, wherein the at least one peripheral node at least partially surrounds the first primary charge-collection node;
 a circuitry directly connected to the first primary charge-collection node and to the at least one peripheral node, wherein the circuitry comprises:
 a first switch to connect and disconnect a first reset voltage (Vr, Vr_a) to/from the first primary charge-collection node;
 means to provide a peripheral node voltage to the at least one peripheral node; and
 a first measurement means to measure an amount of the first conductivity-type mobile charges collected by the first primary charge-collection node;
 a backside conductive layer arranged on the backside of the semiconductor substrate, configured to collect and conduct the second conductivity-type mobile charges, and configured to be electrically connected to a bias voltage (Vbs); and
 a first modulating node of the second conductivity-type semiconductor material, wherein the first modulating node is:
 arranged on the front side of the semiconductor substrate;
 at least partially surrounded by the first primary charge-collection node, which first primary charge-collection node is arranged to provide electrical isolation between the first modulating node and the at least one peripheral node; and
 electrically connected to a first modulating voltage (Vm, Vm_a) source, which first modulating voltage source is independent of the peripheral node voltage.

2. The pixel element according to claim 1, further comprising a second primary charge-collection node or a secondary charge-collection node of the first conductivity-type semiconductor material, arranged on the front side of the semiconductor substrate.

3. The pixel element according to claim 2, further comprising a second modulating node of the second conductivity-type semiconductor material, wherein the second modulating node is:
- arranged on the front side of the semiconductor substrate;
- at least partially surrounded by the second primary charge-collection node, which second primary charge-collection node is arranged to provide electrical isolation between the second modulating node and the at least one peripheral node; and electrically connected to a second modulating voltage (Vm_b) source, which second modulating voltage source is independent of the peripheral node voltage; and wherein the circuitry further comprises:
- a second switch to connect and disconnect a second reset voltage (Vr_b) to/from the second primary charge-collection node; and
- a second measurement means to measure an amount of the first conductivity-type mobile charges collected by the second primary charge-collection node.

4. The pixel element according to claim 1, wherein the semiconductor substrate is a high resistivity substrate having a doping concentration of at most 1e14 atoms/cm$^3$.

5. The pixel element according to claim 4, wherein the semiconductor substrate is a high resistivity substrate having a doping concentration of at most 5e13 atoms/cm$^3$.

6. The pixel element according to claim 1, wherein the pixel element is arranged to receive a flux of photons from the backside of the semiconductor substrate.

7. A system for capturing images, the system comprising an image sensor, wherein the image sensor comprises a matrix of pixel elements according to claim 1 and a controller, the pixel elements being connected to the controller.

8. The system according to claim 7, further comprising a light emitter arranged to be directed to a target, wherein the controller is configured to:
- provide a control signal for the light emitter to emit a pulse of photons at a first moment of time;
- start a measurement to detect a reflected pulse of photons from the target with a first pixel element of the matrix of pixel elements at a second moment of time;
- stop the measurement with the first pixel element at a third moment of time;
- start a measurement to detect the reflected pulse of photons from the target with a second pixel element of the matrix of pixel elements at a fourth moment of time;
- stop the measurement with the second pixel element at a fifth moment of time; and
- calculate a time of flight of the pulse of photons, by comparing an amount of accumulated first conductivity-type mobile charges associated with the reflected pulse of photons in the first pixel element with an amount of accumulated first conductivity-type mobile charges associated with the reflected pulse of photons in the second pixel element.

9. The system according to claim 7, further comprising a light emitter configured to emit light pulses at more than one wavelength, wherein the controller is further configured to adjust modulating voltages (Vm) of modulating nodes of individual pixel elements of the matrix of pixel elements based upon a given wavelength emitted by the light emitter at a given moment of time.

10. The system according to claim 7, wherein the controller is configured to control modulating voltages (Vm) based upon pulse duration of emitted light pulses to:
- arrange a first charge-collection volume of a first size for a first pulse duration; and
- arrange a second charge-collection volume of a second size for a second pulse duration,
- wherein the first size is larger than the second size, and the first pulse duration is smaller than the second pulse duration.

11. The system according to claim 7, wherein the system is a camera.

12. The system according to claim 7, wherein the system is a lidar.

13. A method for measuring an amount of first conductivity-type mobile charges associated with a flux of photons received by a pixel element, the pixel element comprising
- a semiconductor substrate,
- a first primary charge-collection node,
- a second primary charge-collection node, a first modulating node,
- a second modulating node and a circuitry comprising a first switch and a second switch, the method comprising:
(i) depleting a volume inside of the semiconductor substrate by setting a bias voltage (Vbs) to a value that depletes the volume of the semiconductor substrate by at least 50%;
(ii) providing a first reset voltage (Vr_a);
(iii) providing a second reset voltage (Vr_b);
(iv) resetting the first primary charge-collection node by:
connecting the first primary charge-collection node to the first reset voltage (Vr_a) by turning the first switch ON; and
disconnecting the first primary charge-collection node from the first reset voltage (Vr_a) by turning the first switch OFF;
(v) resetting a second primary charge-collection node by:
connecting the second primary charge-collection node to the second reset voltage (Vr_b) by turning a second switch ON; and
disconnecting the second primary charge-collection node from the second reset voltage (Vr_b) by turning the second switch OFF;
(vi) accumulating the first conductivity-type mobile charges to the first and second primary charge-collection nodes during a cycle of:
decreasing a first charge-collection volume by setting a first modulating voltage (Vm_a) to a value that increases a first reverse bias voltage between the first primary charge-collection node and the first modulating node, and increasing a second charge-collection volume by setting a second modulating voltage (Vm_b) to a value that decreases a second reverse bias voltage between the second primary charge-collection node and the second modulating node;
waiting for a first period of time;
after the first period of time, increasing the first charge-collection volume by setting the first modulating voltage (Vm_a) to a value that decreases the first reverse bias voltage between the first primary charge-collection node and the first modulating node, and decreasing the second charge-collection volume by setting the second modulating voltage (Vm_b) to a value that increases the second reverse bias voltage between the second primary charge-collection node and the second modulating node; and
waiting for a second period of time; and
(vii) measuring the amount of the first conductivity-type mobile charges accumulated during the cycle of the step (vi) by determining voltage levels (Vc_a, Vc_b) of the first primary charge-collection node and the second primary charge-collection node.

14. The method according to claim 13, wherein the pixel element further comprises a peripheral node, the method further comprising arranging for the peripheral node to have a potential sufficient for providing at least a 0.6 volt potential barrier to the first conductivity-type charge carriers between the first and the second primary charge-collection nodes when the first and second primary charge-collection nodes are at the first and second reset voltages.

15. A method for measuring an amount of first conductivity-type mobile charges associated with a flux of photons received by a pixel element, the pixel element comprising
a semiconductor substrate,
a first primary charge-collection node,
a secondary charge-collection node,
a first modulating node,
a peripheral node and
a circuitry comprising a first switch,
the method comprising:
(a) depleting a volume inside of the semiconductor substrate by setting a bias voltage (Vbs) to a value that depletes the volume of the semiconductor substrate by at least 50%;
(b) providing a first reset voltage (Vr);
(c) providing a third voltage (Vx);
(d) resetting the first primary charge-collection node by:
connecting the first primary charge-collection node to the first reset voltage (Vr) by turning the first switch ON; and
disconnecting the first primary charge-collection node from the first reset voltage (Vr) by turning the first switch OFF;
(e) accumulating the first conductivity-type mobile charges to the first primary charge collection node and the secondary charge-collection node during a cycle of:
decreasing a first charge-collection volume by setting a first modulating voltage (Vm) to a value that increases a first reverse bias voltage between the first primary charge-collection node and the first modulating node, and increasing a second charge-collection volume by setting the third voltage (Vx) to a value that increases a third reverse bias voltage between the secondary charge-collection node and the peripheral node;
waiting for a third period of time;
after the third period of time, increasing the first charge-collection volume by setting the first modulating voltage (Vm, Vm) to a value that decreases the first reverse bias voltage between the first primary charge-collection node and the first modulating node, and decreasing the second charge-collection volume by setting the third voltage (Vx) to a value that decreases the third reverse bias voltage between the secondary charge-collection node and the peripheral node; and
waiting for a fourth period of time; and
(f) measuring the amount of the first conductivity-type mobile charges accumulated during the cycle of the step (e) by determining a voltage level (Vc) of the first primary charge-collection node.

16. The method according to claim 15, further comprising arranging for the peripheral node to have a potential sufficient for providing at least a 0.6 volt potential barrier to the first conductivity-type charge carriers between the first primary charge-collection node and the secondary charge-collection node when the first primary charge-collection node and the secondary charge-collection node are at the first reset voltage (Vr) and the third voltage (Vx).

* * * * *